US012677411B2

(12) United States Patent
Kim et al.

(10) Patent No.: US 12,677,411 B2
(45) Date of Patent: Jul. 7, 2026

(54) SEMICONDUCTOR MEMORY DEVICE

(71) Applicant: SAMSUNG ELECTRONICS CO., LTD., Suwon-si (KR)

(72) Inventors: Jongmin Kim, Suwon-si (KR); Chansic Yoon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 546 days.

(21) Appl. No.: 18/138,495

(22) Filed: Apr. 24, 2023

(65) Prior Publication Data

US 2024/0130118 A1 Apr. 18, 2024

(30) Foreign Application Priority Data

Oct. 14, 2022 (KR) ......................... 10-2022-0132714

(51) Int. Cl.
*H10B 12/00* (2023.01)

(52) U.S. Cl.
CPC ............. *H10B 12/50* (2023.02); *H10B 12/09* (2023.02); *H10B 12/315* (2023.02); *H10B 12/34* (2023.02); *H10B 12/482* (2023.02)

(58) Field of Classification Search
CPC ....... H10B 12/50; H10B 12/34; H10B 12/315
See application file for complete search history.

(56) References Cited

U.S. PATENT DOCUMENTS

| | | | |
|---|---|---|---|
| 8,455,343 B2 | 6/2013 | Jang | |
| 10,373,961 B2 * | 8/2019 | Yoon ................. | H01L 21/02109 |

| | | | |
|---|---|---|---|
| 10,847,519 B2 * | 11/2020 | Ji ...................... | H01L 21/02126 |
| 2006/0138463 A1 * | 6/2006 | Kim ...................... | H10B 10/18 |
| | | | 257/296 |
| 2017/0084710 A1 * | 3/2017 | Koh ...................... | H10B 12/053 |
| 2019/0214391 A1 * | 7/2019 | Yoon .................... | H10B 12/315 |
| 2020/0312845 A1 | 10/2020 | Yoon et al. | |
| 2021/0082924 A1 * | 3/2021 | Seong .................. | H10B 12/315 |
| 2021/0257373 A1 * | 8/2021 | Kang .................. | H10B 12/482 |

(Continued)

FOREIGN PATENT DOCUMENTS

| | | |
|---|---|---|
| KR | 10-2022-0118742 A | 8/2022 |
| TW | 200640000 A | 11/2006 |

(Continued)

OTHER PUBLICATIONS

Office Action dated Dec. 5, 2025, issued by Taiwanese Patent Office in Taiwanese Patent Application No. 112136198.

(Continued)

*Primary Examiner* — Steven M Page
(74) *Attorney, Agent, or Firm* — Sughrue Mion, PLLC

(57) ABSTRACT

A semiconductor memory device is provided. The semiconductor memory device includes: a substrate including a plurality of active regions in a memory cell region and at least one logic active region in a peripheral circuit region; a word line extending in a first horizontal direction on the plurality of active regions; a bit line structure extending in a second horizontal direction orthogonal to the first horizontal direction, on the plurality of active regions, and including a bit line, a cover insulating structure on a side surface of an end of the bit line, and an insulating capping structure on the bit line and the cover insulating structure; and a gate line on the at least one logic active region.

20 Claims, 71 Drawing Sheets

(56) References Cited

U.S. PATENT DOCUMENTS

2021/0327882  A1*  10/2021  Liao ..................... H10B 12/482
2022/0238534  A1      7/2022  Seong et al.

FOREIGN PATENT DOCUMENTS

TW          201342535  A    10/2013
TW          201822343  A     6/2018
TW          202119594  A     5/2021

OTHER PUBLICATIONS

Communication dated Mar. 11, 2026 issued by the Korean Ministry of Intellectual Property in Korean Patent Application No. 10-2022-0132714.

* cited by examiner

SEMICONDUCTOR MEMORY DEVICE

CROSS-REFERENCE TO RELATED APPLICATION

This application claims priority to Korean Patent Application No. 10-2022-0132714, filed on Oct. 14, 2022, in the Korean Intellectual Property Office, the disclosure of which is incorporated herein by reference in its entirety.

BACKGROUND

The present disclosure relates to a semiconductor memory device, and more particularly, to a semiconductor memory device with electrical reliability.

In accordance with the rapid development of the electronics industry and demands of users, electronic devices are becoming smaller and lighter. Therefore, high integration is required for a semiconductor memory device used for an electronic device. In this regard, design rules for components of a semiconductor memory device are being reduced.

SUMMARY

The present disclosure relates to a semiconductor memory device with electrical reliability.

According to an aspect of an embodiment, a semiconductor memory device includes: a substrate including a plurality of active regions in a memory cell region and at least one logic active region in a peripheral circuit region; a word line extending in a first horizontal direction on the plurality of active regions; a bit line structure extending in a second horizontal direction orthogonal to the first horizontal direction, on the plurality of active regions, and including a bit line, a cover insulating structure on a side surface of an end of the bit line, and an insulating capping structure on the bit line and the cover insulating structure; and a gate line on the at least one logic active region.

According to another aspect of an embodiment, a semiconductor memory device includes: a substrate including a plurality of active regions in a memory cell region and at least one logic active region in a peripheral circuit region; a word line extending in a first horizontal direction on the plurality of active regions; a bit line structure extending in a second horizontal direction orthogonal to the first horizontal direction, on the plurality of active regions, and including a bit line having a stacked structure including a first metallic conductive layer and a second metallic conductive layer, a cover insulating structure on a side surface of an end of the bit line and spaced apart from the second metallic conductive layer, and an insulating capping structure on the bit line and the cover insulating structure; and a gate line on the at least one logic active region.

According to another aspect of an embodiment, a semiconductor memory device includes: a substrate; a device isolation layer defining a plurality of active regions on a memory cell region of the substrate; a logic device isolation layer defining at least one logic active region on a peripheral circuit region of the substrate; a plurality of word lines in a plurality of word line trenches extending parallel to one another in a first horizontal direction across the plurality of active regions, each of the plurality of word lines having a stacked structure including a lower word line layer and an upper word line layer; a plurality of buried insulating layers in the plurality of word line trenches on the plurality of word lines; a plurality of bit line structures on the plurality of active regions, extending parallel to one another in a second horizontal direction orthogonal to the first horizontal direction, each of the plurality of bit line structures including a bit line having a stacked structure including a first bit line conductive layer and a second bit line conductive layer, a cover insulating structure on a side surface of an end of the bit line and spaced apart from the second bit line conductive layer with the first bit line conductive layer therebetween, and an insulating capping structure on the bit line and the cover insulating structure and having a stacked structure including a first insulating capping layer, a second insulating capping layer, and a third insulating capping layer; a gate line on the at least one logic active region and including a stacked structure including a first gate line conductive layer and a second gate line conductive layer, the first gate line conductive layer and the first bit line conductive layer including a first common material, and the second bit line conductive layer and the second gate line conductive layer including a second common material; a plurality of buried contacts in spaces among the plurality of bit line structures and connected to the plurality of active regions; a plurality of landing pads in the spaces among the plurality of bit line structures and extending onto the plurality of bit line structures; and a plurality of capacitor structures including a plurality of lower electrodes in contact with the plurality of landing pads, an upper electrode, and a capacitor dielectric layer between the plurality of lower electrodes and the upper electrode.

BRIEF DESCRIPTION OF DRAWINGS

The above and other aspects and features will be more apparent from the following description of embodiments, taken in conjunction with the accompanying drawings, in which:

Figure 20B:
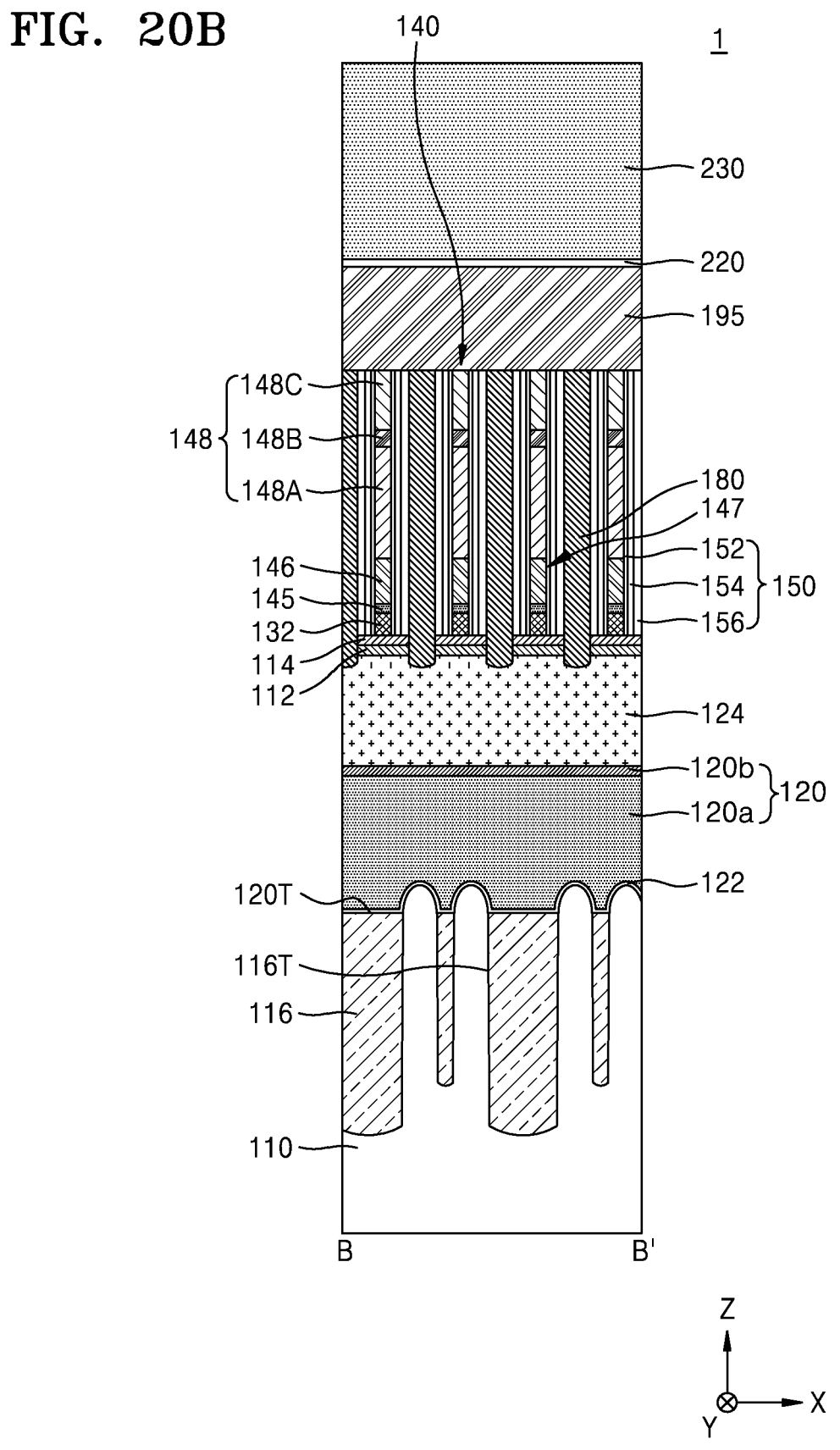

FIGS. 20A, 20B, 20C, 20D, 20E, 21A and 21B are cross-sectional views illustrating a semiconductor memory device according to an embodiment;

FIGS. 31A, 31B, 31C, 31D, 31E, 32A, and 32B are cross-sectional views illustrating a semiconductor memory device according to an embodiment.

DETAILED DESCRIPTION

Figure 1:
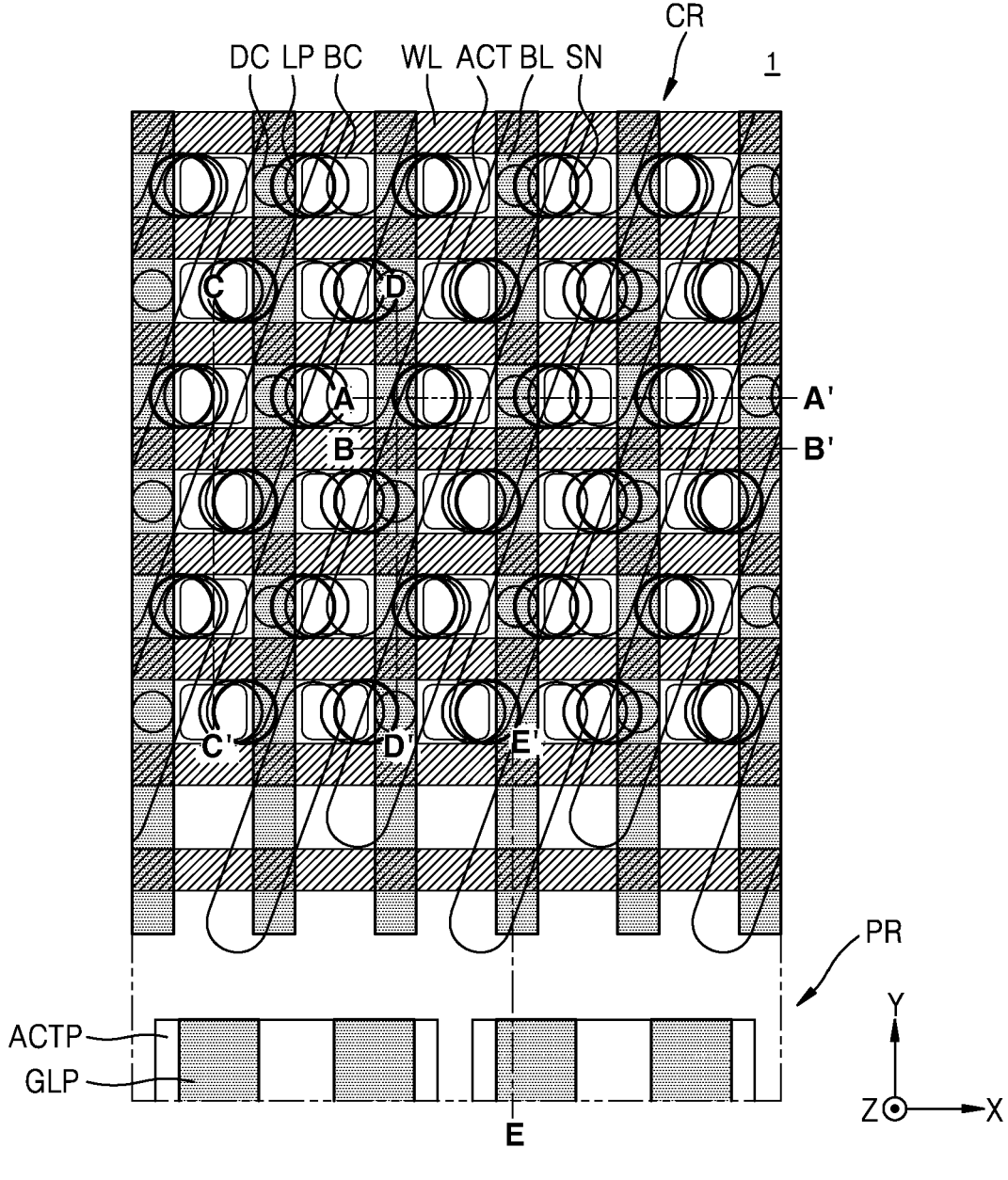
FIG. 1 is a schematic plan layout for describing main components of a semiconductor memory device according to an embodiment.
Figure 2A:
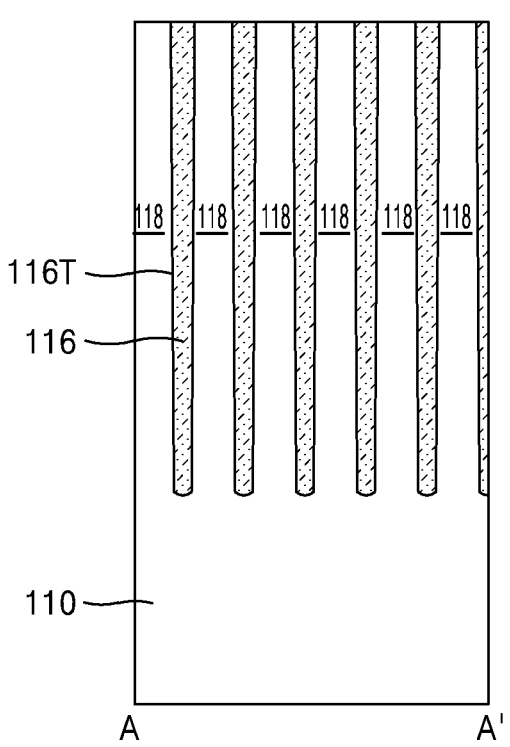
FIGS. 2A, 2B, 2C, 2D, 2E, 3A, 3B, 3C, 3D 3E, 4A, 4B, 4C, 4D, 4E, 5A, 5B, 5C, 5D, 5E, 6-16, 17A, 17B, 17C, 17D, 17E, 18A, 18B, 18C, 18D, 18E, 19A, 19B, 19C, 19D and 19E are cross-sectional views illustrating a method of manufacturing a semiconductor memory device, according to an embodiment.
Figure 2A:
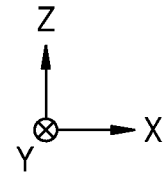
Figure 2B:
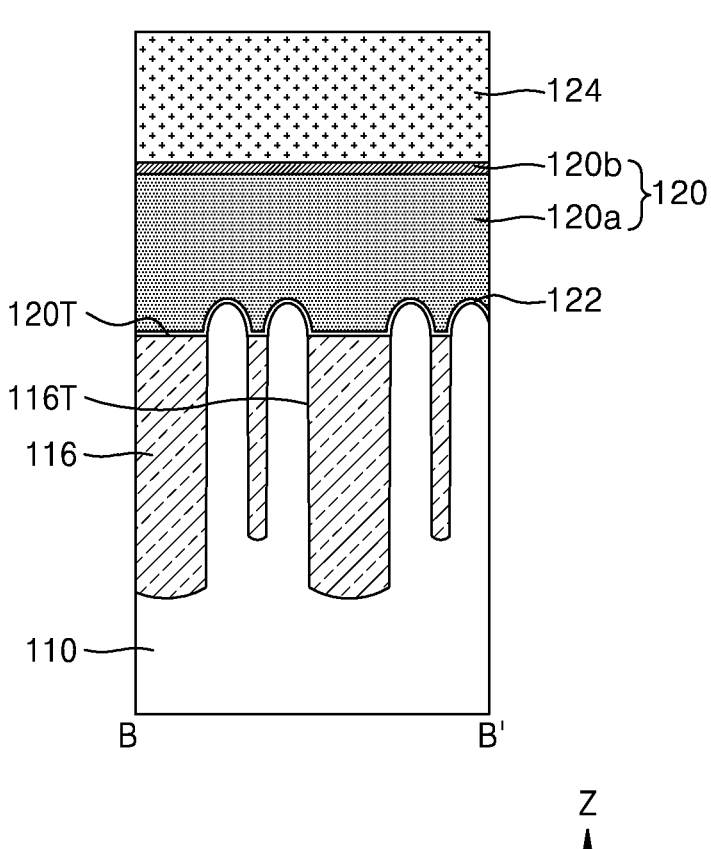
Figure 2C:
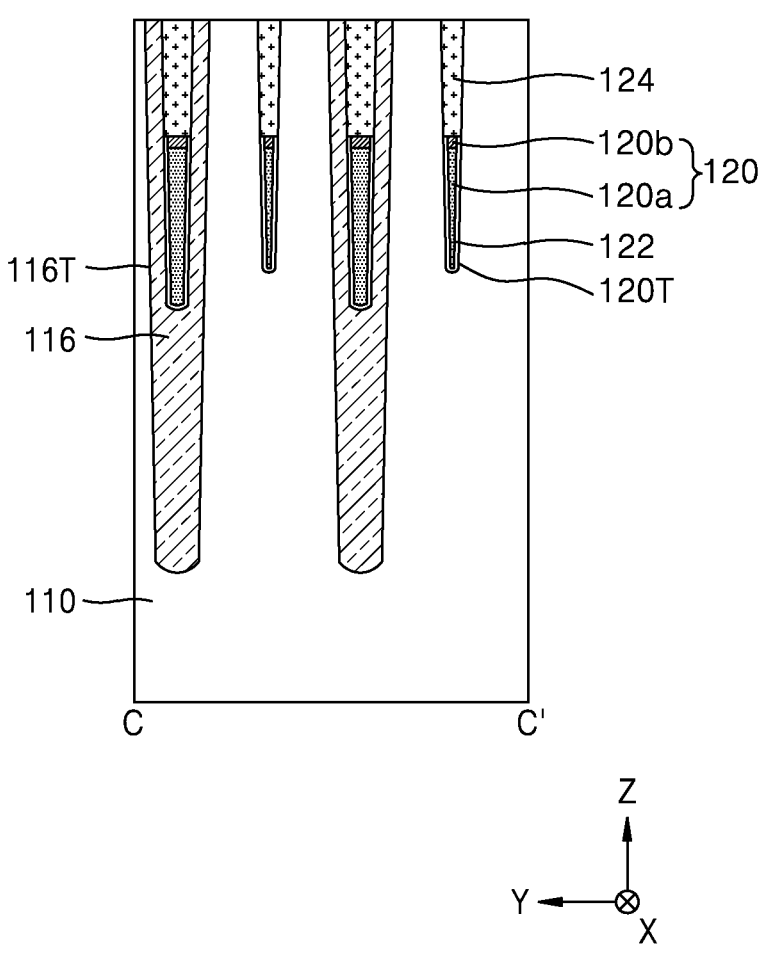
Figure 2D:
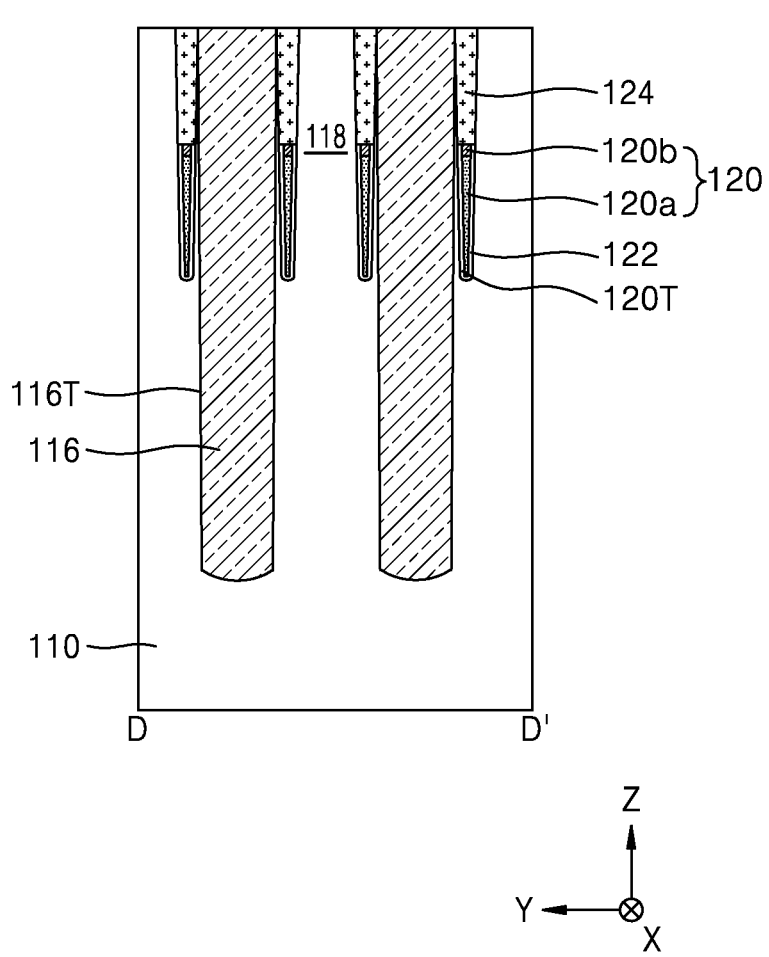
Figure 2E:
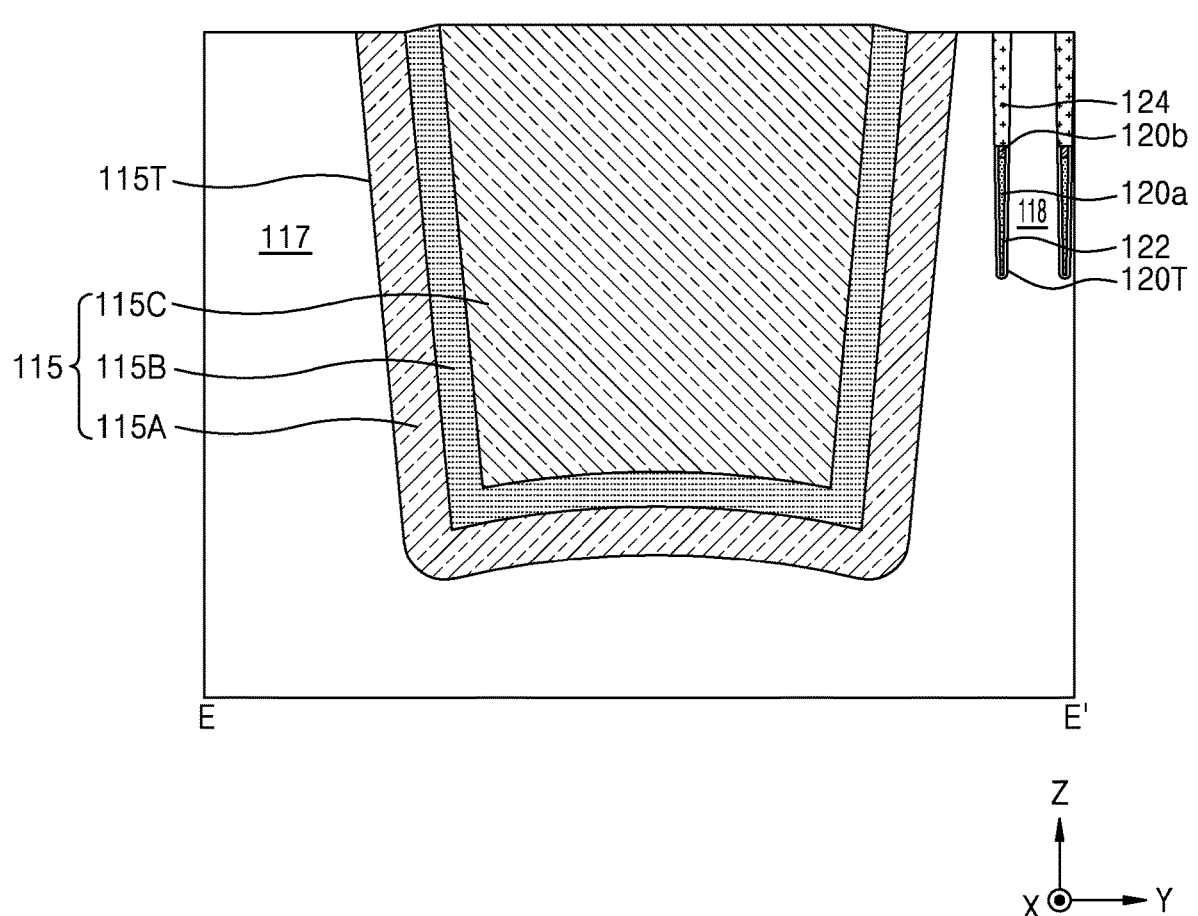
Figure 3A:
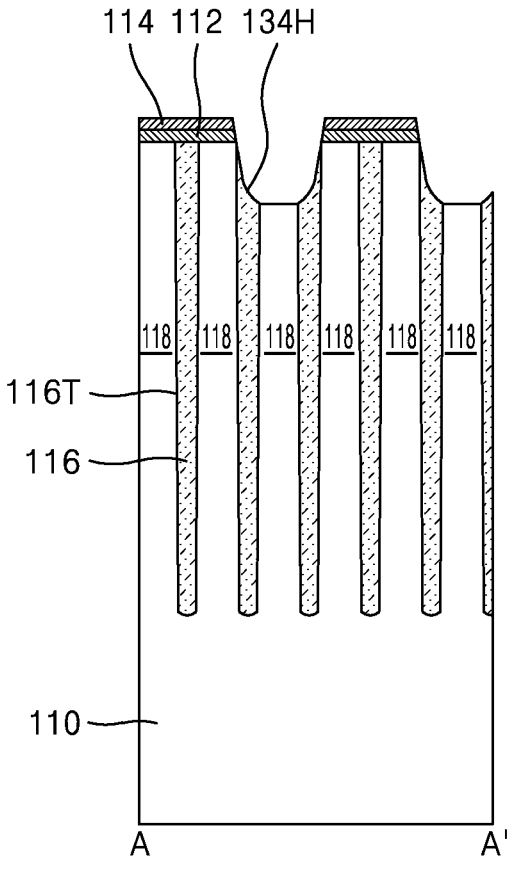
Figure 3A:
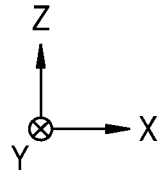
Figure 3B:
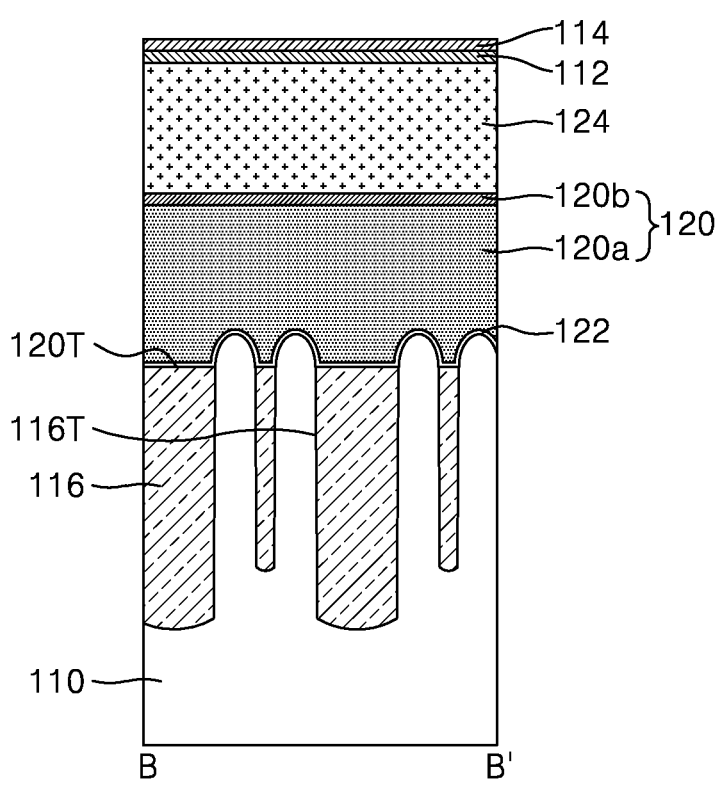
Figure 3B:
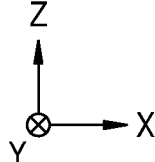
Figure 3C:
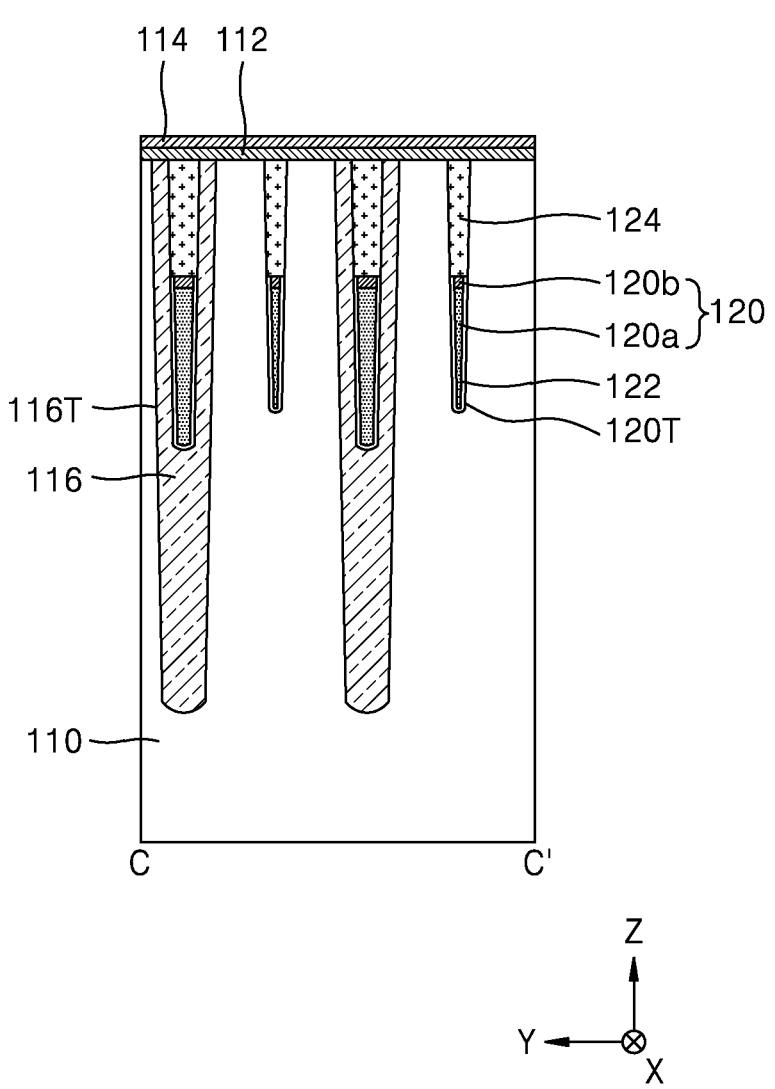
Figure 3D:
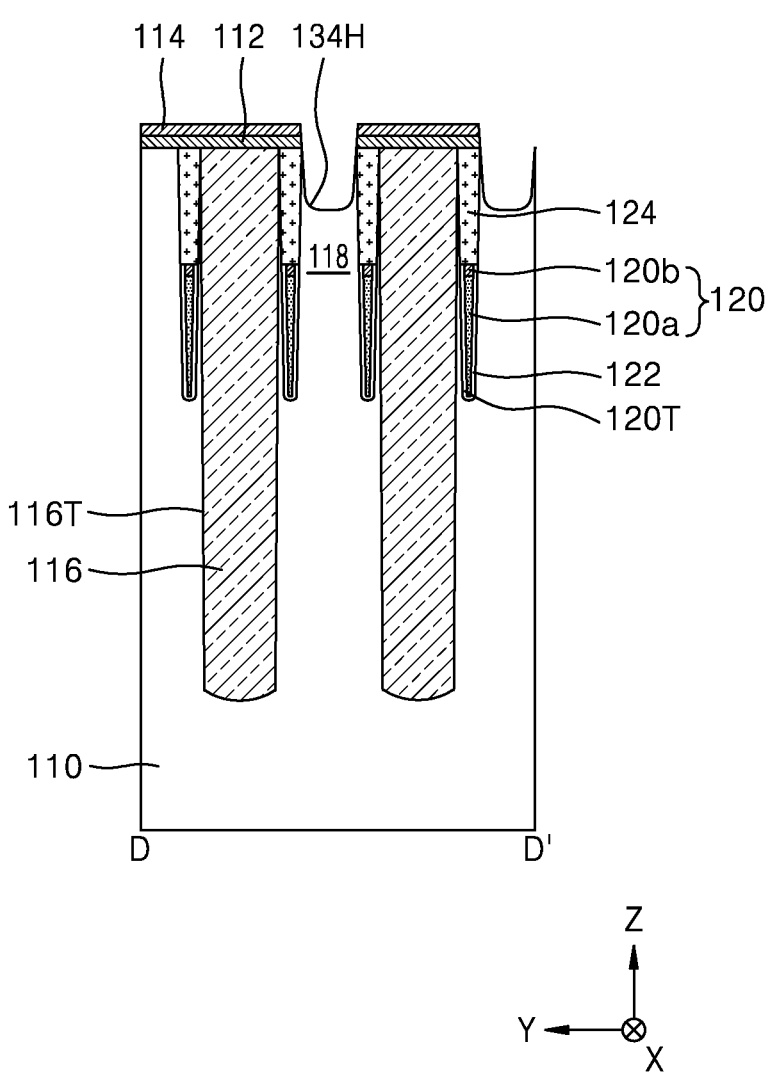
Figure 3E:
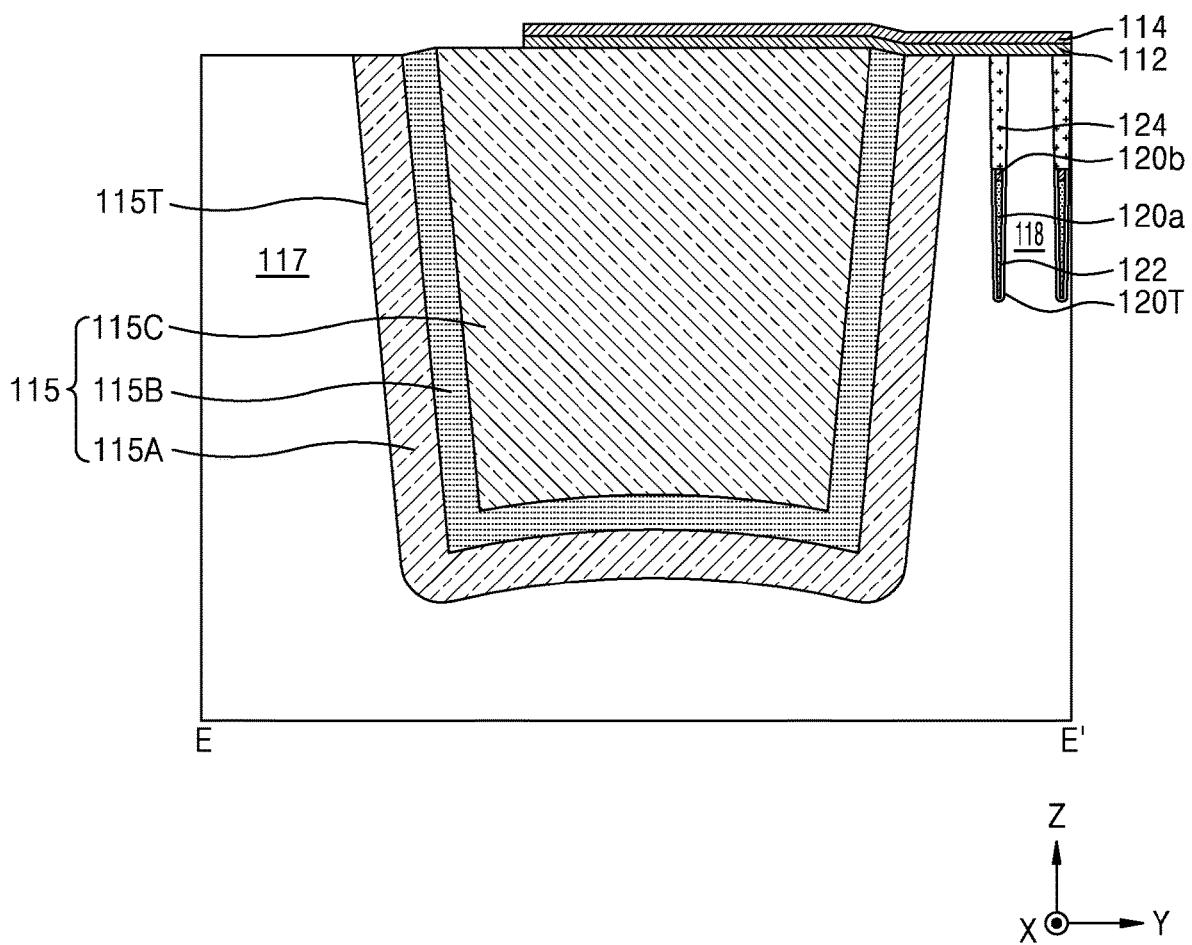
Figure 4A:
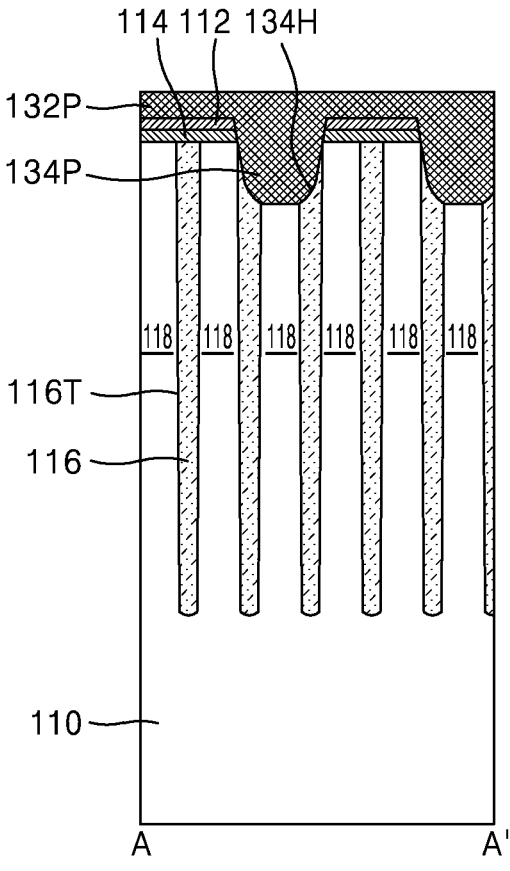
Figure 4A:
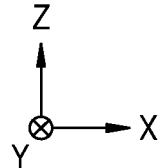
Figure 4B:
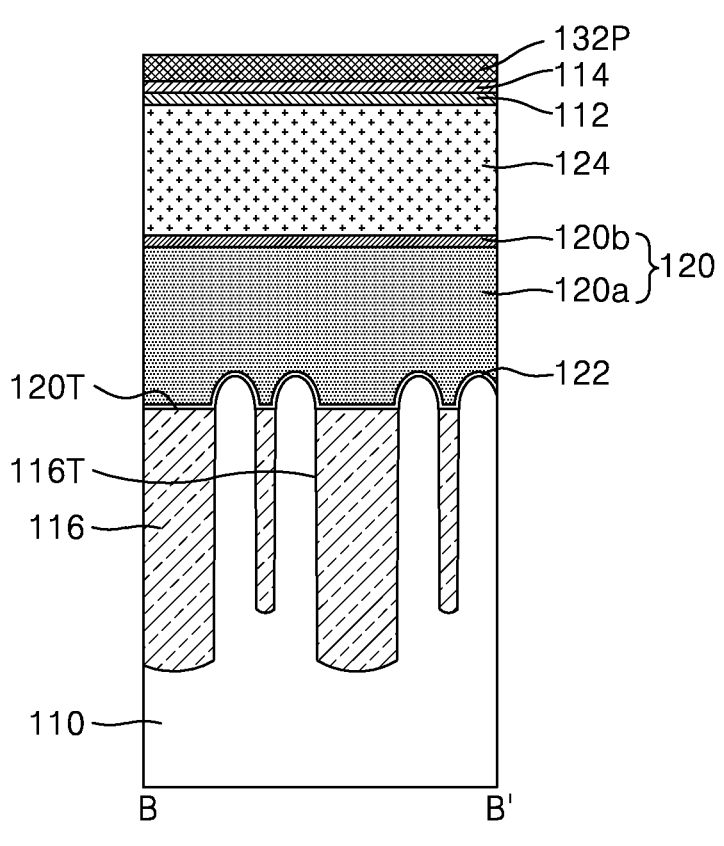
Figure 4C:
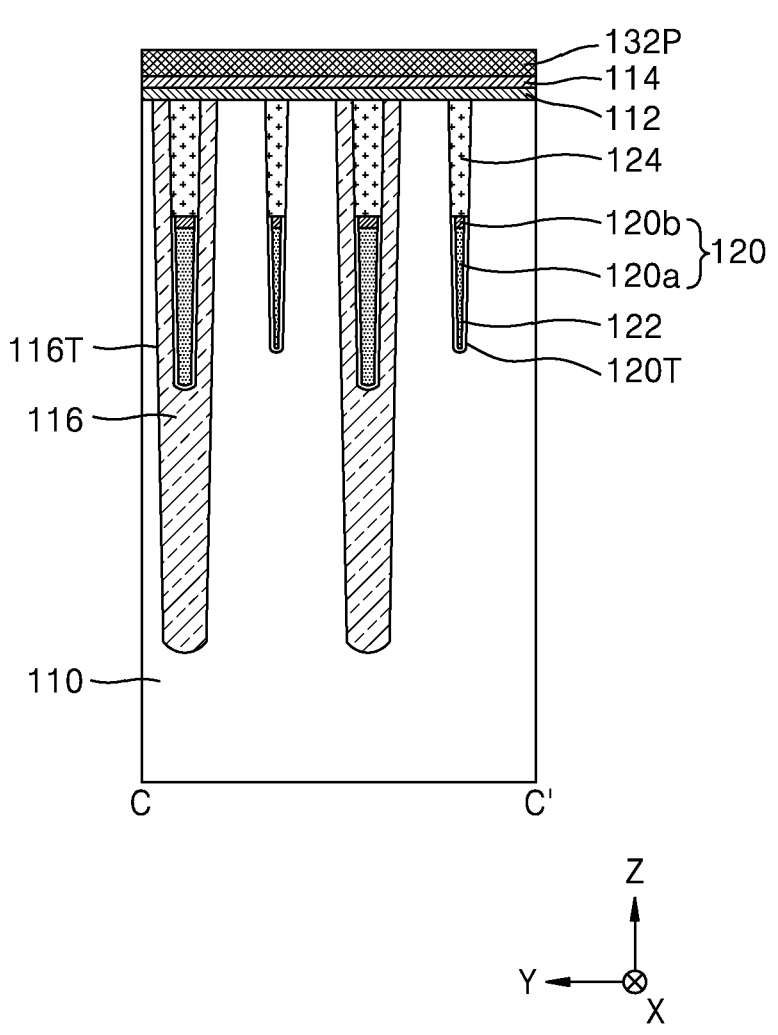
Figure 4D:
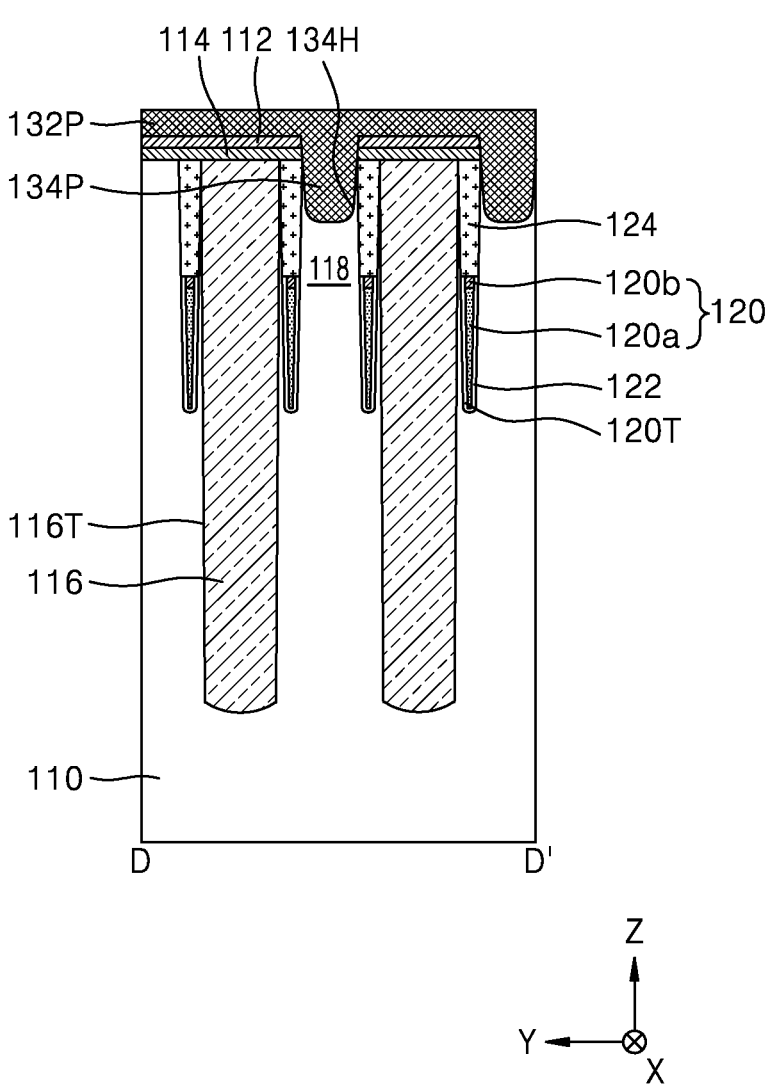
Figure 4E:
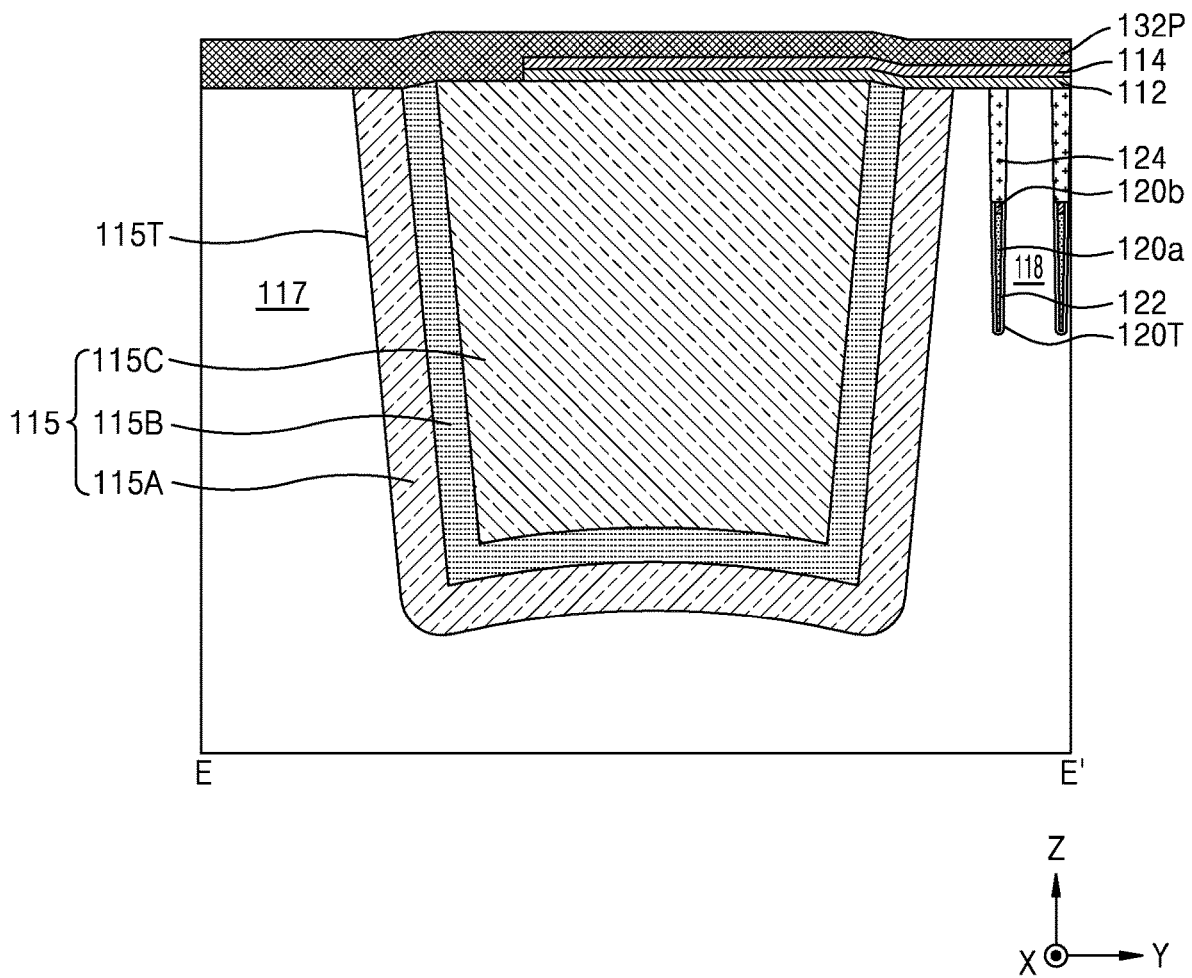
Figure 5A:
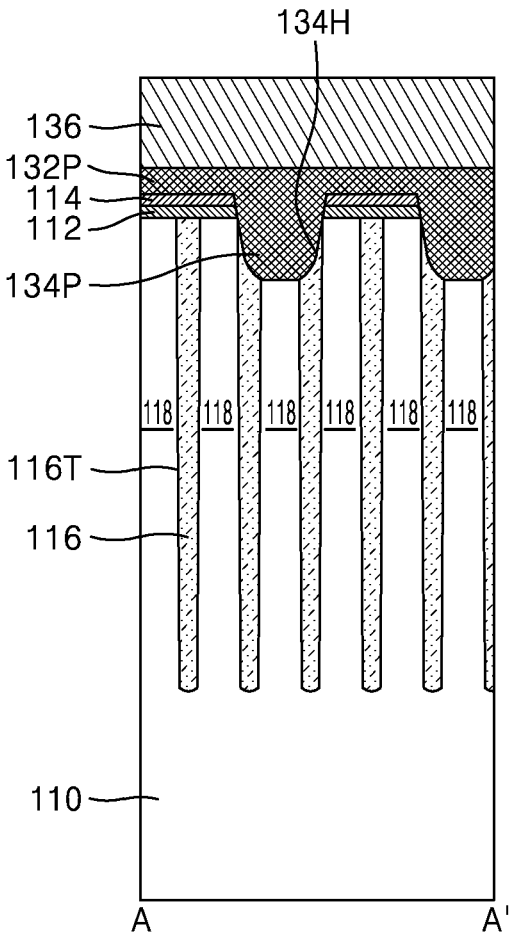
Figure 5A:
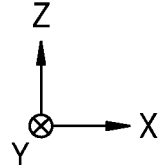
Figure 5B:
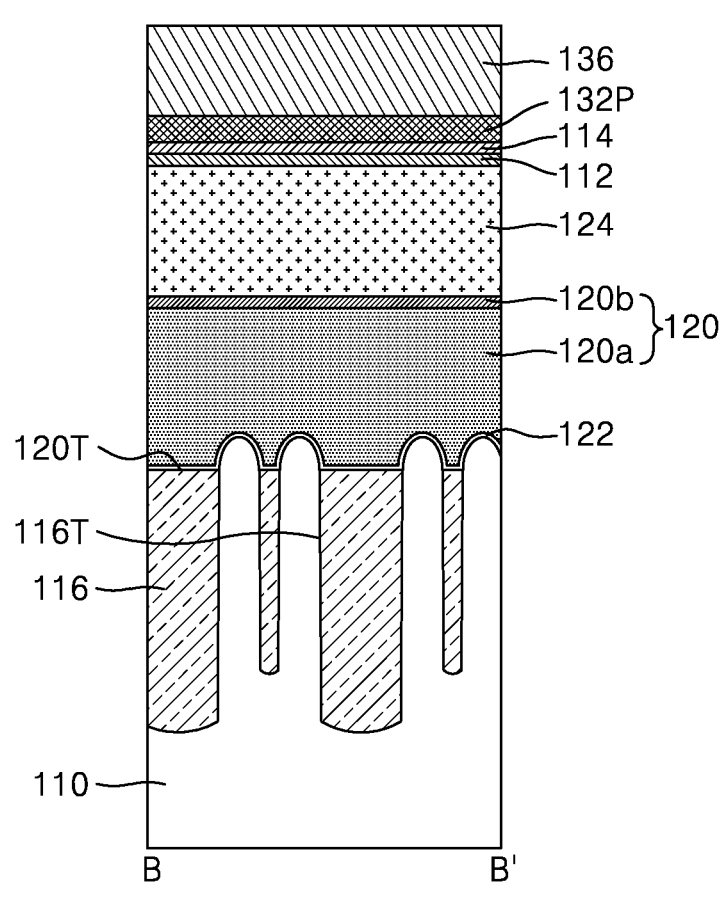
Figure 5C:
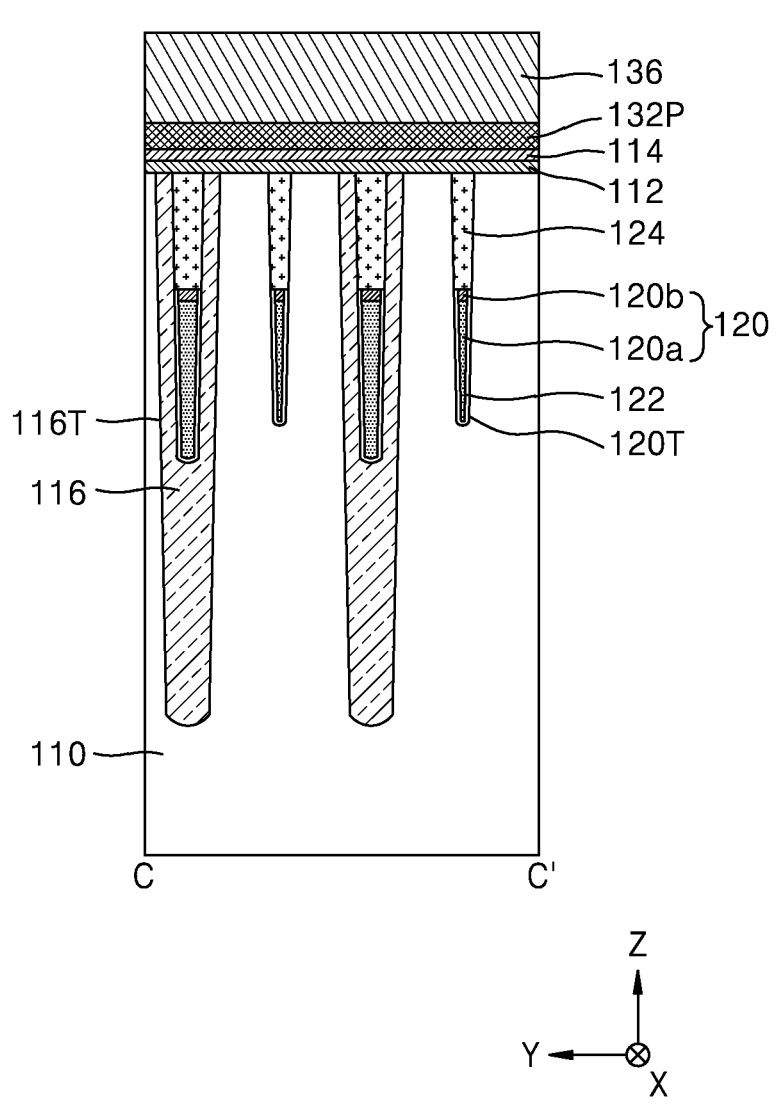
Figure 5D:
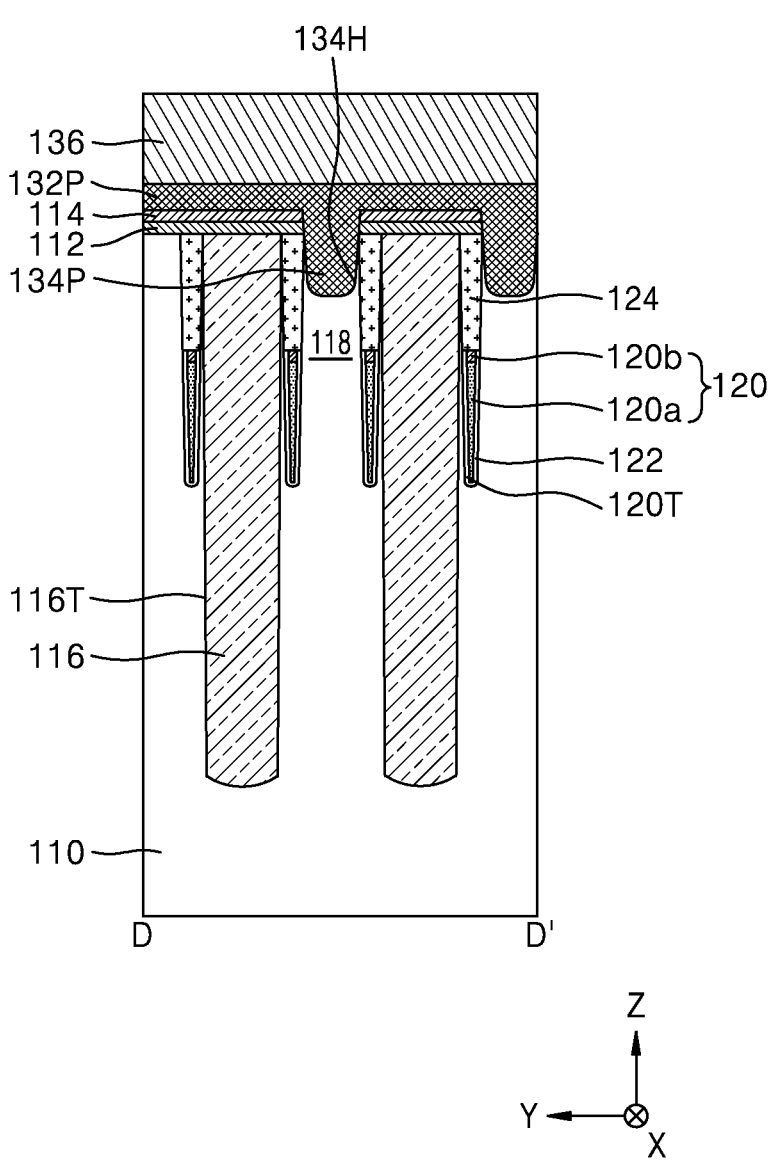
Figure 5E:
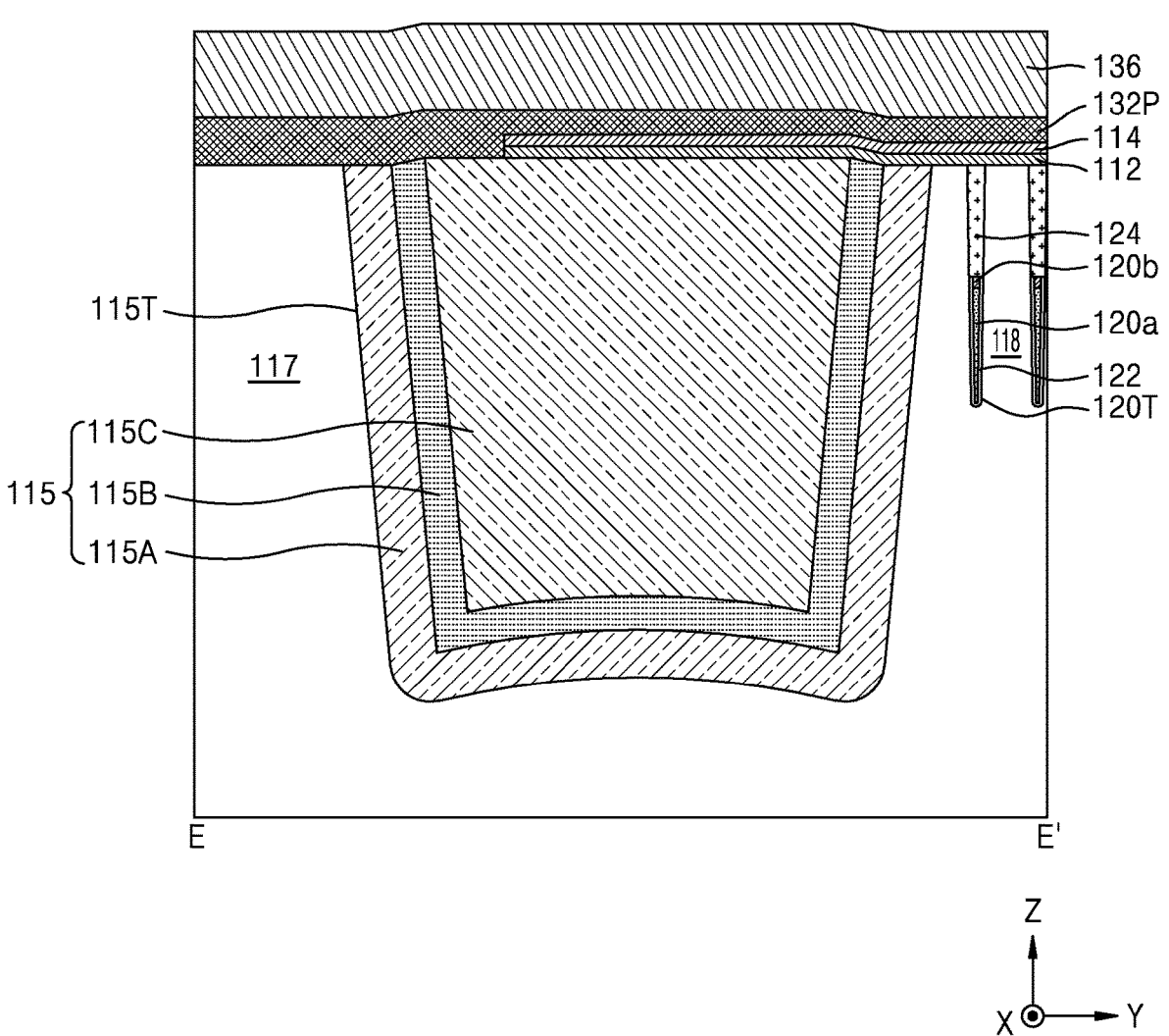

Hereinafter, embodiments will be described in detail with reference to the accompanying drawings. Embodiments described herein are example embodiments, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. It will be also understood that, even if a certain step or operation of manufacturing an apparatus or structure is described later than another step or operation, the step or operation may be performed later than the other step or operation unless the other step or operation is described as being performed after the step or operation. The same reference numerals are used to denote the same elements in the drawings, and repeated descriptions thereof are omitted. In the following detailed description and claims, it will be understood that, although the terms first, second, etc. may be used herein to describe various elements, these elements should not be limited by these terms. These terms are only used to distinguish one element from another.

FIG. 1 is a schematic plan layout for describing main components of a semiconductor memory device 1 according to an embodiment.

Referring to FIG. 1, the semiconductor memory device 1 includes a memory cell region CR and a peripheral circuit region PR. The semiconductor memory device 1 may include a plurality of active regions ACT formed in the memory cell region CR and a plurality of logic active regions ACTP formed in the peripheral circuit region PR.

In some embodiments, the plurality of active regions ACT may be arranged in the memory cell region CR to have long axes in an oblique direction with respect to a first horizontal direction (an X direction) and a second horizontal direction (a Y direction).

A plurality of word lines WL may extend parallel to one another in the first horizontal direction (the X direction) across the plurality of active regions ACT in the memory cell region CR. On the plurality of word lines WL, a plurality of bit lines BL may extend parallel to one another in the second horizontal direction (the Y direction) crossing the first horizontal direction (the X direction). The plurality of bit lines BL may be connected to the plurality of active regions ACT through a direct contact DC.

In some embodiments, a plurality of buried contacts BC may each be formed between each two adjacent bit lines BL among the plurality of bit lines BL. In some embodiments, the plurality of buried contacts BC may be arranged in a line in the first horizontal direction (the X direction) and the second horizontal direction (the Y direction).

A plurality of landing pads LP may be respectively formed on the plurality of buried contacts BC. The plurality of landing pads LP may be arranged to at least partially and respectively overlap the plurality of buried contacts BC. In some embodiments, each of the plurality of landing pads LP may extend to a top of one of two adjacent bit lines BL.

A plurality of storage nodes SN may be respectively formed on the plurality of landing pads LP. The plurality of storage nodes SN may be formed on the plurality of bit lines BL. Each of the plurality of storage nodes SN may be a lower electrode of each of a plurality of capacitors. The plurality of storage nodes SN may be connected to the plurality of active regions ACT through the plurality of landing pads LP and the plurality of buried contacts BC.

A plurality of gate line patterns GLP may be arranged on the plurality of logic active regions ACTP in the peripheral circuit region PR. In some embodiments, some of the gate line patterns GLP may extend parallel to one another in the second horizontal direction (the Y direction) on the plurality of logic active regions ACTP. However, embodiments are not limited thereto. For example, the plurality of gate line patterns GLP may have various widths, may extend parallel to one another in the first horizontal direction (the X direction), may have curves, or may extend in various horizontal directions with varying widths.

In FIG. 1, components other than the plurality of logic active regions ACTP and the plurality of gate line patterns GLP in the peripheral circuit region PR are omitted for convenience of illustration. In addition, it is illustrated in FIG. 1 that the plurality of gate line patterns GLP are arranged only on the plurality of logic active regions ACTP. However, embodiments are not limited thereto. For example, at least some of the gate line patterns GLP may extend outside a logic active region 117, for example, onto a logic device isolation layer 115 as illustrated in FIG. 20E.

The plurality of gate line patterns GLP may be at the same level as the plurality of bit lines BL. In some embodiments, the plurality of gate line patterns GLP and the plurality of bit lines BL may include the same material, or at least partially include the same material. For example, a process of forming all or some of the gate line patterns GLP may be the same as a process of forming all or some of the bit lines BL.

Figure 20A:
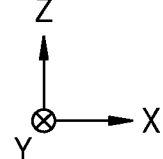
Figure 20C:
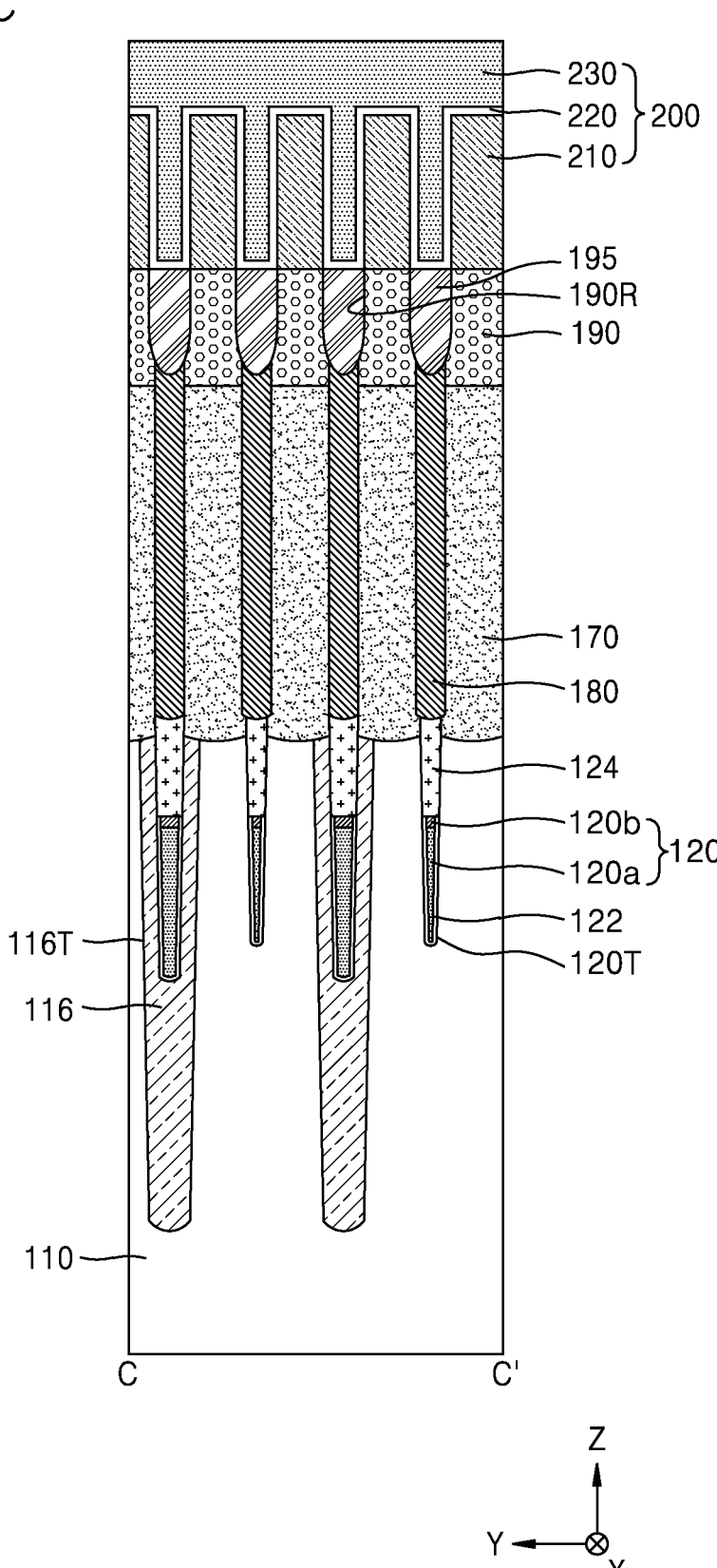
Figure 20D:
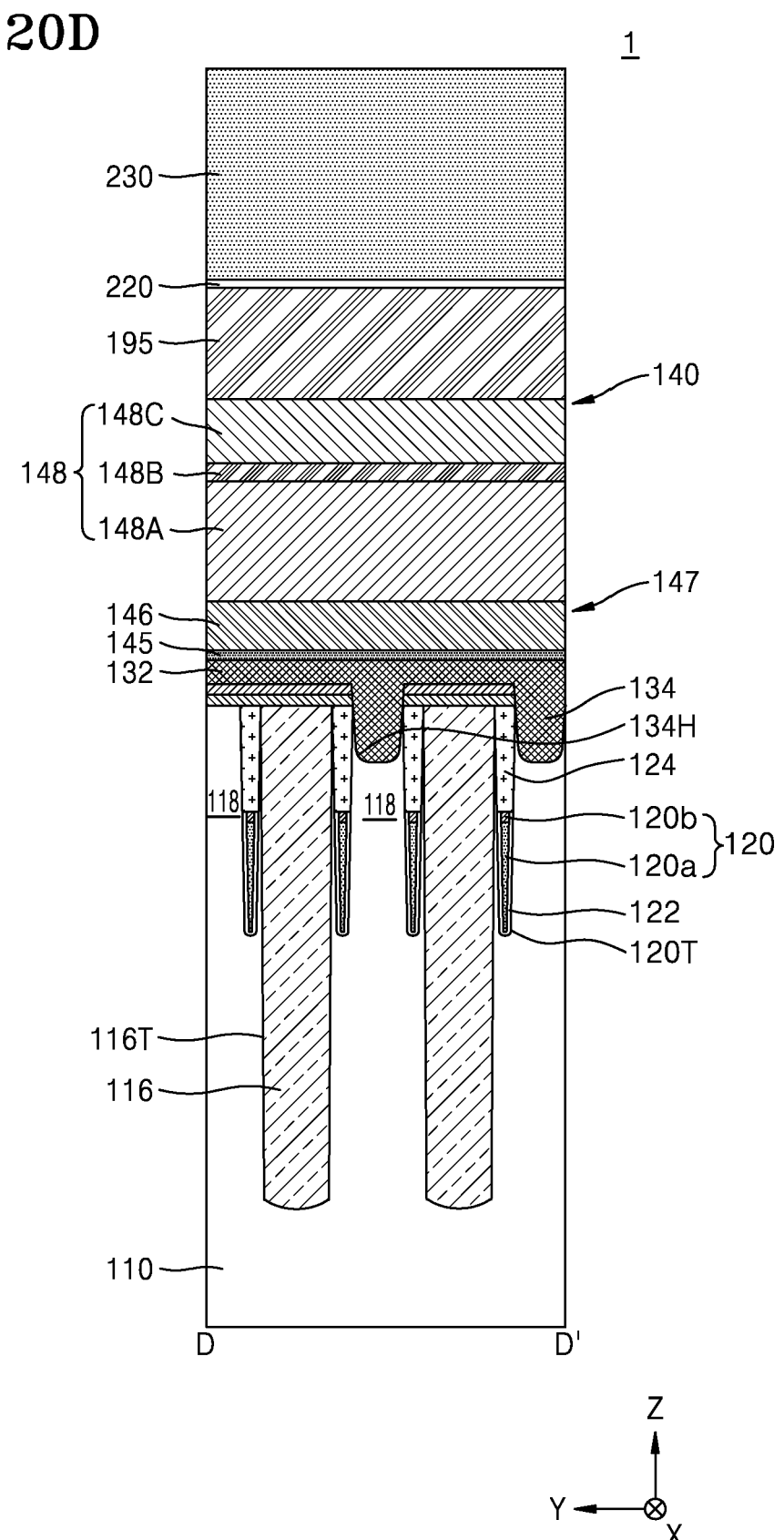
Figure 20E:
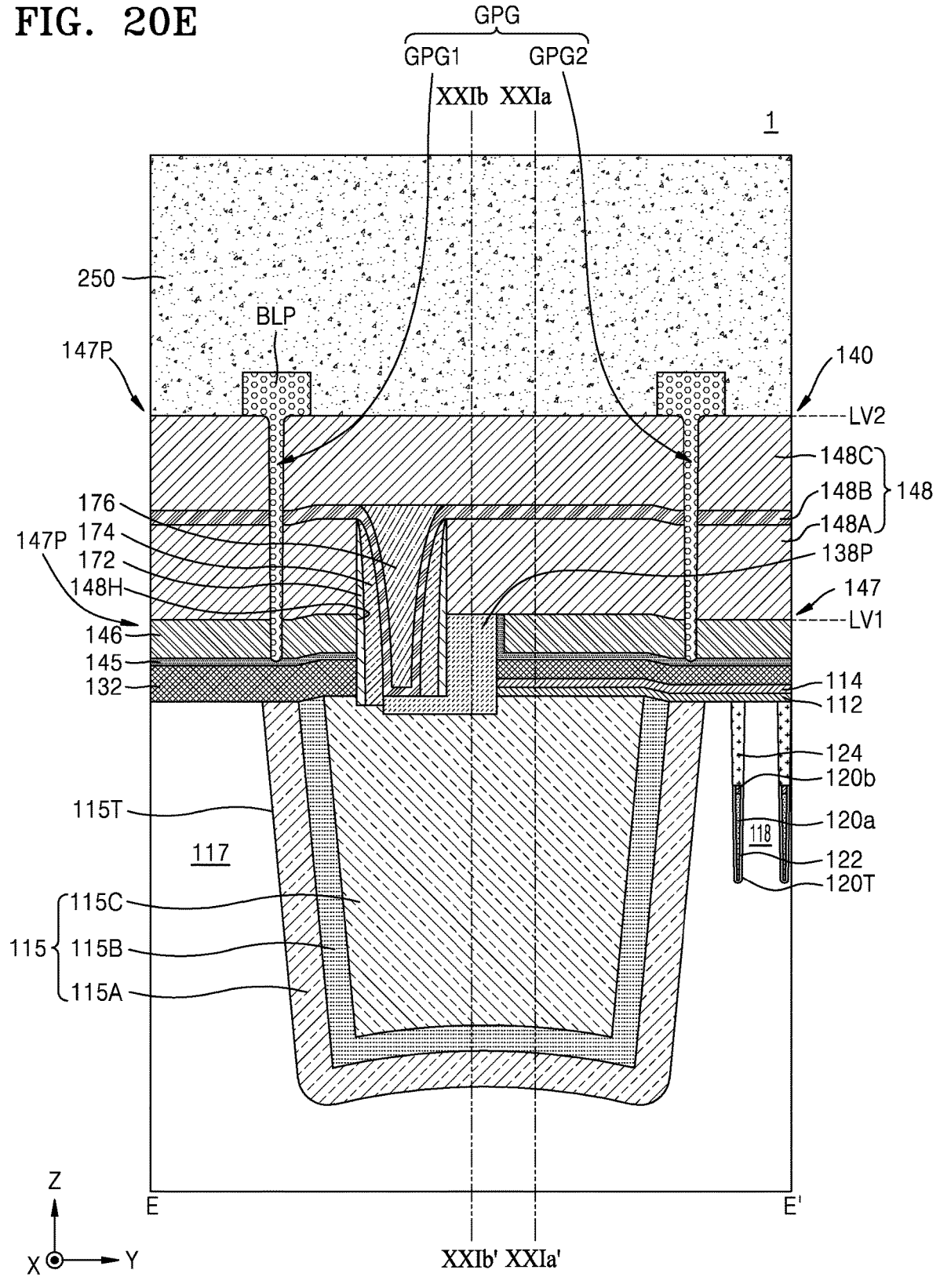
Figure 21A:
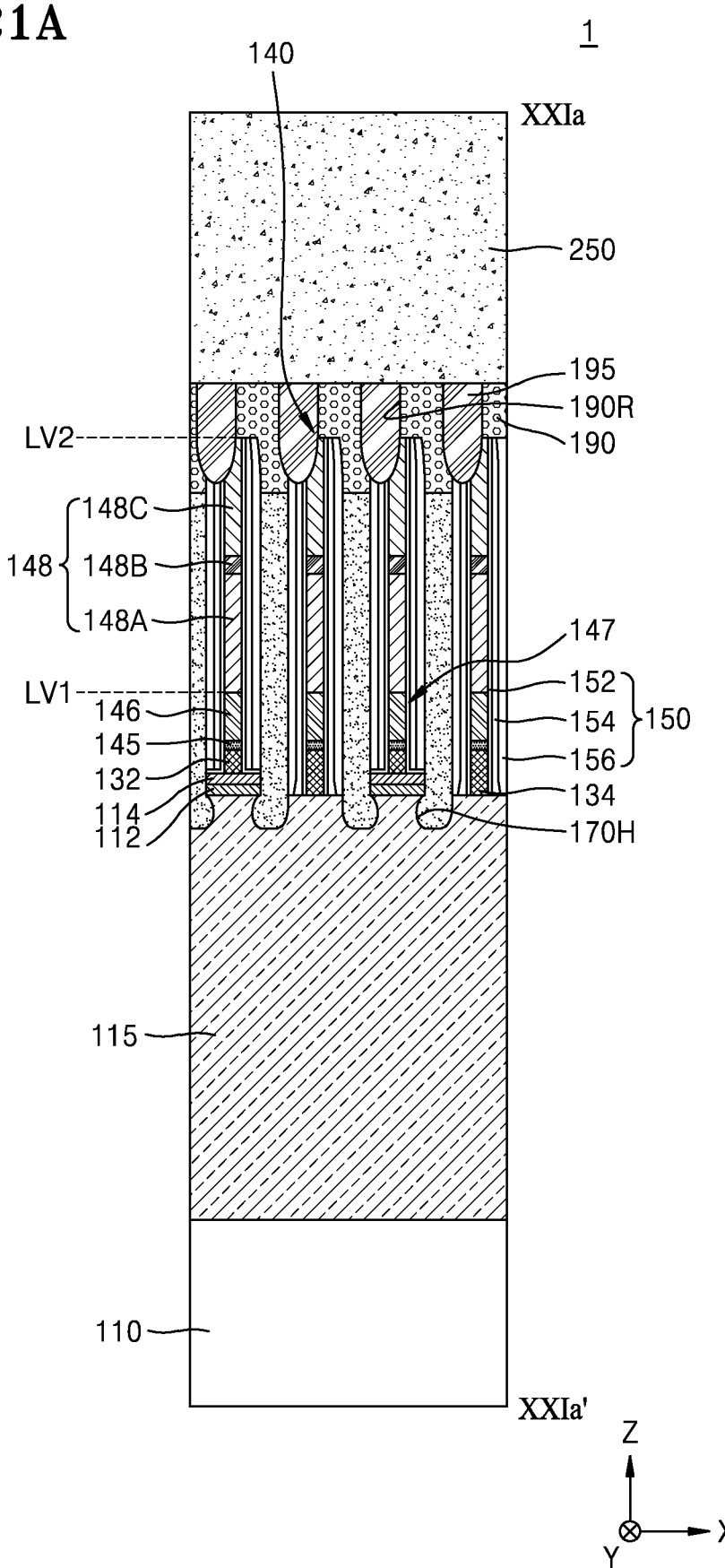
Figure 21B:
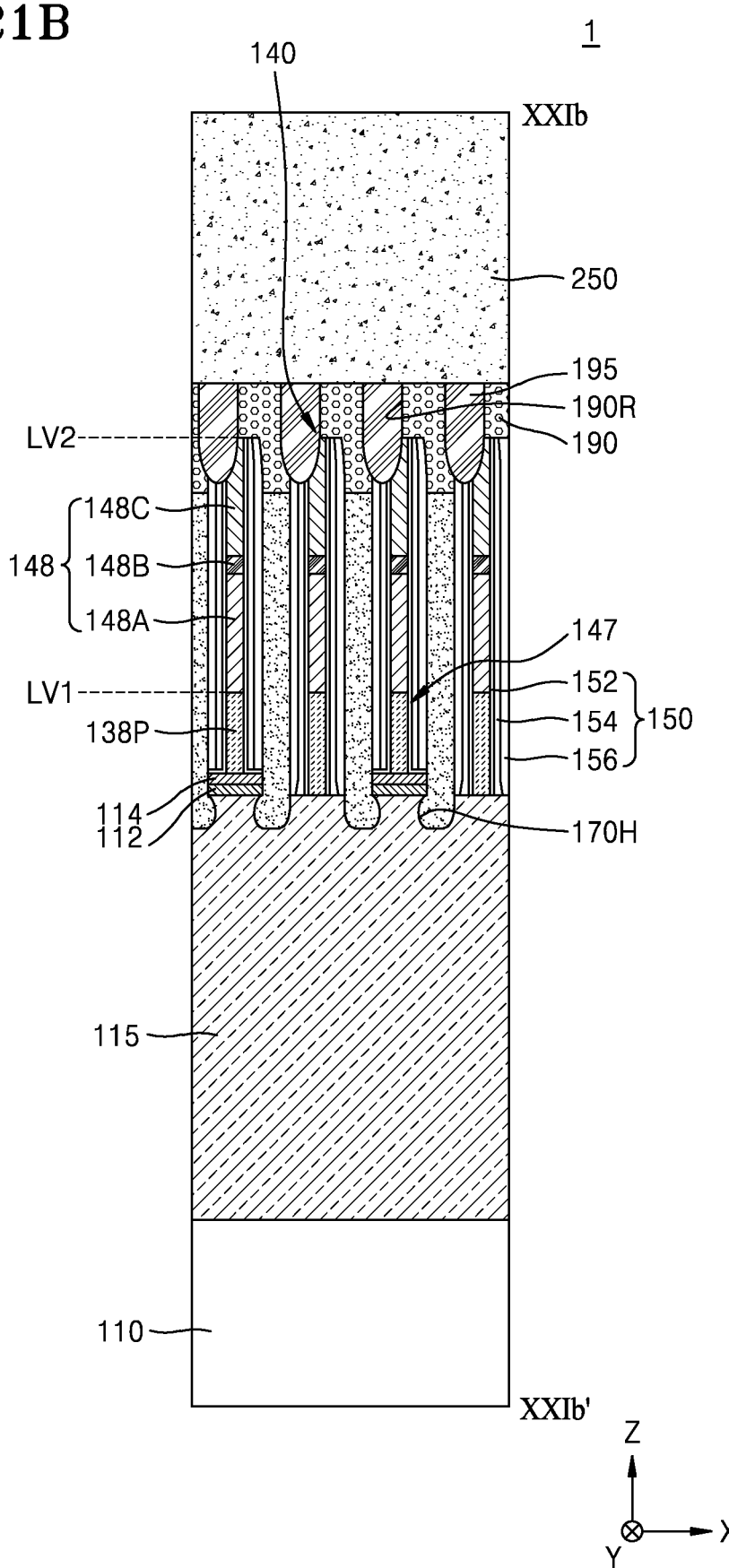

FIGS. 2A to 2E, 3A to 3E, 4A to 4E, 5A to 5E, 6 to 16, 17A to 17E, 18A to 18E, and 19A to 19E are cross-sectional views illustrating a method of manufacturing a semiconductor memory device, according to an embodiment, and FIGS. 20A to 20E and 21A and 21B are cross-sectional views illustrating a semiconductor memory device according to an embodiment. Specifically, FIGS. 2A, 3A, 4A, 5A, 17A, 18A, 19A, and 20A are cross-sectional views taken along the line A-A' of FIG. 1, FIGS. 2B, 3B, 4B, 5B, 17B, 18B, 19B, and 20B are cross-sectional views taken along the line B-B' of FIG. 1, FIGS. 2C, 3C, 4C, 5C, 17C, 18C, 19C, and 20C are cross-sectional views taken along the line C-C' of FIG. 1, FIGS. 2D, 3D, 4D, 5D, 17D, 18D, 19D, and 20D are cross-sectional views taken along the line D-D' of FIG. 1, FIGS. 2E, 3E, 4E, 5E, 6 to 16, 17E, 18E, 19E, and 20E are cross-sectional views taken along the line E-E' of FIG. 1, FIG. 21A is a cross-sectional view taken along the line XXIa-XXIa' of FIG. 20E, and FIG. 21B is a cross-sectional view taken along the line XXIb-XXIb' of FIG. 20E.

Referring to FIGS. 2A to 2E, a device isolation trench 116T and a logic device isolation trench 115T may be formed in a substrate 110, and a device isolation layer 116 filling the device isolation trench 116T and the logic device isolation layer 115 filling the logic device isolation trench 115T may be formed.

The substrate 110 may include, for example, silicon (Si), such as crystalline Si, polycrystalline Si, or amorphous Si. Alternatively, the substrate 110 may include a semiconductor element, such as germanium (Ge), or at least one compound semiconductor selected from silicon germanium (SiGe), silicon carbide (SiC), gallium arsenide (GaAs), indium arsenide (InAs), and indium phosphide (InP). Alternatively, the substrate 110 may have a silicon on insulator (SOI) structure. For example, the substrate 110 may include a buried oxide (BOX) layer. The substrate 110 may include a conductive region, for example, an impurity-doped well or an impurity-doped structure.

The device isolation layer 116 and the logic device isolation layer 115 may include, for example, at least one of silicon oxide, silicon nitride, and silicon oxynitride. Each of the device isolation layer 116 and the logic device isolation layer 115 may include a single layer including one type of insulating layer, a double layer including two types of insulating layers, or a multilayer including a combination of at least three types of insulating layers. However, embodiments are not limited thereto. For example, the logic device isolation layer 115 may include a multilayer consisting of a first device isolation layer 115A, a second device isolation layer 115B, and a third device isolation layer 115C including oxide, nitride, and oxide, respectively, and the device isolation layer 116 may include a multilayer identical to or similar to the one of the logic device isolation layer 115. A plurality of active regions 118 may be defined in the substrate 110 in the memory cell region CR (refer to FIG. 1) by the device isolation layer 116, and a plurality of logic active regions 117 may be defined in the substrate 110 in the peripheral circuit region PR (refer to FIG. 1) by the logic device isolation layer 115.

In the substrate 110, a portion in which the plurality of active regions 118 are arranged and an adjacent portion thereof are referred to as the memory cell region CR, and a portion in which the plurality of logic active regions 117 are arranged and an adjacent portion thereof are referred to as the peripheral circuit region PR. The plurality of bit lines BL may be arranged in the memory cell region CR, and the plurality of gate line patterns GLP may be arranged in the peripheral circuit region PR.

In some embodiments, the device isolation layer 116 and the logic device isolation layer 115 may be formed together with one another and may be referred to as a device isolation structure. The device isolation layer 116 may define the plurality of active regions 118 in the device isolation structure, and the logic device isolation layer 115 may define the plurality of logic active regions 117 in the device isolation structure. The device isolation structure at a boundary between the memory cell region CR and the peripheral circuit region PR may be the device isolation layer 116 or the logic device isolation layer 115, and the device isolation layer 116 and the logic device isolation layer 115 may not be clearly distinguished from one another at a boundary between the memory cell region CR and the peripheral circuit region PR.

Each of the plurality of active regions 118 may be in the form of a long island with a short axis and a long axis in a plan view, like each of the plurality of active regions ACT illustrated in FIG. 1. Each of the plurality of logic active regions 117 may be in the form of a rectangle in a plan view, like each of the plurality of logic active regions ACTP illustrated in FIG. 1. However, embodiments are not limited thereto, and each of the plurality of logic active regions 117 may be in the form of one of various planes.

In some embodiments, the uppermost end of the logic device isolation layer 115 may be at a level higher than a main surface or a top surface of the substrate 110. A top surface of the first device isolation layer 115A of the logic device isolation layer 115 may be at the same level as the main surface or the top surface of the substrate 110, a top surface of the third device isolation layer 115C may be at a level higher than the main surface or the top surface of the substrate 110, and a top surface of the second device isolation layer 115B may be at a level between the top surface of the first device isolation layer 115A and the top surface of the third device isolation layer 115C. However, embodiments are not limited thereto. For example, in the logic device isolation layer 115, a top surface of a portion adjacent to the substrate 110 may be substantially at the same level as the main surface or the top surface of the substrate 110. A top surface of a portion of the logic device isolation layer 115 spaced apart from the substrate 110 may be at a level higher than the main surface or the top surface of the substrate 110.

A level indicates a height in a vertical direction (a Z direction) perpendicular to the main surface or the top surface of the substrate 110. That is, being at the same level or a certain level indicates that a height in the vertical direction (the Z direction) perpendicular to the main surface or the top surface of the substrate 110 is the same or constant, and being at a higher/lower level indicates that a height in the vertical direction (the Z direction) perpendicular to the main surface of the substrate 110 is higher/lower.

A plurality of word line trenches 120T may be formed in the substrate 110. The plurality of word line trenches 120T may extend parallel to one another in the first horizontal direction (the X direction), and may be in the form of lines crossing the plurality of active regions 118 and spaced apart from one another at substantially equal intervals in the second horizontal direction (the Y direction). In some embodiments, steps may be formed on bottom surfaces of the plurality of word line trenches 120T. In some embodiments, the device isolation layer 116 and the substrate 110 may be etched by separate etching processes by using the plurality of word line trenches 120T, so that the device isolation layer 116 and the substrate 110 are etched with different etching depths. In some embodiments, the device isolation layer 116 and the substrate 110 may be etched together with one another by using the plurality of word line trenches 120T, such that the device isolation layer 116 and the substrate 110 are etched with different etching depths due to a difference in etching rate between the device isolation layer 116 and the substrate 110.

A plurality of gate dielectric layers 122, a plurality of word lines 120, and a plurality of buried insulating layers 124 may be sequentially formed in the plurality of word line trenches 120T. The plurality of word lines 120 may respectively constitute the plurality of word lines WL illustrated in FIG. 1. The plurality of word lines 120 may extend parallel to one another in the first horizontal direction (the X direction), and may be in the form of lines crossing the plurality of active regions 118 and spaced apart from one another at substantially equal intervals in the second horizontal direction (the Y direction). A top surface of each of the plurality of word lines 120 may be at a level lower than the top surface of the substrate 110. Bottom surfaces of the plurality of word lines 120 may be concavo-convex, and saddle fin field effect transistors (FET) may be formed in the plurality of active regions 118.

Each of the plurality of word lines 120 may have a stacked structure including a lower word line layer 120a and an upper word line layer 120b. For example, the lower word line layer 120a may include a metal material, conductive metal nitride, or a combination thereof. In some embodiments, the lower word line layer 120a may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. For example, the upper word line layer 120b may include doped polysilicon. In some embodiments, the lower word line layer 120a may include a core layer or a barrier layer arranged between a core layer and each of the plurality of gate dielectric layers 122. For example, the core layer may include a metal material or conductive metal nitride, such as W, WN, TiSiN, or WSiN, and the barrier layer may include a metal material or conductive metal nitride, such as Ti, TiN, Ta, or TaN.

In some embodiments, before or after forming the plurality of word lines 120, impurity ions may be implanted into the plurality of active regions 118 of the substrate 110 on both sides of the plurality of word lines 120 to form source and drain regions in the plurality of active regions 118.

The gate dielectric layer 122 may include at least one selected from silicon oxide, silicon nitride, silicon oxynitride, oxide/nitride/oxide (ONO), and a high-k dielectric having a dielectric constant that is greater than silicon oxide. For example, each of the plurality of gate dielectric layers 122 may have a dielectric constant of about 10 to about 25. In some embodiments, the plurality of gate dielectric layers 122 may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO). For example, the plurality of gate dielectric layers 122 may include $HfO_2$, $Al_2O_3$, $HfAlO_3$, $Ta_2O_3$, or $TiO_2$.

A top surface of each of the plurality of buried insulating layers 124 may be at substantially the same level as the top surface of the substrate 110. The plurality of buried insulating layers 124 may include at least one material selected from silicon oxide, silicon nitride, silicon oxynitride, and a combination thereof.

Referring to FIGS. 3A to 3E, first and second insulating layer patterns 112 and 114 covering the device isolation layer 116, the plurality of active regions 118, and the plurality of buried insulating layers 124 are formed. The first and second insulating layer patterns 112 and 114 may further cover at least a part of the logic device isolation layer 115 and at least parts of the plurality of logic active regions 117. For example, the first and second insulating layer patterns 112 and 114 may cover a part of the logic device isolation layer 115 and may not cover the remaining part of the logic device isolation layer 115. In some embodiments, the first and second insulating layer patterns 112 and 114 may cover a part of the logic device isolation layer 115 adjacent to the memory cell region CR, and may not cover the remaining part of the logic device isolation layer 115.

For example, the first and second insulating layer patterns 112 and 114 may include silicon oxide, silicon nitride, silicon oxynitride, a metallic dielectric, or a combination thereof. In some embodiments, the first and second insulating layer patterns 112 and 114 may be formed by stacking a plurality of insulating layers. In some embodiments, the first insulating layer pattern 112 may include silicon oxide, and the second insulating layer pattern 114 may include silicon oxynitride.

In some embodiments, the first insulating layer pattern 112 may include a non-metallic dielectric layer, and the second insulating layer pattern 114 may include a metallic dielectric layer. For example, the first insulating layer pattern 112 may include silicon oxide, silicon nitride, silicon oxynitride, or a combination thereof. For example, the second insulating layer pattern 114 may include at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

Then, a plurality of direct contact holes 134H passing through the first and second insulating layer patterns 112 and 114 to expose source regions in the plurality of active regions 118 are formed. In some embodiments, the plurality of direct contact holes 134H may extend into the plurality of active regions 118, that is, the source regions.

Referring to FIGS. 4A to 4E, a conductive semiconductor layer 132P covering the substrate 110 on which the first and second insulating layer patterns 112 and 114 are formed and a direct contact conductive layer 134P filling the plurality of direct contact holes 134H are formed.

For example, the conductive semiconductor layer 132P may include doped polysilicon. For example, the direct contact conductive layer 134P may include Si, Ge, W, WN, cobalt (Co), nickel (Ni), Al, molybdenum (Mo), ruthenium (Ru), Ti, TiN, Ta, TaN, copper (Cu), or a combination of thereof. In some embodiments, the direct contact conductive layer 134P may include an epitaxial silicon layer. In some embodiments, the direct contact conductive layer 134P may include doped polysilicon.

In some embodiments, the conductive semiconductor layer 132P and the direct contact conductive layer 134P may be formed together with one another, the conductive semiconductor layer 132P may cover the first and second insulating layer patterns 112 and 114, and the direct contact conductive layer 134P may be provided in the plurality of direct contact holes 134H to fill the plurality of direct contact holes 134H.

In other embodiments, referring to FIGS. 3A to 4E, the conductive semiconductor layer 132P, covering the substrate 110 on which the first and second insulating layer patterns 112 and 114 are formed, is formed first, and then the plurality of direct contact holes 134H passing through the conductive semiconductor layer 132P and the first and second insulating layer patterns 112 and 114 to expose the source regions in the plurality of active regions 118 are formed, the direct contact conductive layer 134P filling the plurality of direct contact holes 134H may be formed. For example, a top surface of the conductive semiconductor layer 132P and a top surface of the direct contact conductive layer 134P may be at the same level.

Referring to FIGS. 5A to 5E, a protective mask layer 136 covering the conductive semiconductor layer 132P and a direct contact fixed layer 130P is formed. For example, the protective mask layer 136 may include oxide.

Figure 6:
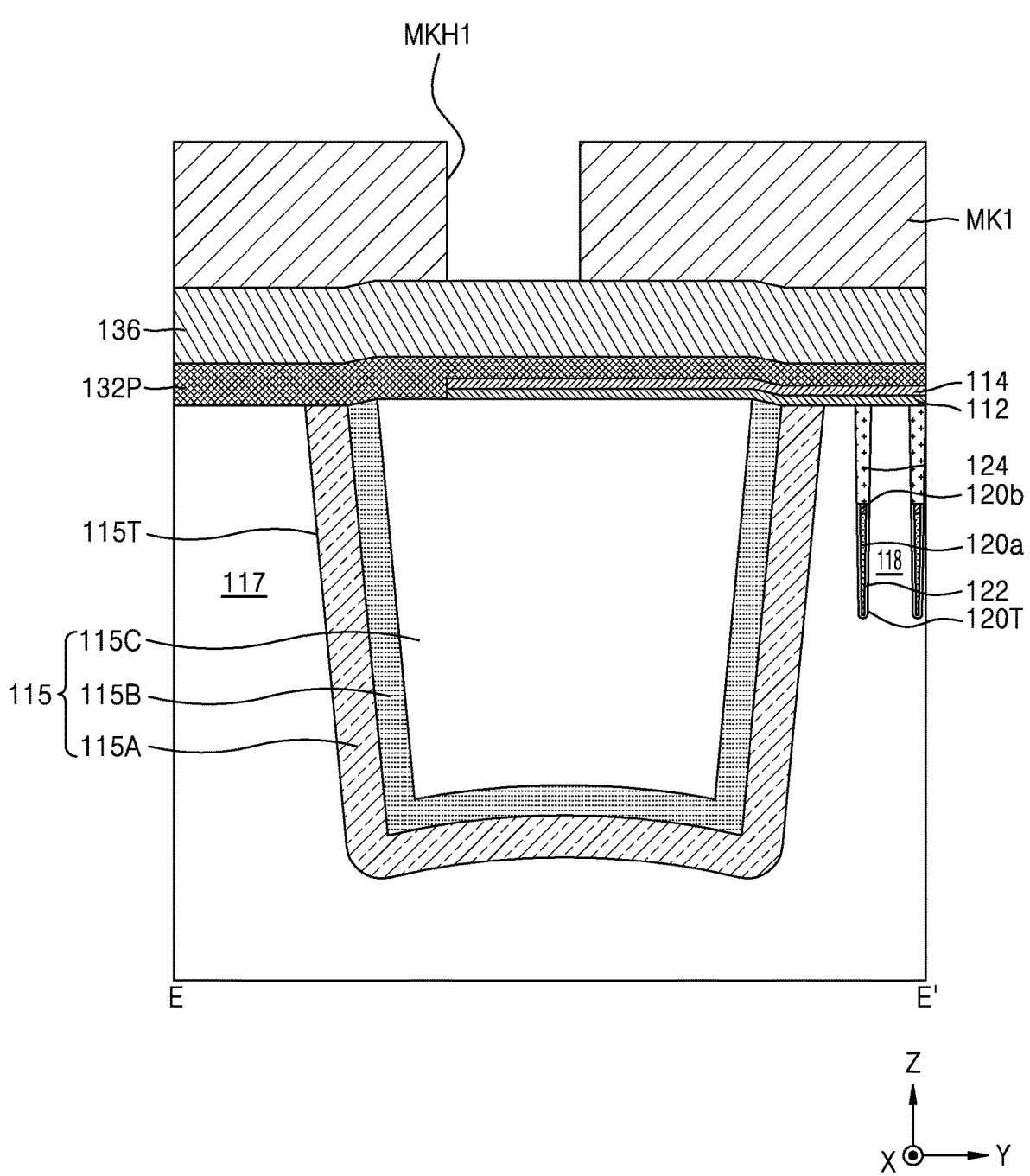

Referring to FIG. 6, a first mask pattern MK1 having a first mask opening MKH1 is formed on the protective mask layer 136. For example, the first mask pattern MK1 may include photoresist or a hard mask layer.

The first mask opening MKH1 may be over (i.e., along the vertical direction Z) the logic device isolation layer 115. For example, the first mask opening MKH1 may vertically overlap portions of the first and second insulating layer patterns 112 and 114 positioned on the logic device isolation layer 115.

Figure 7:
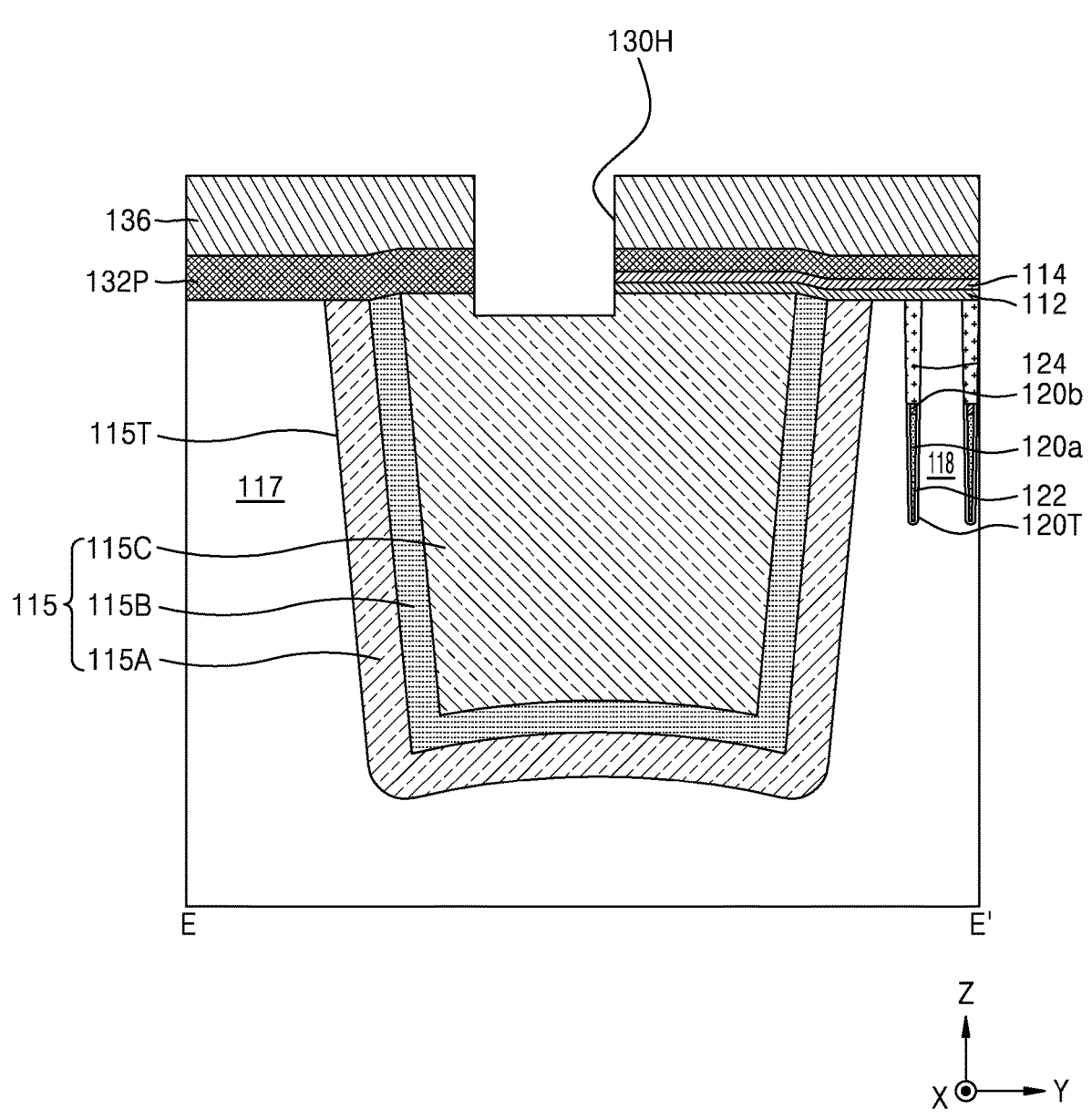

Referring to FIGS. 6 and 7, a first separation opening 130H, through a bottom surface of which the logic device isolation layer 115 is exposed, is formed by removing parts of the protective mask layer 136, the conductive semiconductor layer 132P, and the first and second insulating layer patterns 112 and 114 by using the first mask pattern MK1 as an etching mask. The first separation opening 130H may overlap the logic device isolation layer 115.

In some embodiments, the first separation opening 130H may extend into an upper part of the logic device isolation layer 115 through the protective mask layer 136, the conductive semiconductor layer 132P, and the first and second insulating layer patterns 112 and 114 so that a bottom surface of the first separation opening 130H is at a level lower than the uppermost end of the logic device isolation layer 115.

After the first separation opening 130H is formed, the first mask pattern MK1 may be removed.

Figure 8:
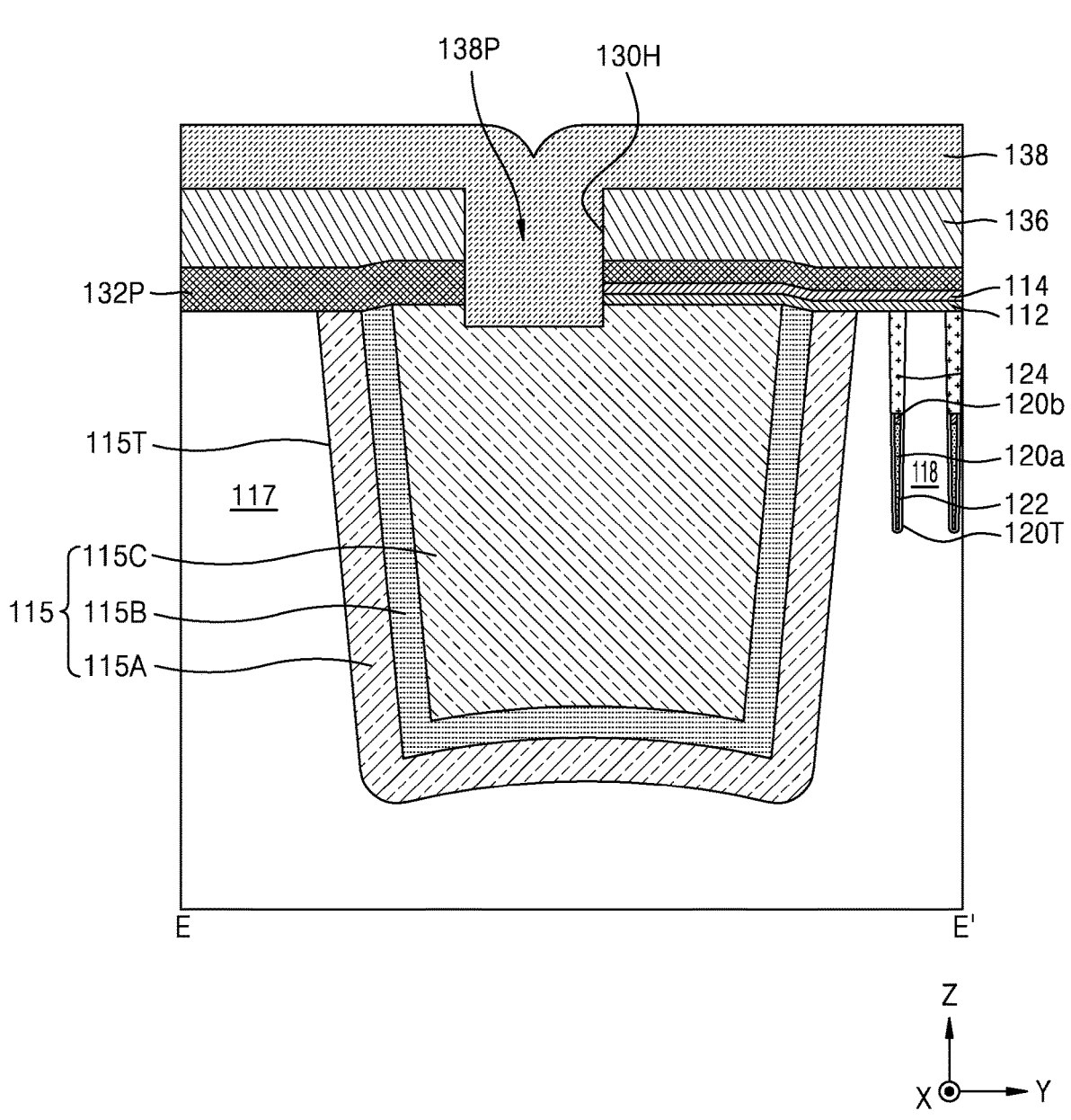

Referring to FIG. 8, a cover insulating layer 138 covering the protective mask layer 136 and filling the first separation opening 130H is formed. A portion of the cover insulating layer 138 filling the first separation opening 130H may be referred to as a cover insulating structure 138P. For example, the cover insulating layer 138 may include nitride. In some embodiments, a bottom surface of the cover insulating structure 138P may be at a level lower than the uppermost end of the logic device isolation layer 115. For example, the cover insulating structure 138P may extend into an upper part of the logic device isolation layer 115 through the protective mask layer 136, the conductive semiconductor layer 132P, and the first and second insulating layer patterns 112 and 114.

Figure 9:
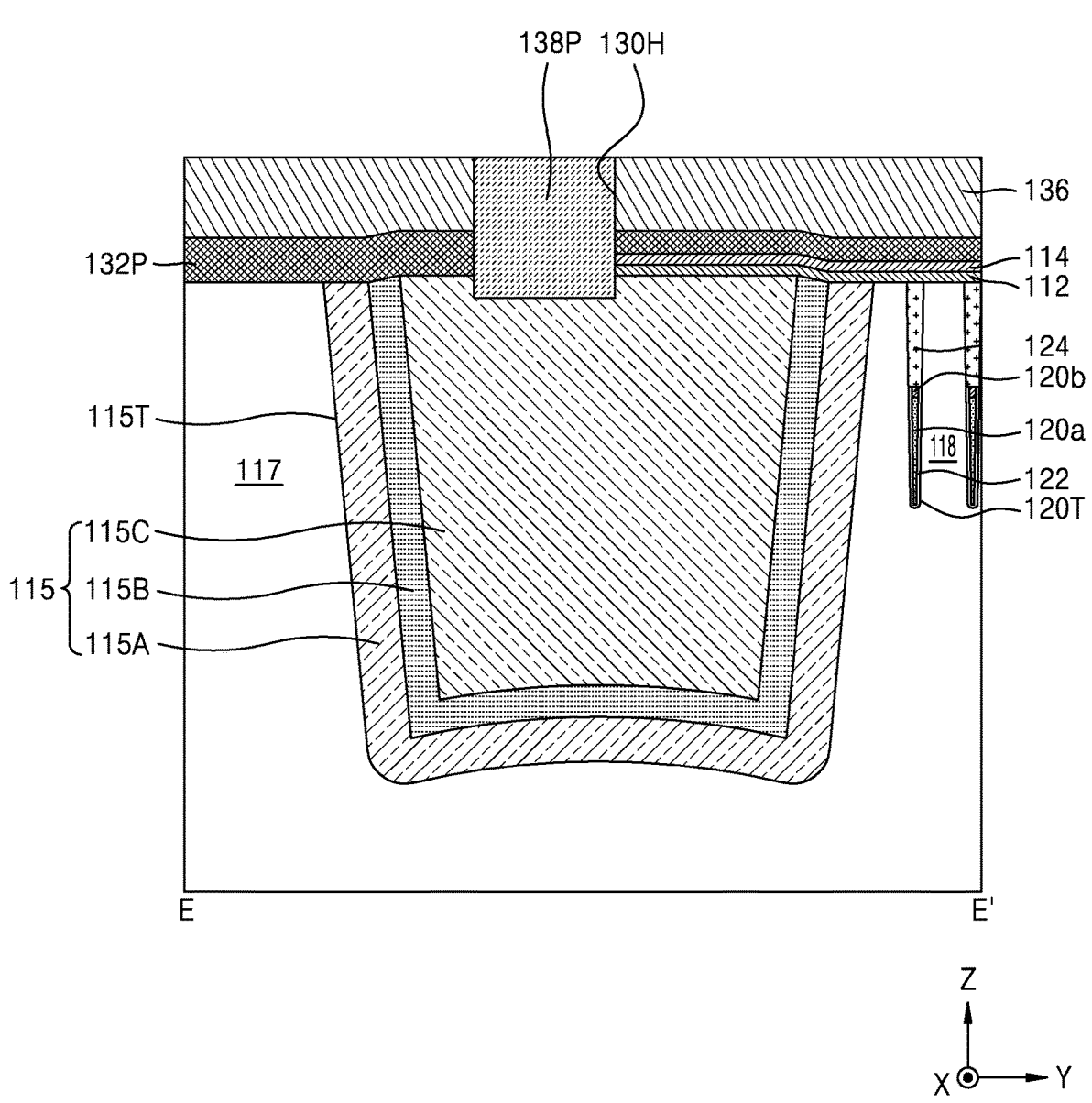

Referring to FIGS. 8 and 9, a portion of the cover insulating layer 138 covering a top surface of the protective mask layer 136 is removed so that the cover insulating structure 138P filling the first separation opening 130H remains. In some embodiments, the portion of the cover insulating layer 138 covering the top surface of the protective mask layer 136 may be removed by performing a chemical mechanical polishing (CMP) process.

Figure 10:
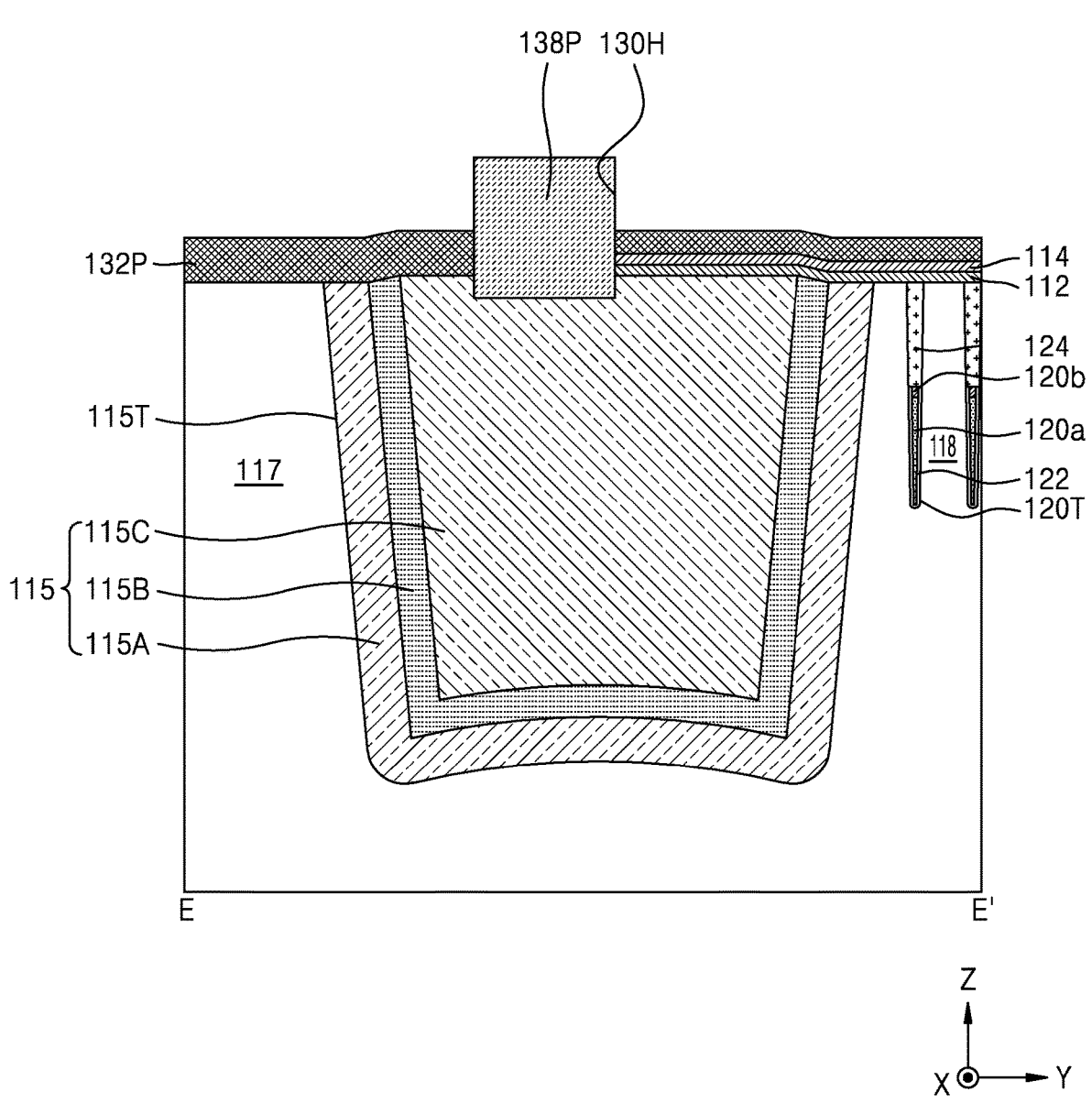

Referring to FIGS. 9 and 10, the protective mask layer 136 is removed. Because the protective mask layer 136 is removed, the cover insulating structure 138P may protrude above the top surface of the conductive semiconductor layer 132P.

Figure 11:
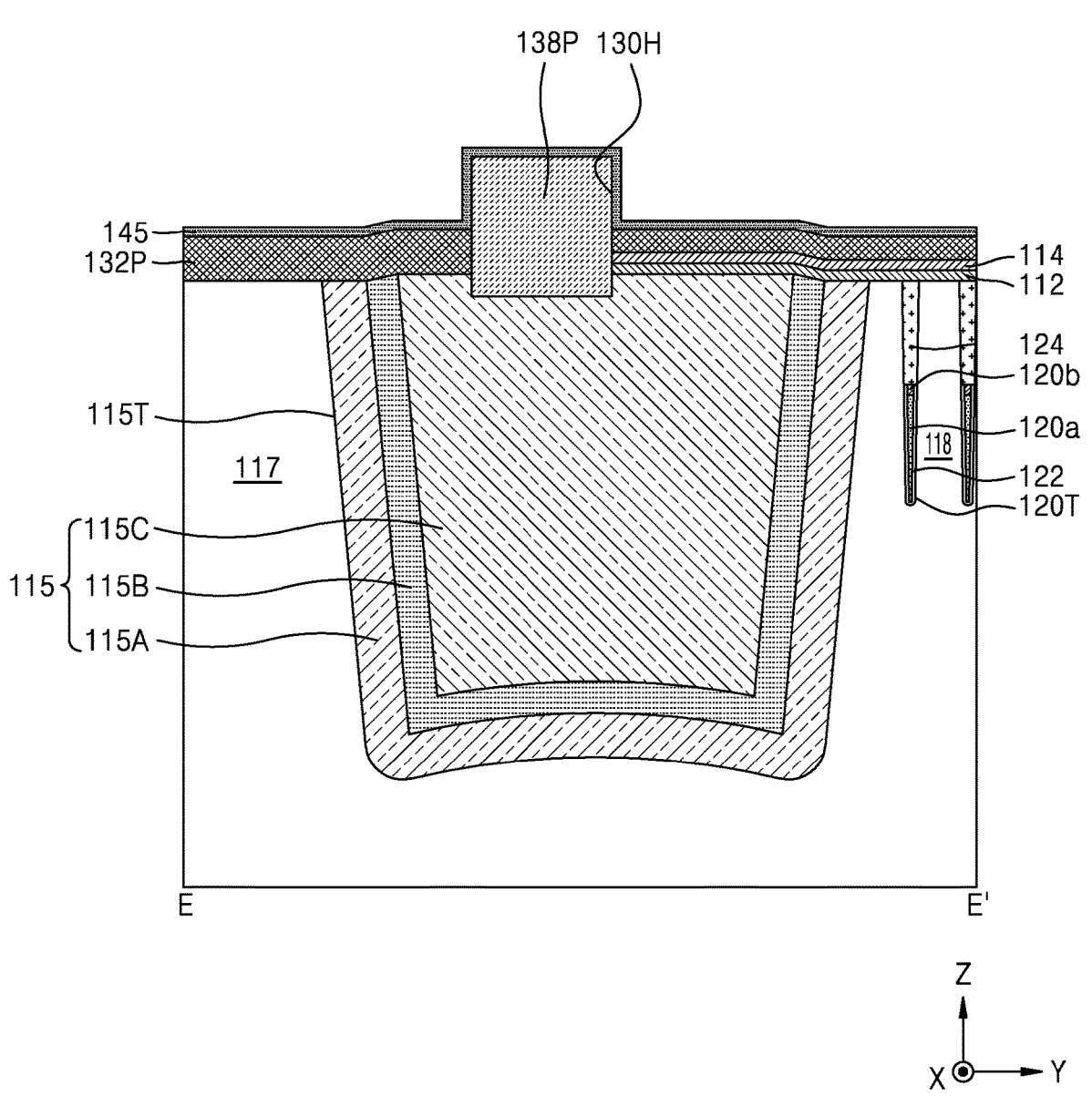

Referring to FIG. 11, a first metallic conductive layer 145 is formed on the conductive semiconductor layer 132P and the cover insulating structure 138P. The first metallic conductive layer 145 may conformally cover the conductive semiconductor layer 132P and the cover insulating structure 138P. For example, the first metallic conductive layer 145 may include TiN or Ti—Si—N (TSN). In some embodiments, the first metallic conductive layer 145 may function as a diffusion barrier.

Figure 12:
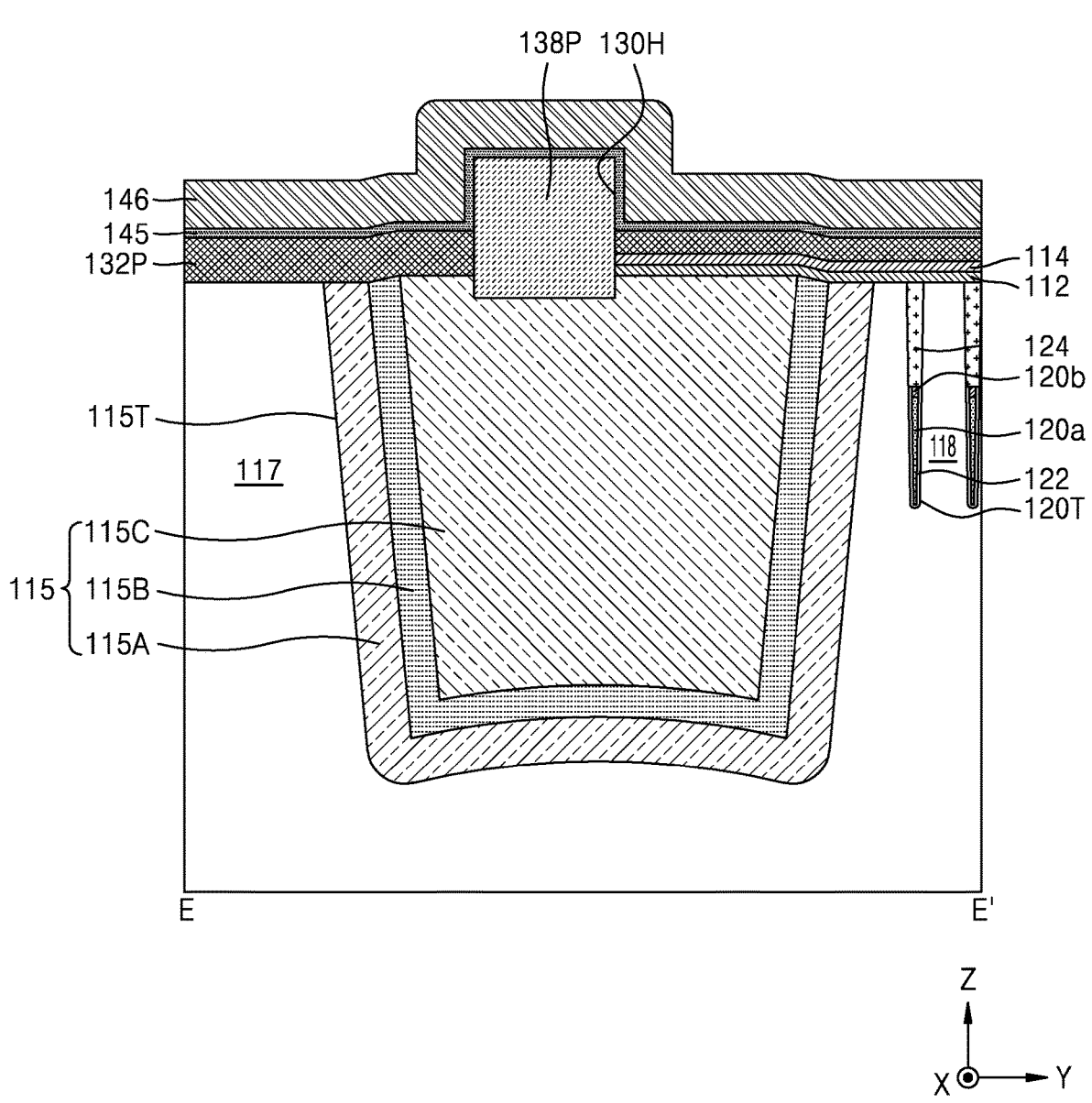

Referring to FIG. 12, a second metallic conductive layer 146 is formed on the first metallic conductive layer 145. The second metallic conductive layer 146 may be thicker than the first metallic conductive layer 145. For example, the second metallic conductive layer 146 may include W or tungsten silicide (WSix).

Figure 13:
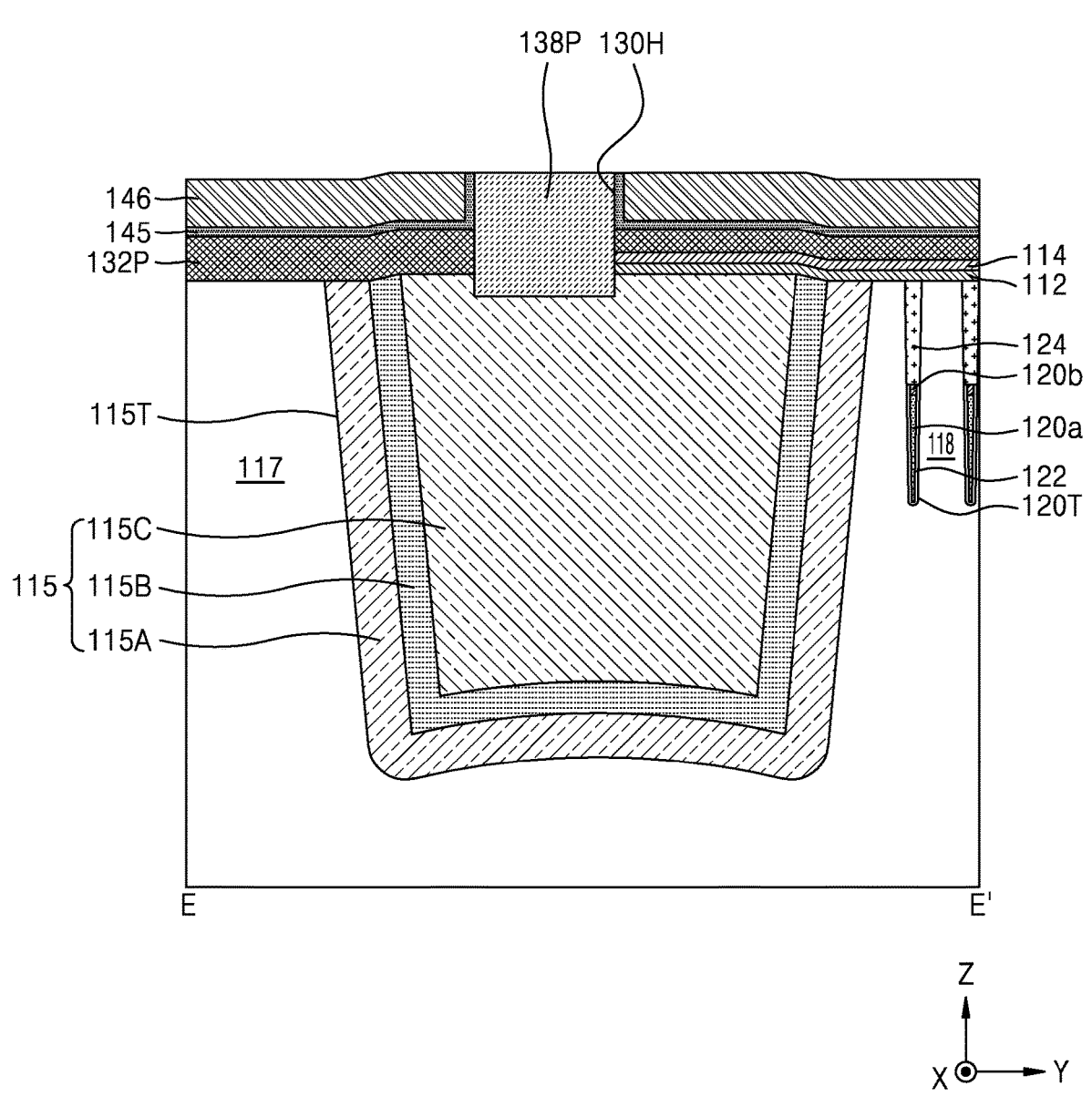

Referring to FIGS. 12 and 13, a part of the first metallic conductive layer 145 and a part of the second metallic conductive layer 146 are removed so that the cover insulating structure 138P is exposed. For example, a part of the first metallic conductive layer 145 and a part of the second metallic conductive layer 146 may be removed by performing a CMP process or an etch-back process.

The uppermost end of the cover insulating structure 138P, the uppermost end of the first metallic conductive layer 145, and the uppermost end of the second metallic conductive layer 146 may be at the same level. The first metallic conductive layer 145 may partly cover side surfaces of the cover insulating structure 138P. The second metallic conductive layer 146 may be spaced apart from the cover insulating structure 138P with the first metallic conductive layer 145 therebetween. The first metallic conductive layer 145 may cover side surfaces of the second metallic conductive layer 146 facing the side surfaces of the cover insulating structure 138P.

Figure 14:
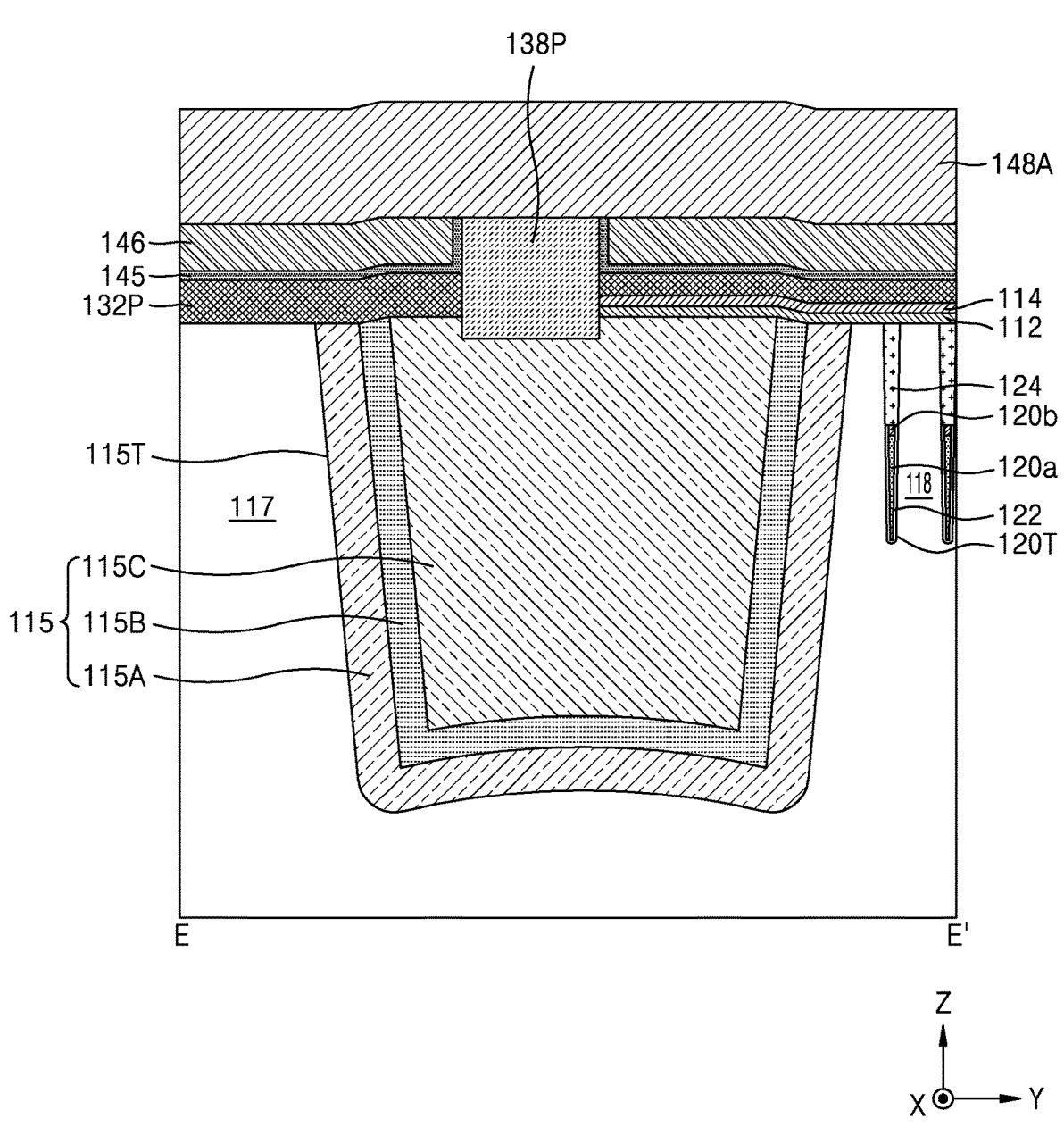

Referring to FIG. 14, a first insulating capping layer 148A covering the cover insulating structure 138P, the first metallic conductive layer 145, and the second metallic conductive layer 146 is formed. In some embodiments, the first insulating capping layer 148A may include the same material as the cover insulating structure 138P. For example, the first insulating capping layer 148A may include nitride.

Figure 15:
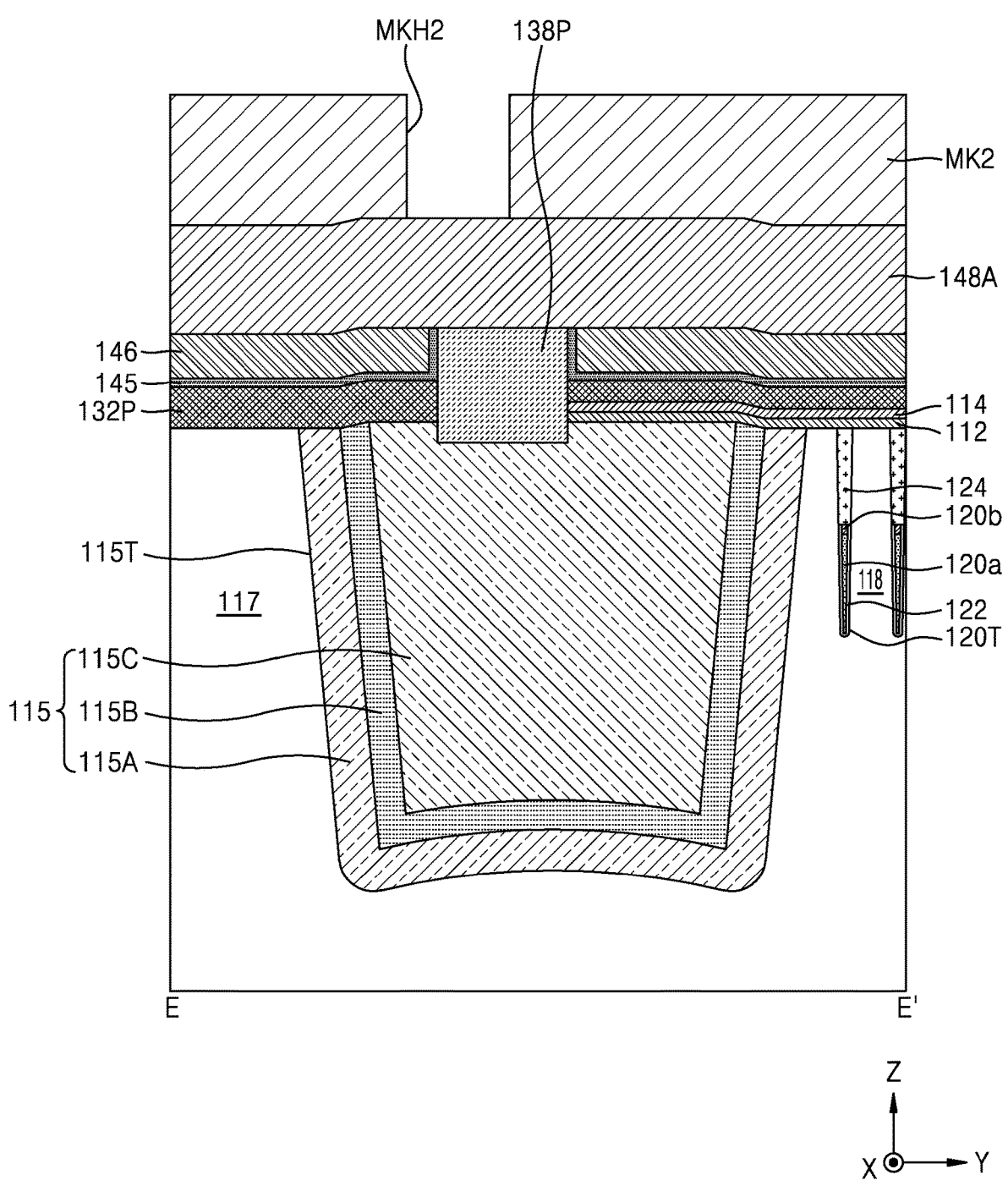

Referring to FIG. 15, a second mask pattern MK2 having a second mask opening MKH2 is formed on the first insulating capping layer 148A. For example, the second mask pattern MK2 may include photoresist or a hard mask layer.

The second mask opening MKH2 may be over (i.e., along the vertical direction Z) the logic device isolation layer 115. For example, the second mask opening MKH2 may vertically overlap a part of the cover insulating structure 138P. The cover insulating structure 138P of the second mask opening MKH2 may be farther from the plurality of active regions 118 than the cover insulating structure 138P. For example, the second mask opening MKH2 may not vertically overlap a part of the cover insulating structure 138P close to the plurality of active regions 118 and may vertically overlap a part of the cover insulating structure 138P remote from the plurality of active regions 118. The second mask opening MKH2 may vertically overlap a part of the logic device isolation layer 115 adjacent to one side surface of the cover insulating structure 138P opposite to the plurality of active regions 118 but not vertically overlapping the cover insulating structure 138P.

Figure 16:
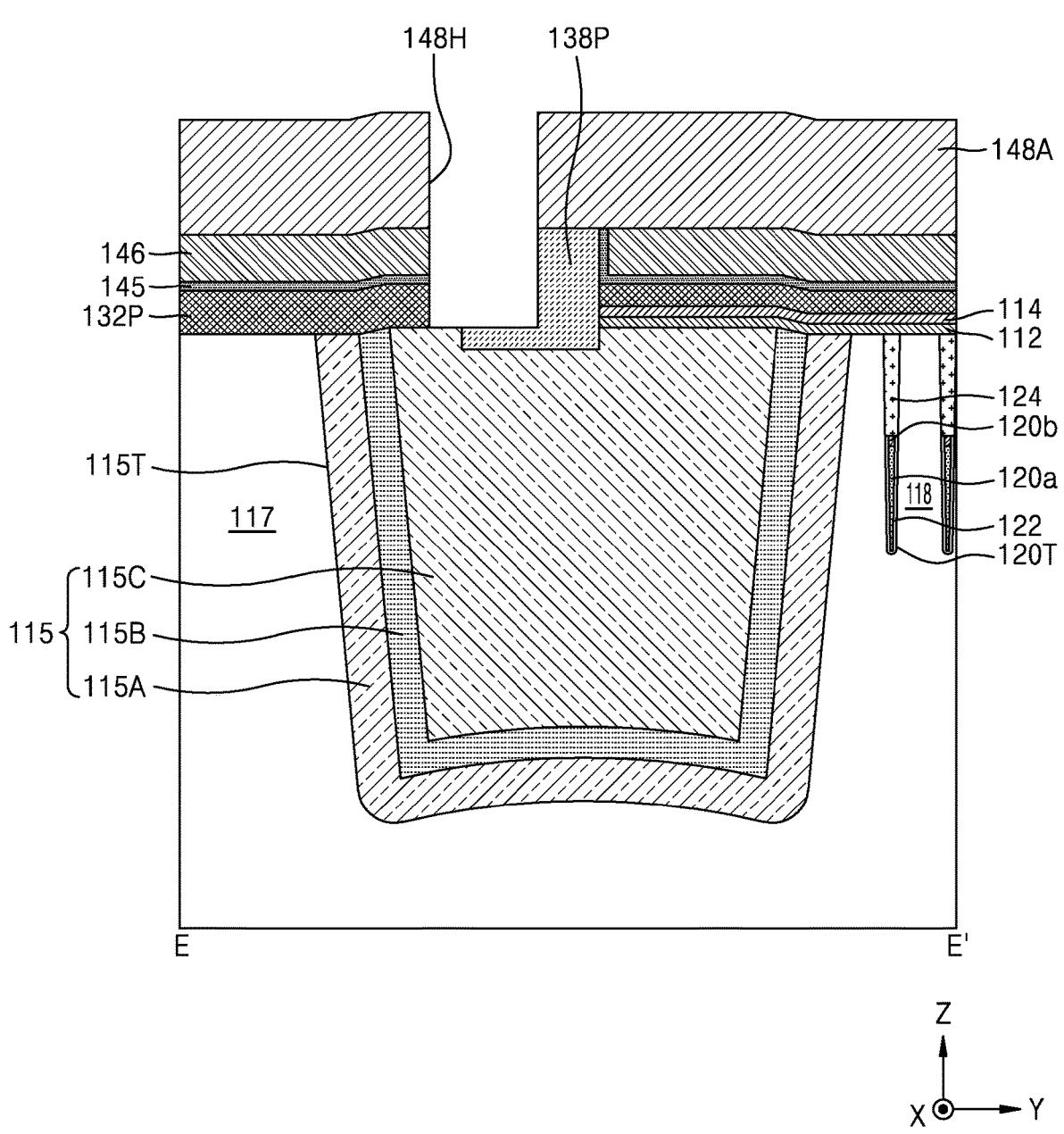
Figure 17A:
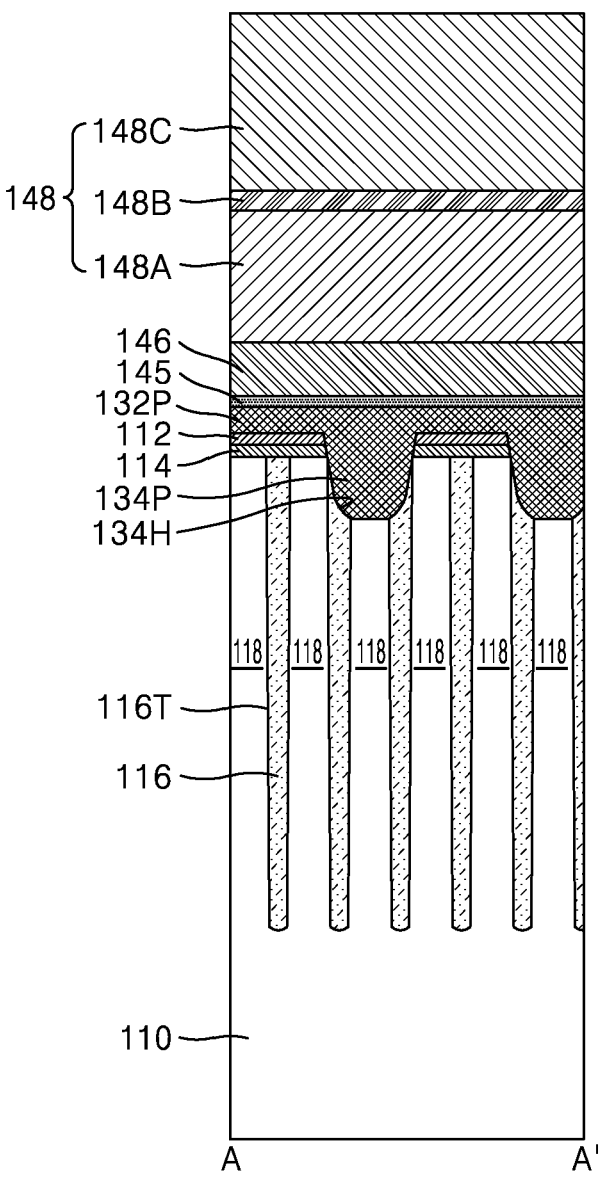
Figure 17A:
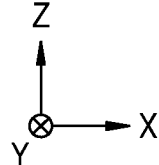
Figure 17B:
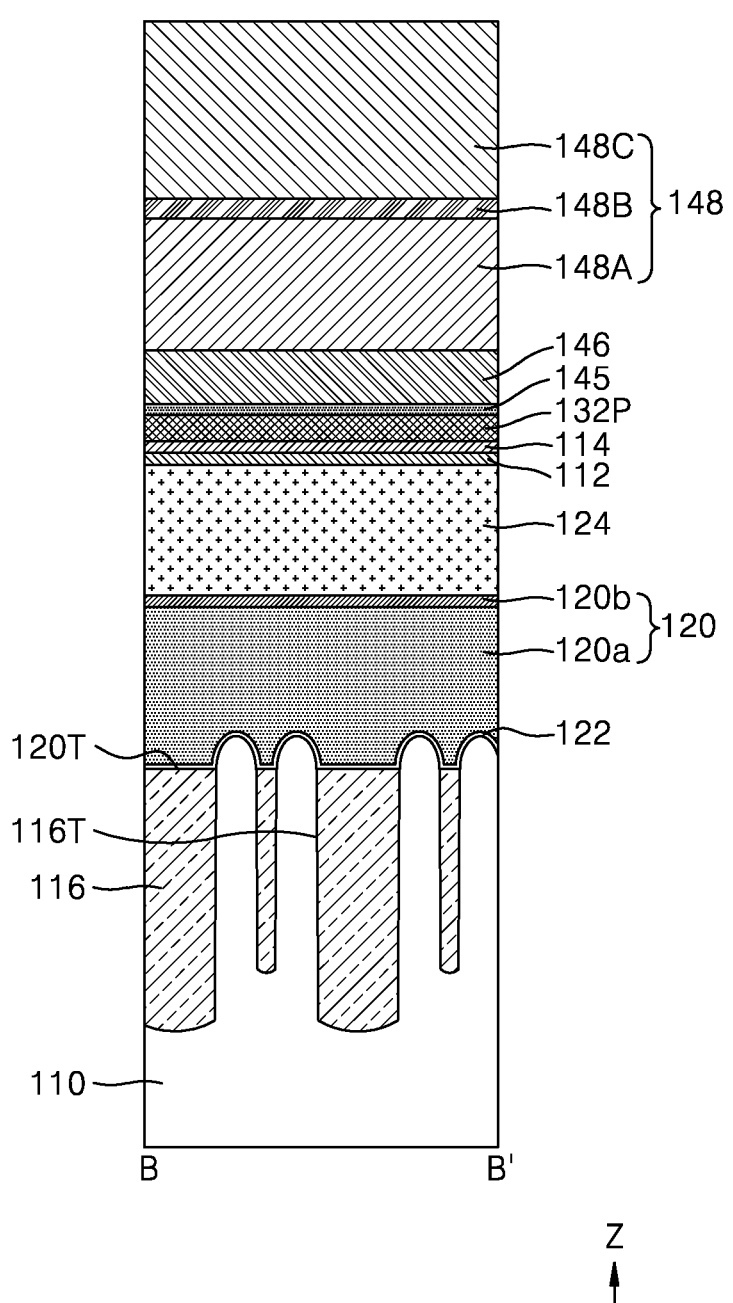
Figure 17C:
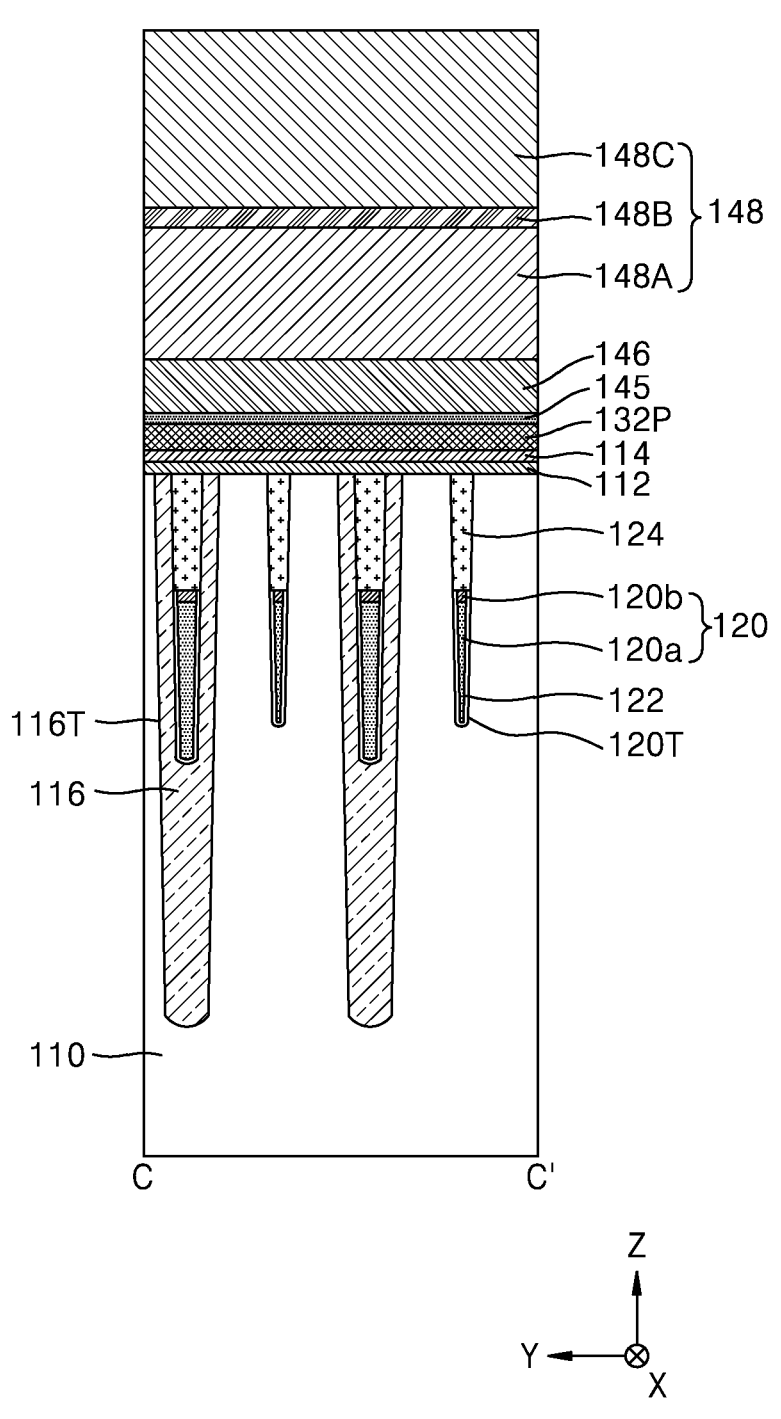
Figure 17D:
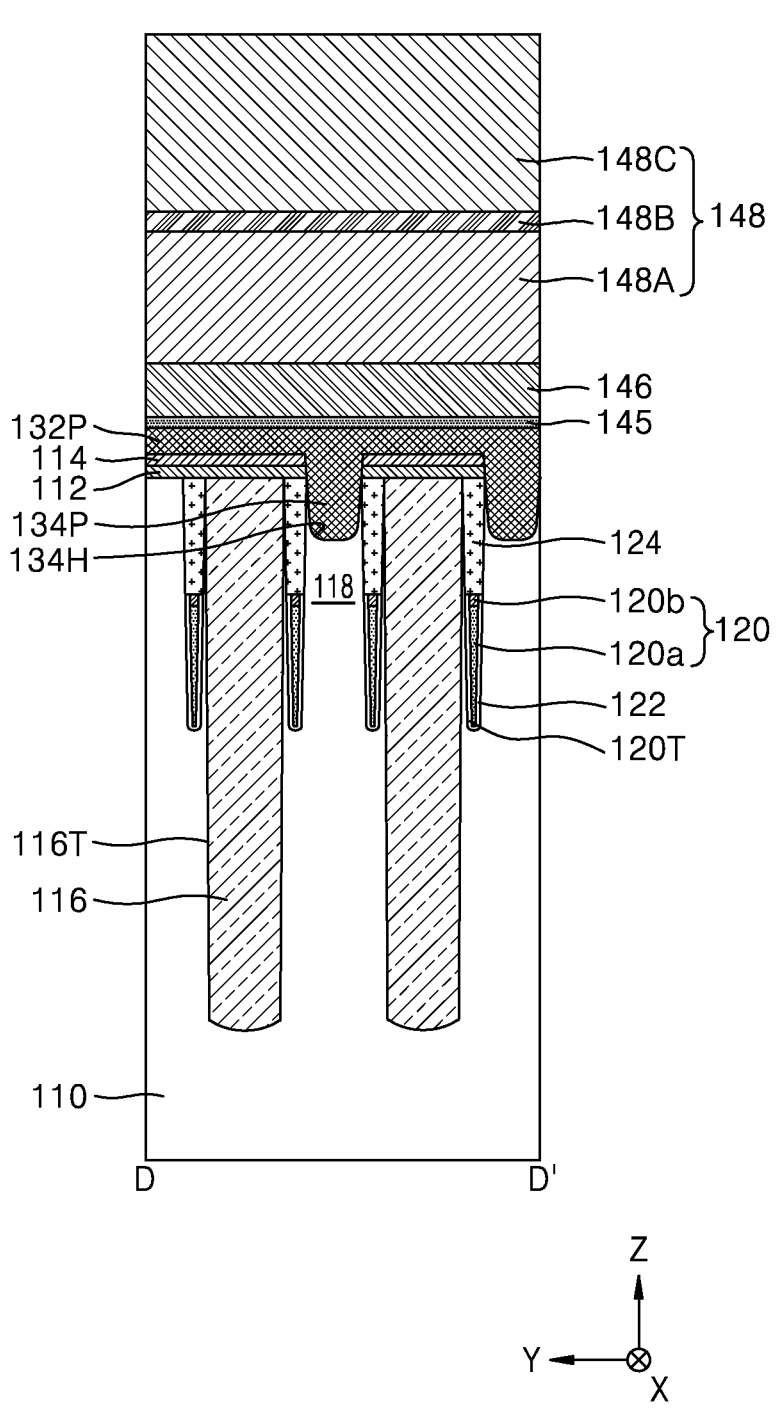
Figure 17E:
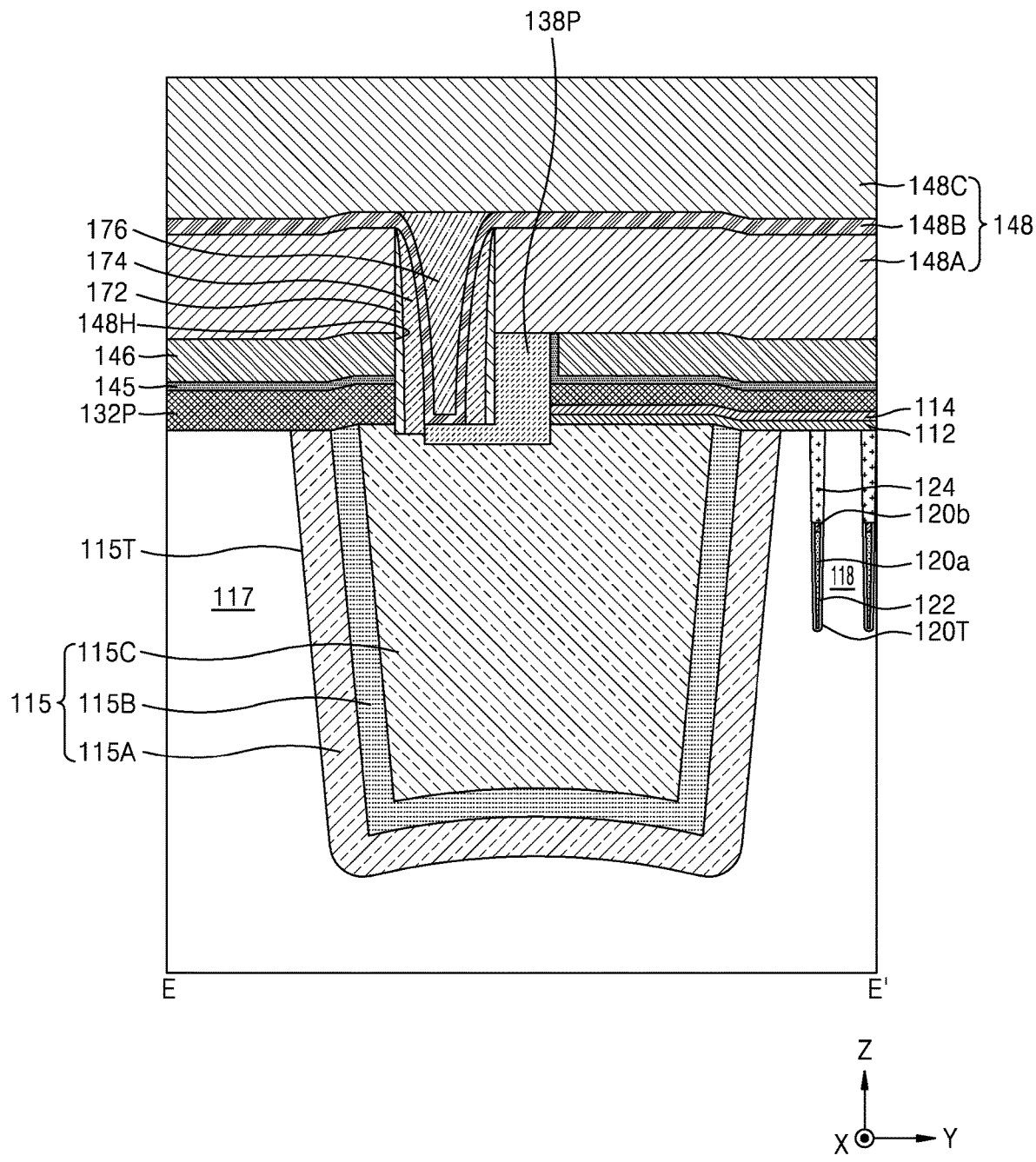
Figure 18A:
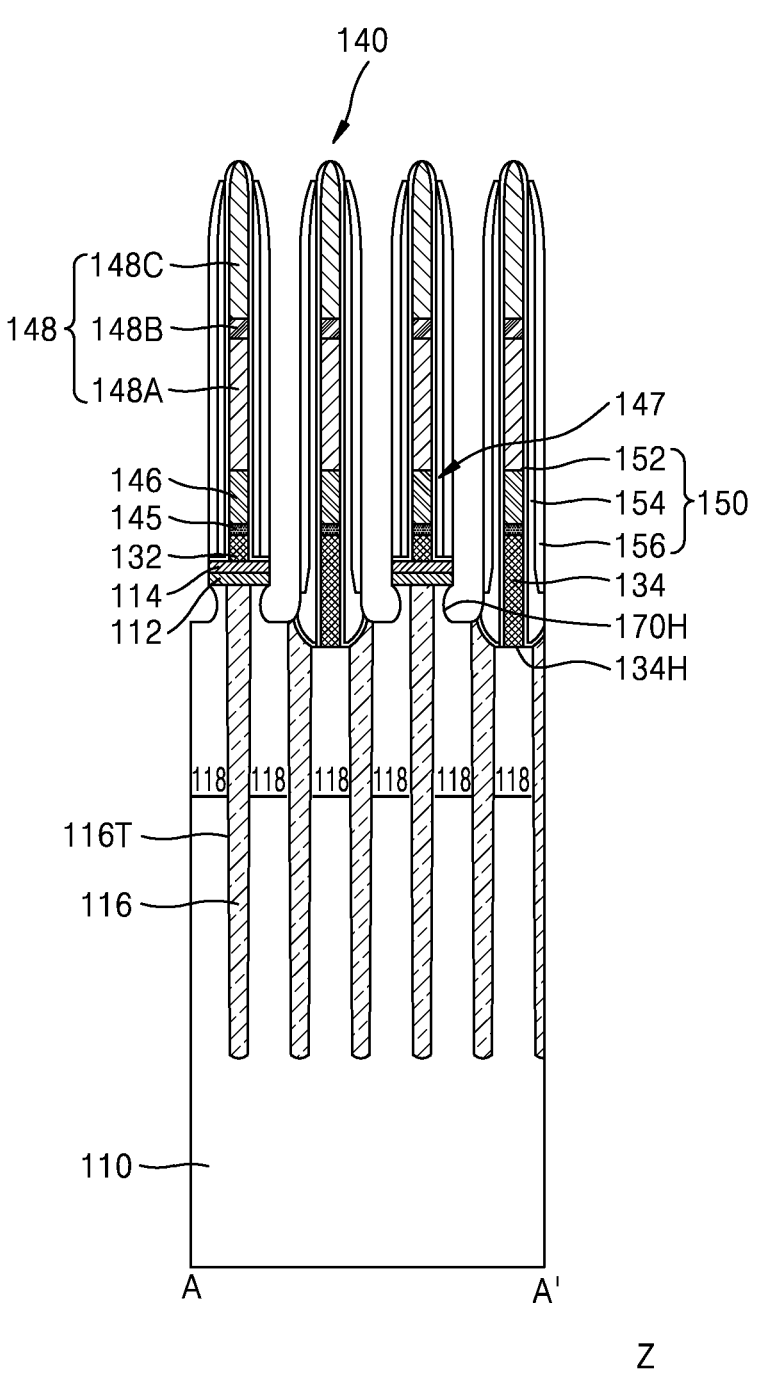
Figure 18A:
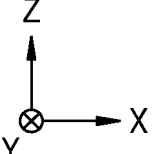
Figure 18B:
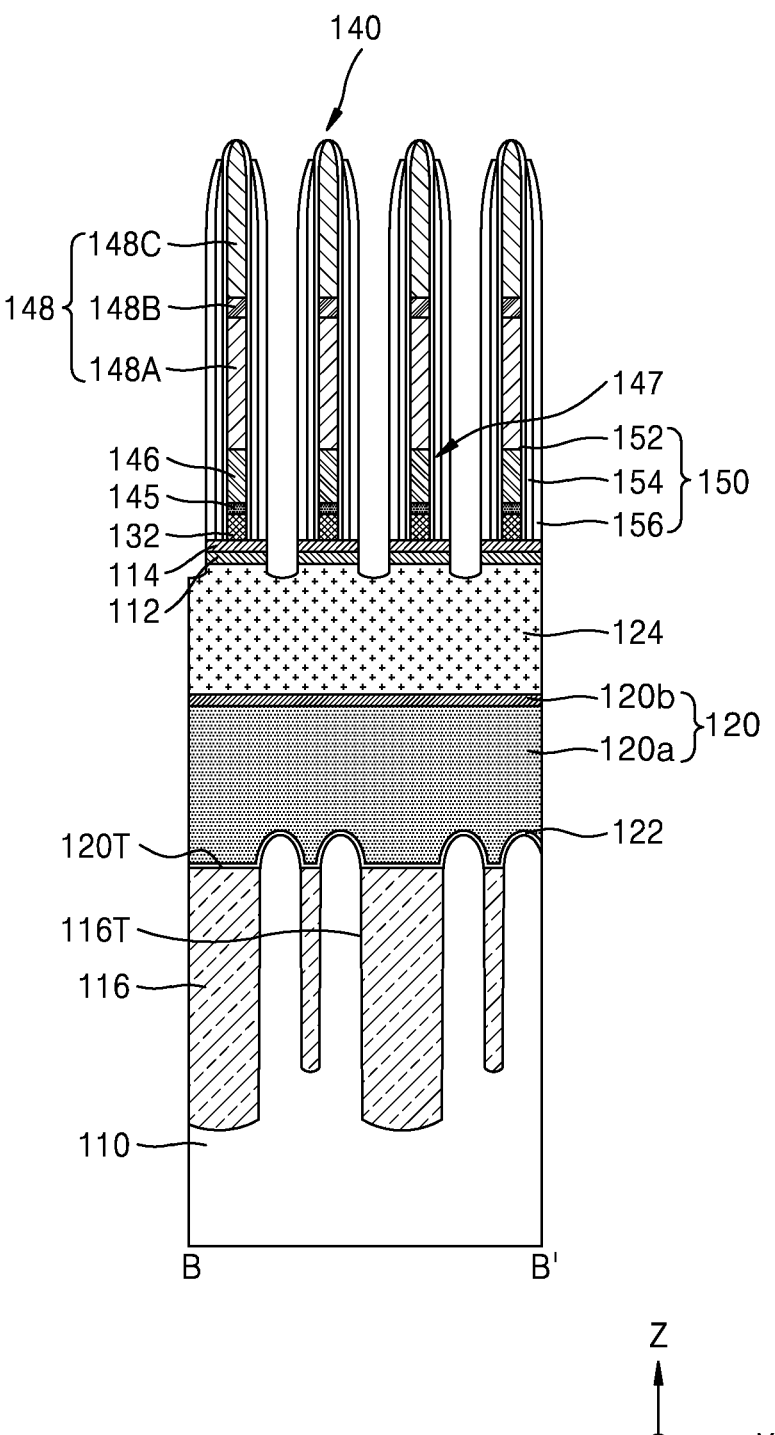
Figure 18C:
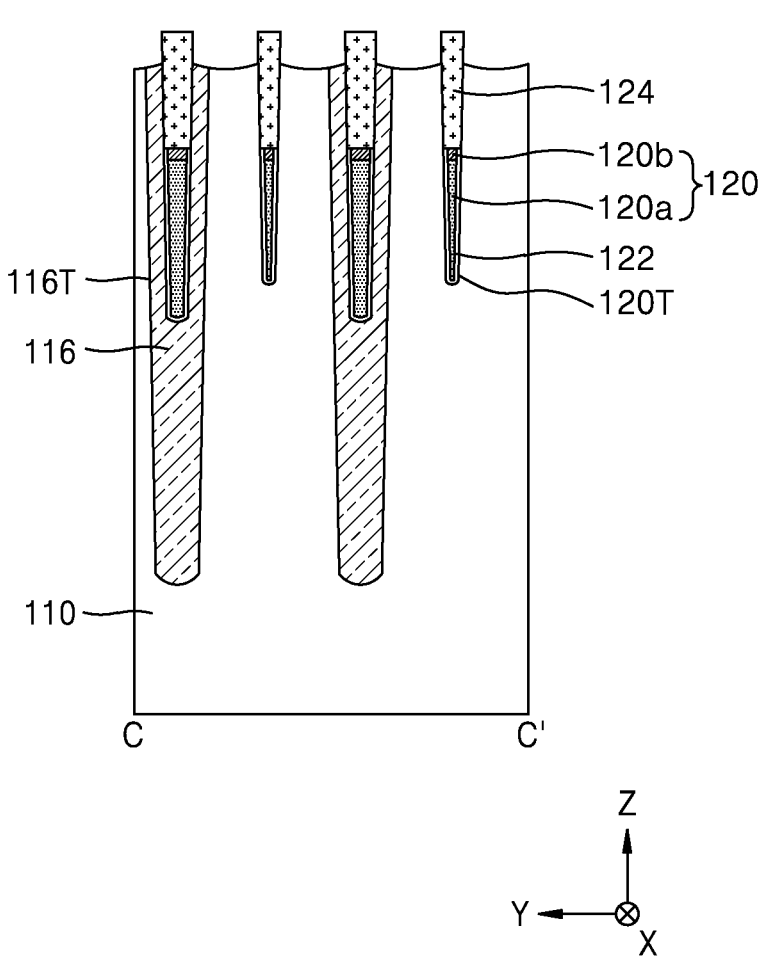
Figure 18D:
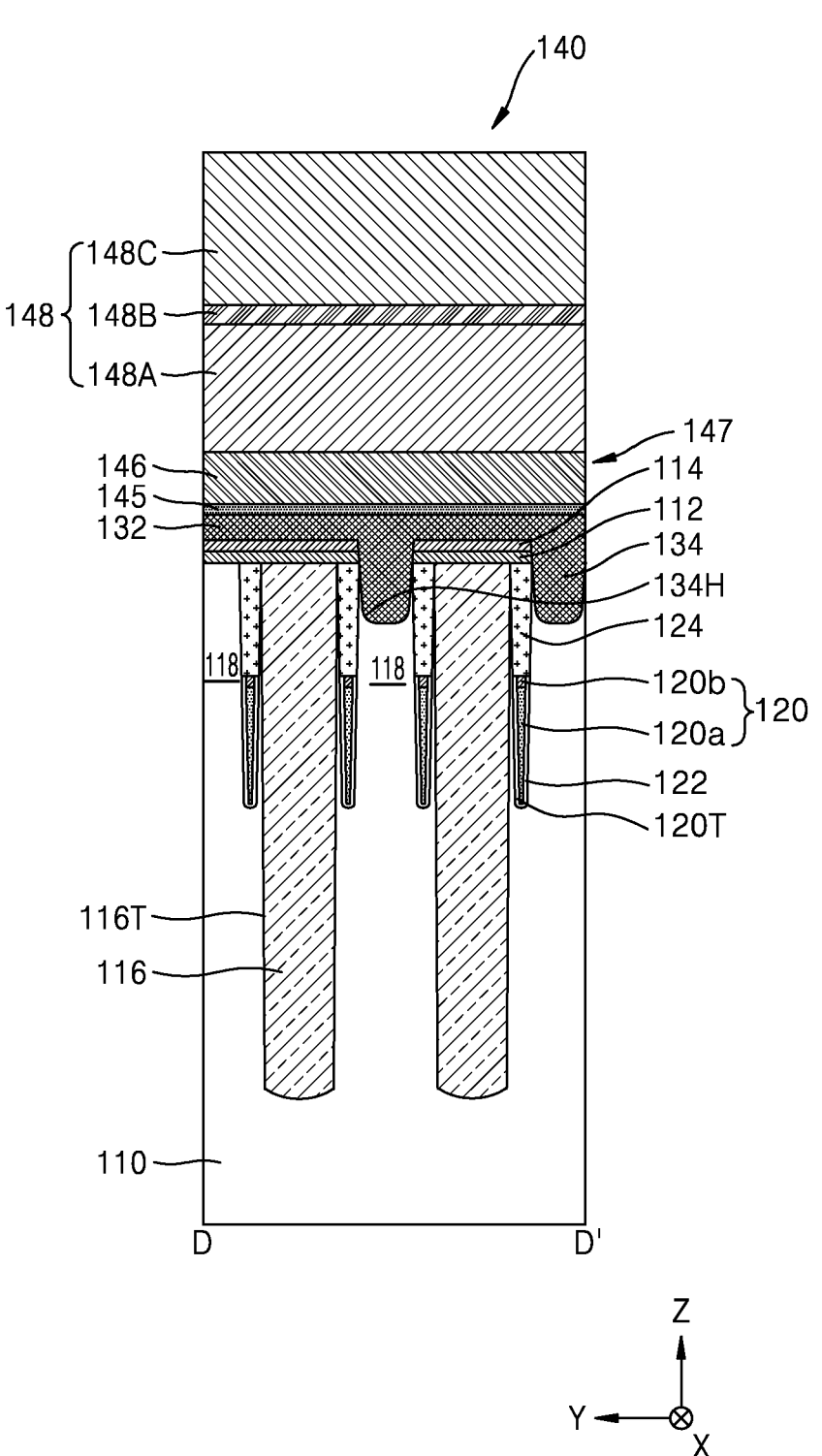
Figure 18E:
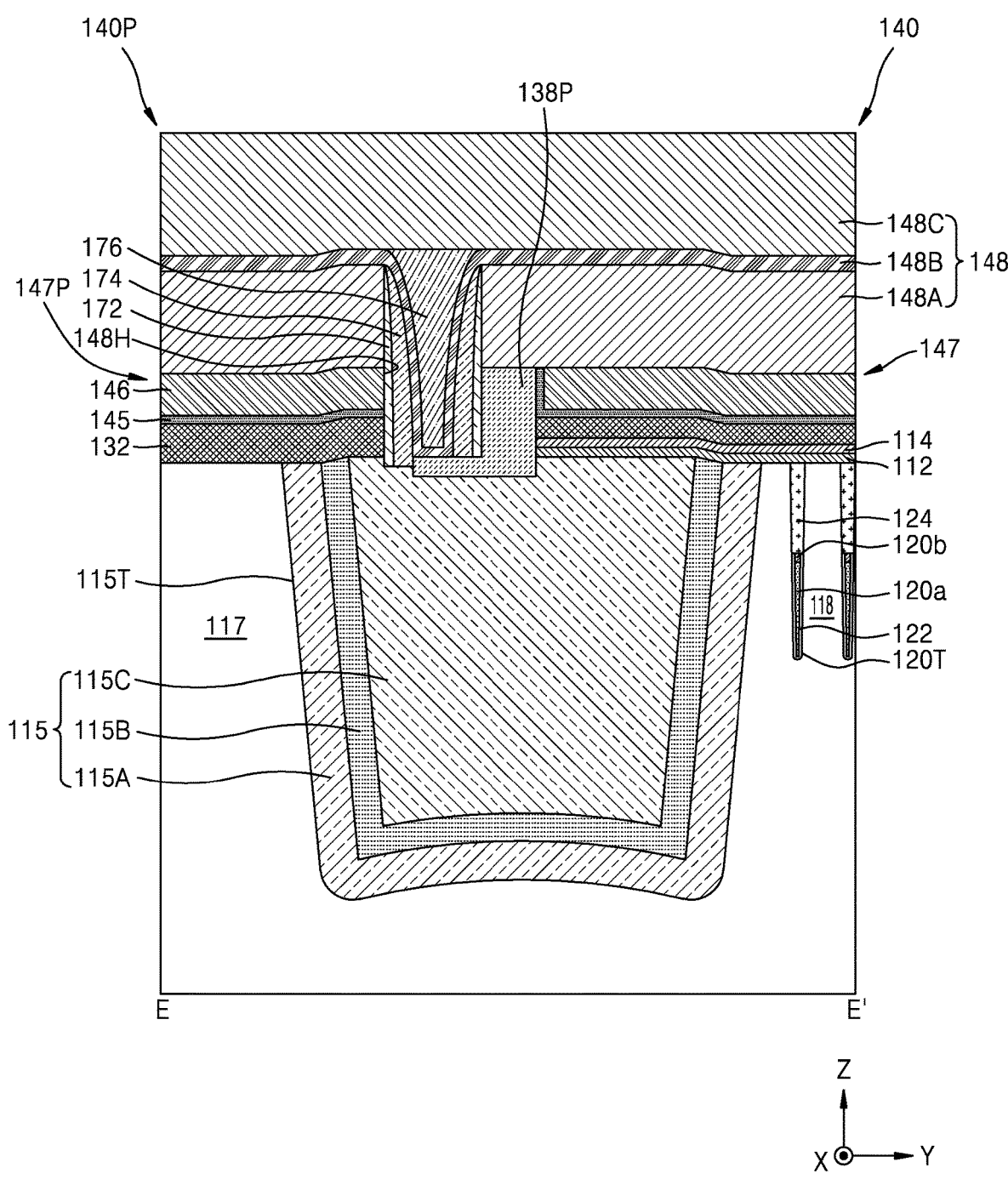
Figure 19A:
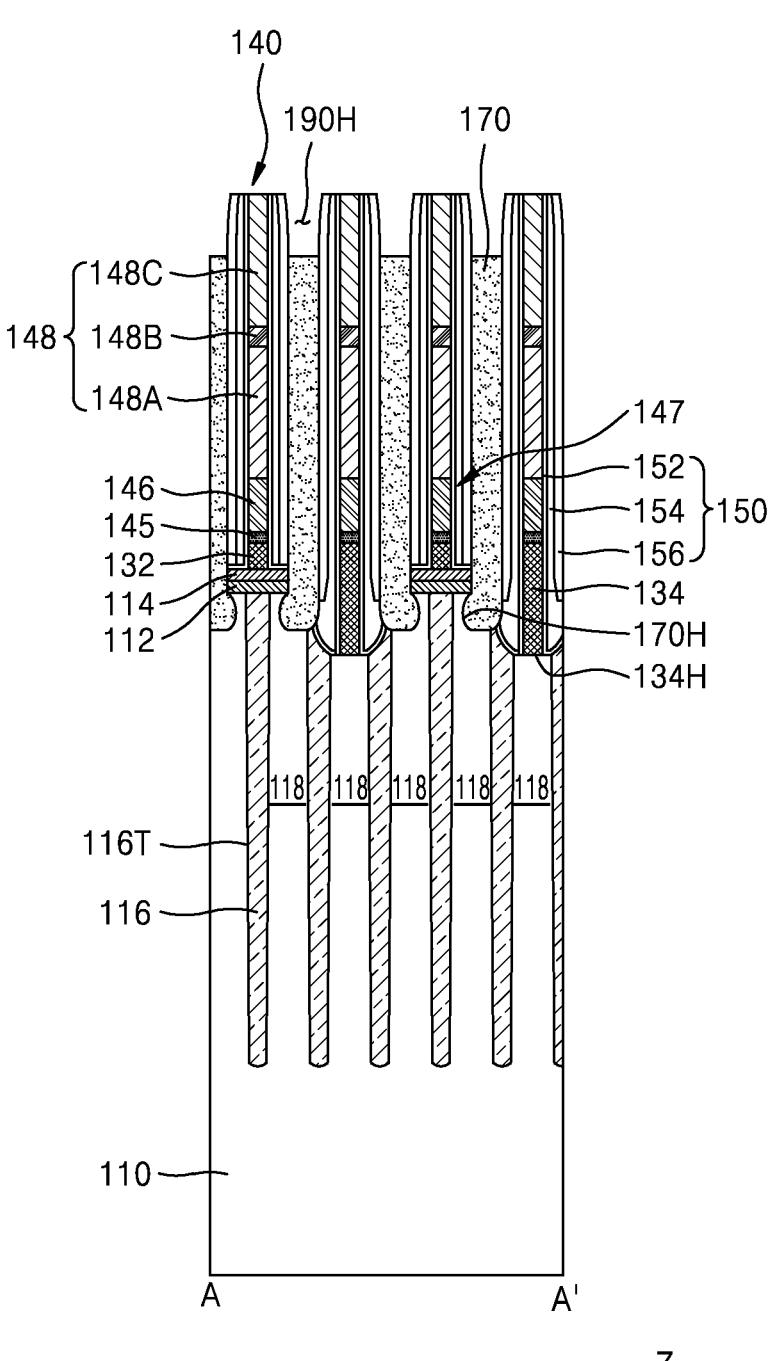
Figure 19A:
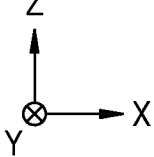
Figure 19B:
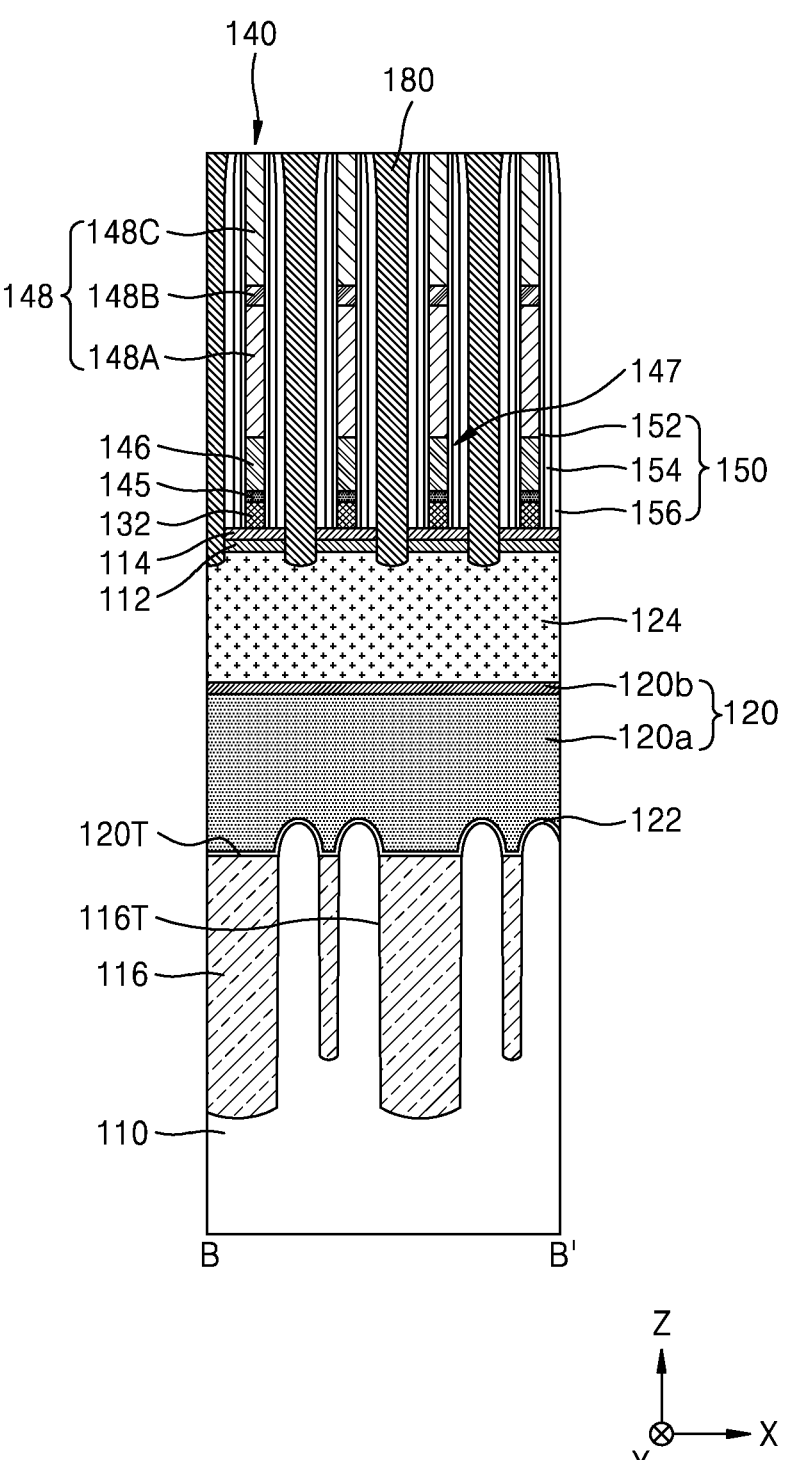
Figure 19C:
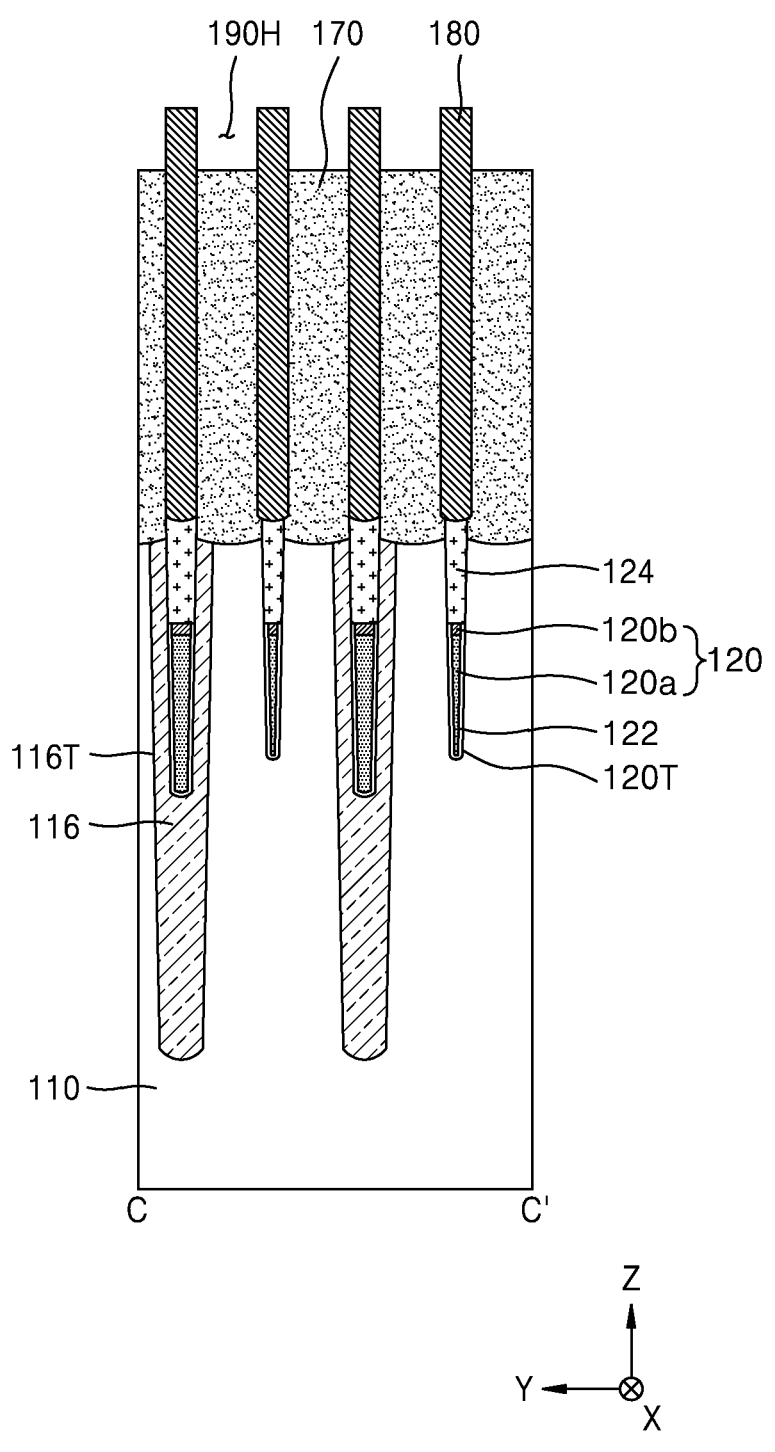
Figure 19D:
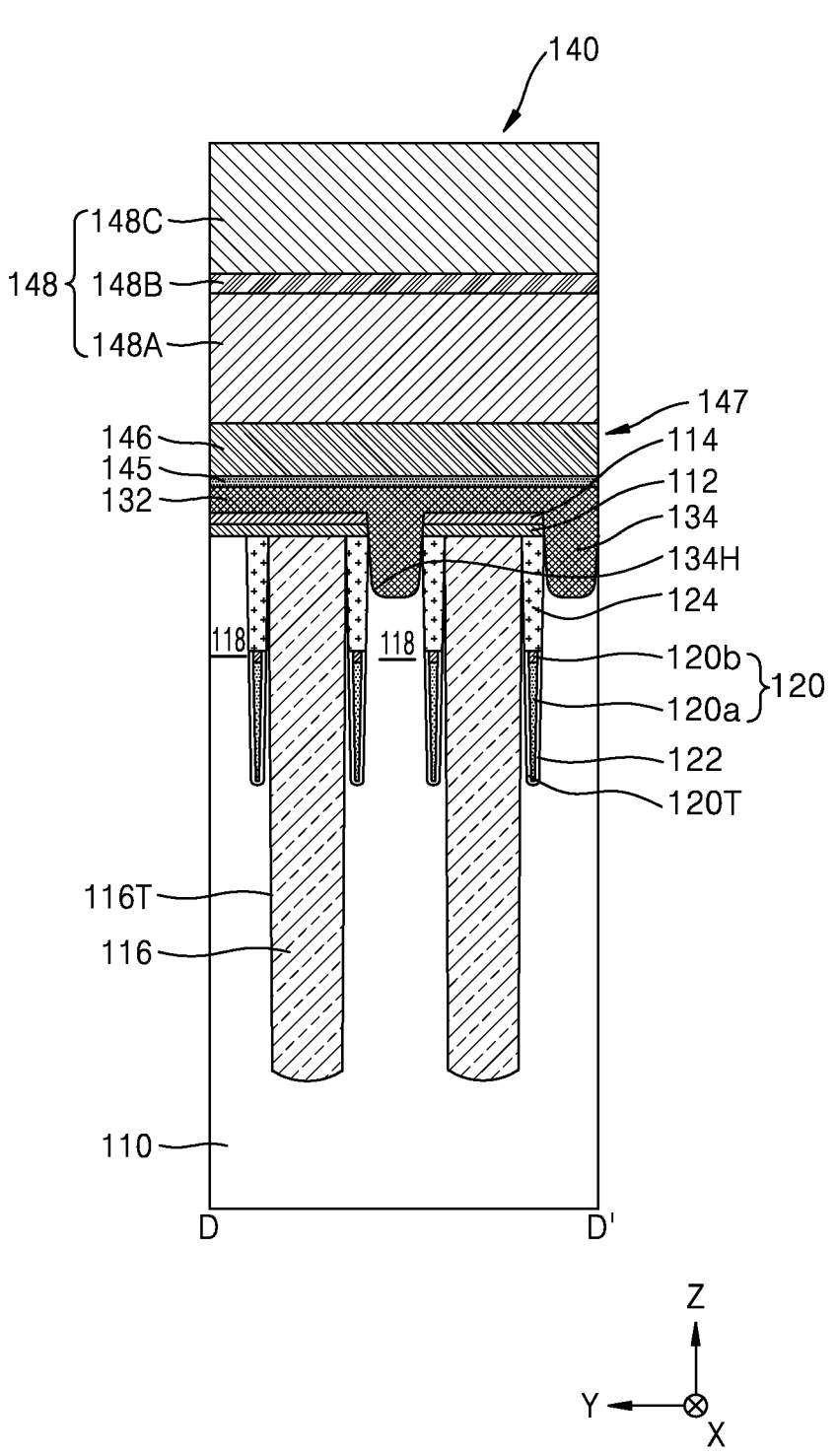
Figure 19E:
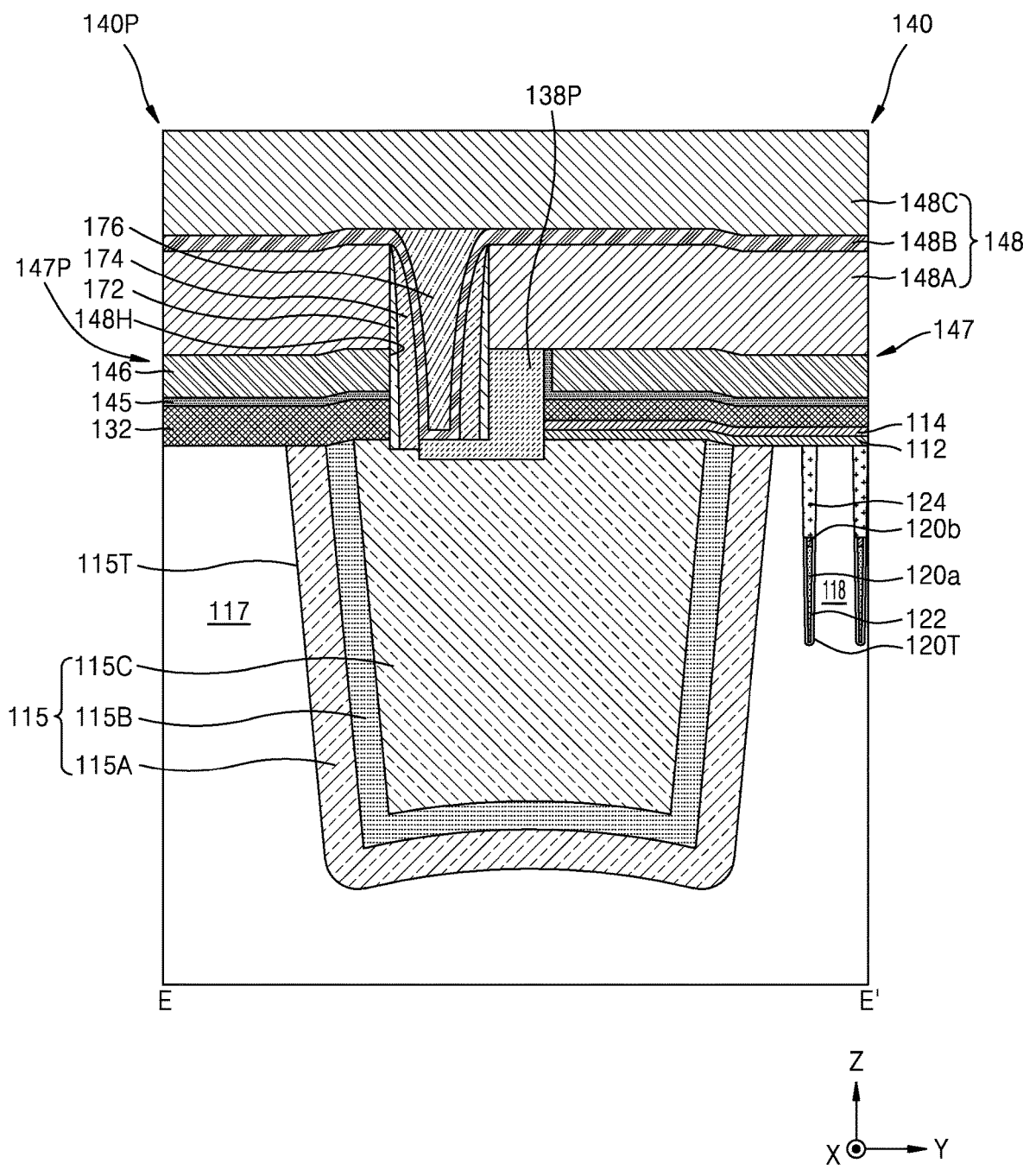

Referring to FIGS. 15 and 16, a second separation opening 148H, through a bottom surface of which a part of the logic device isolation layer 115 and a part of the cover insulating structure 138P are exposed, is formed by removing parts of the first insulating capping layer 148A, the second metallic conductive layer 146, the first metallic conductive layer 145, the cover insulating structure 138P, and the conductive semiconductor layer 132P by using the second mask pattern MK2 as an etching mask. A bottom surface of the second separation opening 148H may be at a level higher than the bottom surface of the cover insulating structure 138P. The second separation opening 148H may be over (i.e., along the vertical direction Z) a part of the logic device isolation layer 115 and a part of the cover insulating structure 138P. The bottom surface of the second separation opening 148H may be partially formed by the logic device isolation layer 115 and the cover insulating structure 138P.

After the second separation opening 148H is formed, the second mask pattern MK2 may be removed.

The first metallic conductive layer 145 may cover a side surface of the second metallic conductive layer 146 extending from the memory cell region CR (refer to FIG. 1) onto the logic device isolation layer 115 and may not cover a side surface of the second metallic conductive layer 146 extending from the peripheral circuit region PR (refer to FIG. 1) onto the logic device isolation layer 115. The second metallic conductive layer 146 extending from the memory cell region CR (refer to FIG. 1) onto the logic device isolation layer 115 may be a part of each of the plurality of bit lines BL (refer to FIG. 1) and the second metallic conductive layer 146 extending from the peripheral circuit region PR (refer to FIG. 1) onto the logic device isolation layer 115 may be a part of each of the plurality of gate line patterns GLP (refer to FIG. 1).

Referring to FIGS. 17A to 17E, a first end spacer 172 and a second end spacer 174 are formed to sequentially cover side surfaces of the second separation opening 148H, and a second insulating capping layer 148B is formed to cover the first insulating capping layer 148A and the second end spacer 174. For example, the first end spacer 172 may include nitride, and the second end spacer 174 may include oxide. For example, the second insulating capping layer 148B may include nitride. The second end spacer 174 may be thicker than the first end spacer 172. The second insulating capping layer 148B may be thinner than the second end spacer 174. In some embodiments, the second insulating capping layer 148B may conformally cover parts of a top surface of the first insulating capping layer 148A, a surface of the second end spacer 174 opposite to a side surface of the second separation opening 148H, a surface of the cover insulating structure 138P exposed at a bottom surface of the second separation opening 148H, and a top surface of the logic device isolation layer 115 exposed at the bottom surface of the second separation opening 148H.

A logic filling layer 176 filling the second separation opening 148H is formed on the second insulating capping layer 148B. For example, the logic filling layer 176 may include oxide. In some embodiments, the uppermost end of the second insulating capping layer 148B and the uppermost end of the logic filling layer 176 may be at the same level. For example, after forming a preliminary filling material layer filling the second separation opening 148H and covering the second insulating capping layer 148B, an upper part of the preliminary filling material layer is removed to expose the second insulating capping layer 148B so that the logic filling layer 176 is formed.

A third insulating capping layer 148C may be formed on the logic filling layer 176 and the second insulating capping layer 148B. For example, the third insulating capping layer 148C may include nitride. A stacked structure including the first insulating capping layer 148A, the second insulating capping layer 148B, and the third insulating capping layer 148C may be referred to as an insulating capping structure 148. The second insulating capping layer 148B may be thinner than each of the first insulating capping layer 148A and the third insulating capping layer 148C.

Referring to FIGS. 17A to 18E and 18A to 18E, the first metallic conductive layer 145, the second metallic conductive layer 146, and the insulating capping structure 148 are etched to form a plurality of bit lines 147 in the form of lines, which each have a stacked structure including the first metallic conductive layer 145 and the second metallic conductive layer 146, and a plurality of insulating capping structures 148 in the form of lines. For example, the first metallic conductive layer 145, the second metallic conductive layer 146, and the insulating capping structure 148 are etched by using a mask pattern covering the insulating capping structure 148 as an etching mask. After the plurality of bit lines 147 is formed, the mask pattern may be removed. The plurality of bit lines 147 and the plurality of insulating capping structures 148 covering their corresponding bit lines 147 may respectively constitute bit line structures 140. The plurality of bit line structures 140 each including a bit line 147 and an insulating capping structure 148 may extend parallel to one another in the second horizontal direction (the Y direction) parallel to the main surface of the substrate 110.

The plurality of bit lines 147 may respectively constitute the plurality of bit lines BL illustrated in FIG. 1. In some embodiments, in a process of forming the plurality of bit line structures 140, the conductive semiconductor layer 132P may be etched together with the plurality of bit line structures 140 to form a plurality of conductive semiconductor patterns 132 between the first and second insulating layer patterns 112 and 114 and the first metallic conductive layer 145.

In an etching process for forming the plurality of bit line structures 140, the cover insulating structure 138P may also be etched and separated into a plurality of pieces. The plurality of bit line structures 140 may include the plurality of cover insulating structures 138P. The cover insulating structure 138P may cover a side surface of an end of the bit line 147, and may form a line shape with the bit line 147 and the insulating capping structure 148 as a part of the bit line structure 140. For example, the bit line structure 140 may include the first insulating capping layer 148A in the form of a line, a part of the second insulating capping layer 148B and a part of the third insulating capping layer 148C on the first insulating capping layer 148A, the bit line 147 under the first insulating capping layer 148A, and the cover insulating structure 138P.

The bit line structure 140 may extend along the plurality of active regions 118 and the device isolation layer 116. In some embodiments, the bit line structure 140 may extend onto the logic device isolation layer 115. For example, the end of the bit line structure 140 may be positioned on the logic device isolation layer 115.

In an etching process for forming the plurality of bit line structures 140, a portion of the direct contact conductive layer 134P, which does not vertically overlap the bit line 147, may be removed by an etching process to form a plurality of direct contact conductive patterns 134. In this case, the first and second insulating layer patterns 112 and 114 may function as an etching stop layer in an etching process of forming a plurality of bit lines 147 and a plurality of direct contact conductive patterns 134. The plurality of direct contact conductive patterns 134 may respectively constitute the plurality of direct contacts DC illustrated in FIG. 1. The plurality of bit lines 147 may be electrically connected to the plurality of active regions 118 through the plurality of direct contact conductive patterns 134.

A plurality of insulating spacer structures 150 may cover side walls of the plurality of bit line structures 140. Each of the plurality of insulating spacer structures 150 may include a first insulating spacer 152, a second insulating spacer 154, and a third insulating spacer 156. The second insulating spacer 154 may include a material with a lower dielectric constant than the first insulating spacer 152 and the third insulating spacer 156. In some embodiments, the first insulating spacer 152 and the third insulating spacer 156 may include nitride, and the second insulating spacer 154 may include oxide. In some embodiments, the first insulating spacer 152 and the third insulating spacer 156 may include nitride, and the second insulating spacer 154 may include a material having etch selectivity with respect to the first insulating spacer 152 and the third insulating spacer 156. For example, when the first insulating spacer 152 and the third insulating spacer 156 include nitride, the second insulating spacer 154 may include oxide, and may be removed in a subsequent process to become an air spacer.

A plurality of buried contact holes 170H may be formed among the plurality of bit lines 147. An internal space of each of the plurality of buried contact holes 170H may be limited by the insulating spacer structure 150 covering side walls of two adjacent bit lines 147 between the two adjacent bit lines 147 among the plurality of bit lines 147 and the active region 118.

The plurality of buried contact holes 170H may be formed by removing parts of the first and second insulating layer patterns 112 and 114 and the plurality of active regions 118 by using the plurality of insulating capping structures 148 and the plurality of insulating spacer structures 150 covering side walls of the plurality of bit line structures 140 as etching masks. In some embodiments, the plurality of buried contact holes 170H may be formed by performing an anisotropic etching process of removing parts of the first and second insulating layer patterns 112 and 114 and the plurality of active regions 118 by using the plurality of insulating capping structures 148 and the plurality of insulating spacer structures 150 covering side walls of the plurality of bit line structures 140 as etching masks, and performing an isotropic etching process of further removing other parts of the plurality of active regions 118 so that the spaces limited by the plurality of active regions 118 expand.

A plurality of gate line structures 140P may be formed on the logic active region 117. The gate line structure 140P may include a gate line 147P and an insulating capping structure 148 covering the gate line 147P. The gate line structure 140P may include a first insulating capping layer 148A in the form of a line, a part of the second insulating capping layer 148B and a part of the third insulating capping layer 148C on the first insulating capping layer 148A, as well as the gate line 147P under the first insulating capping layer 148A.

The plurality of gate lines 147P included in the plurality of gate line structures 140P may be formed together with the plurality of bit lines 147. That is, the gate line 147P may have a stacked structure including the first metallic conductive layer 145 and the second metallic conductive layer 146. The first metallic conductive layer 145 and the second metallic conductive layer 146 included in the bit line 147 may be referred to as a first bit line conductive layer and a second bit line conductive layer, and the first metallic conductive layer 145 and the second metallic conductive layer 146 included in the gate line 147P may be referred to as a first gate line conductive layer and a second gate line conductive layer. Therefore, the first bit line conductive layer and the first gate line conductive layer may be formed of the same material, and the second bit line conductive layer and the second gate line conductive layer may be formed of the same material.

In some embodiments, the gate line structure 140P may further include a conductive semiconductor pattern 132 arranged between a gate insulating layer pattern 142 and the first metallic conductive layer 145. The plurality of gate lines 147P may constitute the plurality of gate line patterns GLP illustrated in FIG. 1.

The first end spacer 172 and the second end spacer 174 may sequentially cover a side surface of an end of the bit line structure 140 and a side surface of an end of the gate line structure 140P. The second insulating capping layer 148B may cover the first insulating capping layer 148A and the second end spacer 174.

Each of the plurality of bit line structures 140 extends along the active region 118 to the logic device isolation layer 115 and may have an end on the logic device isolation layer 115. Each of the plurality of gate line structures 140P extends along the logic active region 117 to the logic device isolation layer 115 and may have an end on the logic device isolation layer 115.

An end of each of the plurality of bit lines 147 and an end of each of the plurality of gate lines 147P may face opposite side surfaces of the cover insulating structure 138P.

Each of the end of the bit line 147, the end of the gate line structure 140P, the end of the gate line 147P, the end of the first metallic conductive layer 145, and the end of the second metallic conductive layer 146 may face the cover insulating structure 138P of each of the bit line 147, the gate line structure 140P, the gate line 147P, the first metallic conductive layer 145, and the second metallic conductive layer 146.

A side surface of an end of the second metallic conductive layer 146 included in the bit line structure 140 or the bit line 147 may be covered with the first metallic conductive layer 145. The uppermost end of the first metallic conductive layer 145 and the uppermost end of the second metallic conductive layer 146 included in the bit line structure 140 or the bit line 147 may be at the same level. In the bit line structure 140 or the bit line 147, the first metallic conductive layer 145 may extend in the second horizontal direction (the Y direction) to cover a bottom surface of the second metallic conductive layer 146 and may extend in the vertical direction (the Z direction) between the cover insulating structure 138P and the second metallic conductive layer 146 to cover a side surface of an end of the second metallic conductive layer 146.

An extension length of the first metallic conductive layer 145 included in the bit line structure 140 or the bit line 147 may be greater than that of the second metallic conductive layer 146. For example, a side surface of an end of the first metallic conductive layer 145 included in the bit line structure 140 or the bit line 147 may extend further toward the cover insulating structure 138P than the side surface of the end of the second metallic conductive layer 146. That is, the end of the first metallic conductive layer 145 included in the bit line structure 140 or the bit line 147 may protrude from the side surface of the end of the second metallic conductive layer 146 toward the cover insulating structure 138P. For example, the side surface of the end of the first metallic conductive layer 145 included in the bit line structure 140 or the bit line 147 may be in contact with a side surface of the cover insulating structure 138P.

The cover insulating structure 138P may be between the bit line 147 and the first end spacer 172. The second metallic conductive layer 146 included in the bit line 147 may be spaced apart from the cover insulating structure 138P with the first metallic conductive layer 145 and the cover insulating structure 138P therebetween.

The side surface of the end of the second metallic conductive layer 146 included in the gate line structure 140P or the gate line 147P may not be covered with the first metallic conductive layer 145. The side surface of the end of the second metallic conductive layer 146 included in the gate line structure 140P or the gate line 147P may be covered with the first end spacer 172. The uppermost end of the first metallic conductive layer 145 included in the gate line structure 140P or the gate line 147P may be at a level lower than the uppermost end of the second metallic conductive layer 146, and the uppermost end of the second metallic conductive layer 146 may be at the same level as the uppermost end of the gate line 147P.

An extension length of the first metallic conductive layer 145 included in the gate line structure 140P or the gate line 147P may be substantially the same as that of the second metallic conductive layer 146. For example, the side surface of the end of the first metallic conductive layer 145 included in the gate line structure 140P or the gate line 147P may be aligned with the side surface of the end of the second metallic conductive layer 146 in the vertical direction.

Referring to FIGS. 19A to 19E, a plurality of buried contacts 170 and a plurality of insulating fences 180 are formed in spaces among a plurality of insulating spacer structures 150 covering side walls of the plurality of bit line structures 140. Along a pair of insulating spacer structures 150 facing each other among the plurality of insulating spacer structures 150 covering side walls of the plurality of bit line structures 140, that is, in the second horizontal direction (the Y direction), the plurality of buried contacts 170 and the plurality of insulating fences 180 may be alternately arranged. For example, the plurality of buried contacts 170 may include polysilicon. For example, the plurality of insulating fences 180 may include nitride.

In some embodiments, the plurality of buried contacts 170 may be arranged in a line in the first horizontal direction (the X direction) and the second horizontal direction (the Y direction). Each of the plurality of buried contacts 170 may extend from each of the plurality of active regions 118 in the vertical direction (the Z direction) perpendicular to the substrate 110. The plurality of buried contacts 170 may constitute the plurality of buried contacts BC illustrated in FIG. 1.

The plurality of buried contacts 170 may be arranged in the spaces defined by the plurality of insulating fences 180 and the plurality of insulating spacer structures 150 covering side walls of the plurality of bit line structures 140. The plurality of buried contacts 170 may fill lower parts of the spaces among the plurality of insulating spacer structures 150 covering side walls of each of the plurality of bit line structures 140.

Top surfaces of the plurality of buried contacts 170 may be at a level lower than top surfaces of the plurality of insulating capping structures 148. Top surfaces of the plurality of insulating fences 180 and the top surfaces of the plurality of insulating capping structures 148 may be at the same level in the vertical direction (the Z direction).

A plurality of landing pad holes 190H may be limited by the plurality of insulating spacer structures 150 and the plurality of insulating fences 180. The plurality of buried contacts 170 may be exposed through bottom surfaces of the plurality of landing pad holes 190H.

In a process of forming the plurality of buried contacts 170 and/or the plurality of insulating fences 180, upper parts of the plurality of insulating capping structures 148 and the plurality of insulating spacer structures 150 included in the plurality of bit line structures 140 and a plurality of gate line structures 140P may be removed so that levels of top surfaces of the plurality of bit line structures 140 and the plurality of gate line structures 140P may be lowered.

Referring to FIGS. 20A to 21B, after forming a landing pad material layer covering the plurality of bit line structures 140, the plurality of gate line structures 140P, the plurality of buried contacts 170, and the plurality of insulating fences 180, a part of the landing pad material layer is removed to form a plurality of recesses 190R and a plurality of landing pads 190 separated by the plurality of recesses 190R.

The plurality of landing pads 190 are arranged on the plurality of buried contacts 170 and may extend onto the plurality of bit line structures 140. In some embodiments, the plurality of landing pads 190 may extend onto the plurality of bit lines 147. The plurality of landing pads 190 may be arranged on the plurality of buried contacts 170 so that the plurality of buried contacts 170 may be electrically connected to the plurality of landing pads 190, respectively. The plurality of landing pads 190 may be connected to the plurality of active regions 118 through the plurality of buried contacts 170. The plurality of landing pads 190 may constitute the plurality of landing pads LP illustrated in FIG. 1.

Each of the plurality of buried contacts 170 may be arranged between two adjacent bit line structures 140, and each of the plurality of landing pads 190 may extend from between two adjacent bit line structures 140 onto each of the plurality of bit line structures 140 with each of the plurality of buried contacts 170 therebetween.

In some embodiments, each of the plurality of landing pads 190 may include a conductive barrier layer and a conductive pad material layer on the conductive barrier layer. For example, the conductive barrier layer may include a metal, conductive metal nitride, or a combination thereof. In some embodiments, the conductive barrier layer may have a Ti/TiN stacked structure. In some embodiments, the conductive pad material layer may include W.

In some embodiments, a metal silicide layer may be formed on the plurality of buried contacts 170 before forming the landing pad material layer. The metal silicide layer may be arranged between the plurality of buried contacts 170 and the plurality of landing pads 190. The metal silicide layer may include cobalt silicide ($CoSi_x$), nickel silicide ($NiSi_x$), or manganese silicide ($MnSi_x$). However, embodiments are not limited thereto.

A semiconductor memory device 1 including a plurality of capacitor structures 200 may be formed by sequentially forming a plurality of lower electrodes 210, a capacitor dielectric layer 220, and an upper electrode 230 on the plurality of landing pads 190. The plurality of lower electrodes 210 may be electrically connected to the plurality of landing pads 190, respectively. The capacitor dielectric layer 220 may conformally cover the plurality of lower electrodes 210. The upper electrode 230 may cover the capacitor dielectric layer 220. The upper electrode 230 may face the plurality of lower electrodes 210 with the capacitor dielectric layer 220 therebetween. The capacitor dielectric layer 220 and the upper electrode 230 may be integrally formed to cover the plurality of lower electrodes 210 in a certain region, for example, the memory cell region CR. The plurality of lower electrodes 210 may constitute the plurality of storage nodes SN illustrated in FIG. 1.

Each of the plurality of lower electrodes 210 may be in the form of a column that has a circular horizontal cross-section. However, embodiments are not limited thereto. In some embodiments, each of the plurality of lower electrodes 210 may be in the form of a cylinder with a closed bottom. In some embodiments, the plurality of lower electrodes 210 may be in the form of a honeycomb arranged in zigzags in the first horizontal direction (the X direction) or the second horizontal direction (the Y direction). In other embodiments, the plurality of lower electrodes 210 may be in a matrix arranged in a line in the first horizontal direction (the X direction) and the second horizontal direction (the Y direction). The plurality of lower electrodes 210 may include, for example, a metal such as Si, W, or Cu doped with impurities, or a conductive metal compound such as TiN. The semiconductor memory device 1 may further include at least one support pattern in contact with side walls of the plurality of lower electrodes 210.

The capacitor dielectric layer 220 may include, for example, TaO, TaAlO, TaON, AlO, AlSiO, HfO, HfSiO, ZrO, ZrSiO, TiO, TiAlO, BST((Ba,Sr)TiO), STO(SrTiO), BTO(BaTiO), PZT(Pb(Zr,Ti)O), (Pb,La)(Zr,Ti)O, Ba(Zr,Ti)O, Sr(Zr,Ti)O, or a combination thereof.

The upper electrode 230 may include, for example, doped silicon, Ru, RuO, Pt, PtO, Ir, IrO, SRO(SrRuO), BSRO((Ba, Sr)RuO), CRO(CaRuO), BaRuO, La(Sr,Co)O, Ti, TiN, W, WN, Ta, TaN, TiAlN, TiSiN, TaAlN, TaSiN, or a combination thereof.

Before forming the plurality of capacitor structures 200, a plurality of insulating structures 195 filling the plurality of recesses 190R may be formed. In some embodiments, each of the plurality of insulating structures 195 may include an interlayer insulating layer and an etching stop layer. For example, the interlayer insulating layer may include oxide, and the etching stop layer may include nitride. It is illustrated in FIGS. 20A and 20C that top surfaces of the plurality of insulating structures 195 and bottom surfaces of the plurality of lower electrodes 210 are at the same level. However, embodiments are not limited thereto. For example, the top surfaces of the plurality of insulating structures 195 may be at a level higher than the bottom surfaces of the plurality of lower electrodes 210 and the plurality of lower electrodes 210 may extend into the plurality of insulating structures 195 toward the substrate 110.

The semiconductor memory device 1 may further include a plurality of contact plugs GPG. Each of the plurality of contact plugs GPG may include a gate line contact plug GPG1 and a bit line contact plug GPG2. The gate line contact plug GPG1 may pass through the insulating capping structure 148 to be connected to a gate line 147P, and the bit line contact plug GPG2 may pass through the insulating capping structure 148 to be connected to the bit line 147. In some embodiments, the gate line contact plug GPG1 and the bit line contact plug GPG2 may pass through the insulating capping structure 148 and the second metallic conductive layer 146 to be connected to the first metallic conductive layer 145. In other embodiments, the gate line contact plug GPG1 and the bit line contact plug GPG2 may pass through the insulating capping structure 148 to be connected to the second metallic conductive layer 146. The gate line contact plug GPG1 may be adjacent to an end of the gate line structure 140P, and the bit line contact plug GPG2 may be adjacent to an end of the bit line structure 140.

A plurality of logic bit lines BLP may be arranged on the insulating capping structure 148. Each of the gate line contact plug GPG1 and the bit line contact plug GPG2 may be connected to at least one of the plurality of logic bit lines BLP. In some embodiments, the gate line contact plug GPG1 and the bit line contact plug GPG2 include the same material as the plurality of logic bit lines BLP and may be integrally formed. In some embodiments, the gate line contact plug GPG1 and the bit line contact plug GPG2 may include the same material as the plurality of landing pads 190.

Top surfaces of the bit line 147 and the gate line 147P, that is, a top surface of the second metallic conductive layer 146, may be at a first vertical level LV1, and a top surface of the insulating capping structure 148, that is, a top surface of the third insulating capping layer 148C, may be at a second vertical level LV2 higher than the first vertical level LV1. In some embodiments, the uppermost end of the first metallic conductive layer 145 may be at the first vertical level LV1.

A buried insulating layer 250 may be filled on the plurality of logic bit lines BLP corresponding to a level at which the plurality of capacitor structures 200 are positioned. The buried insulating layer 250 may include, for example, oxide or an ultra-low K (ULK) material. The oxide may include one selected from borophosphosilicate glass (BPSG), phosphosilicate glass (PSG), borosilicate glass (BSG), undoped silicon glass (USG), tetra ethyl orthosilicate (TEOS), and high density plasma (HDP). The ULK material may include, for example, one material selected from SiOC and SiCOH, and may have an ultra-low dielectric constant K of 2.2 to 2.4.

The semiconductor memory device 1 includes the substrate 110 having the plurality of active regions 118 and the plurality of logic active regions 117, the plurality of gate dielectric layers 122 sequentially formed in the plurality of word line trenches 120T crossing the plurality of active regions 118 in the substrate 110, the first and second insulating layer patterns 112 and 114 covering the plurality of word lines 120, the plurality of buried insulating layers 124, the device isolation layer 116, the plurality of active regions 118, and the plurality of buried insulating layers 124, the plurality of bit line structures 140 on the first and second insulating layer patterns 112 and 114, the plurality of insulating spacer structures 150 covering side walls of the plurality of bit line structures 140, the plurality of gate line structures 140P on the plurality of logic active regions 117, a plurality of gate insulating spacers 150P covering side walls of the plurality of gate line structures 140P, the plurality of buried contacts 170 filling lower parts of the spaces defined by the plurality of insulating fences 180 and the plurality of insulating spacer structures 150 and connected to the plurality of active regions 118, the plurality of landing pads 190 filling upper parts of the plurality of buried contacts 170 and extending to upper parts of the plurality of bit line structures 140, and the plurality of capacitor structures 200 including the plurality of lower electrodes 210 connected to the plurality of landing pads 190, the capacitor dielectric layer 220, and the upper electrode 230.

The plurality of insulating fences 180 may be spaced apart from one another along a pair of insulating spacer structures 150 facing each other among the plurality of insulating spacer structures 150 covering side walls of each of the plurality of bit line structures 140, that is, in the second horizontal direction (the Y direction). Each of the plurality of insulating fences 180 may extend from between each two of the plurality of buried contacts 170 to between each two of the plurality of landing pads 190.

Referring to FIGS. 20A, 21A, and 21B, under the plurality of first insulating capping layers 148A in the form of lines extending in the second horizontal direction (the Y direction), a plurality of stacked structures of the plurality of conductive semiconductor patterns 132, the first metallic conductive layer 145, and the second metallic conductive layer 146 may be interposed on the plurality of active regions 118 and the device isolation layer 116, and on the logic device isolation layer 115 spaced apart from ends of the plurality of first insulating capping layers 148A, and the plurality of cover insulating structures 138P may be interposed on the logic device isolation layer 115 adjacent to ends of the plurality of first insulating capping layers 148A.

If the bit line 147 is formed by performing etching by using the insulating capping structure 148 as an etching mask, when the bit line 147 is arranged at an end of the bit line structure 140, a part of the bit line 147 arranged at the end of the bit line structure 140 may be thinned or pierced.

The semiconductor memory device 1 according to embodiments may include the cover insulating structure 138P at an end of which the bit line structure 140 is arranged so that the cover insulating structure 138P may cover a side surface of an end of the bit line 147. Therefore, the cover insulating structure 138P may be arranged at an end of the bit line structure 140 in the form of a line. The cover insulating structure 138P may include the same material as a part of the insulating capping structure 148, for example, the first insulating capping layer 148A. Therefore, in an etching process for forming the plurality of bit line structures 140, it is possible to prevent the ends of the plurality of bit lines 147 from being thinned or pierced.

In the semiconductor memory device 1 according to embodiments, because the ends of the plurality of bit lines 147 are not thinned, it is possible to prevent electrical characteristics of the plurality of bit lines 147 from deteriorating, and because the ends of the plurality of bit lines 147 are not pierced, it is possible to prevent adjacent bit lines 147 from being connected to each other. Therefore, electrical reliability of the semiconductor memory device 1 may be secured.

Figure 22:
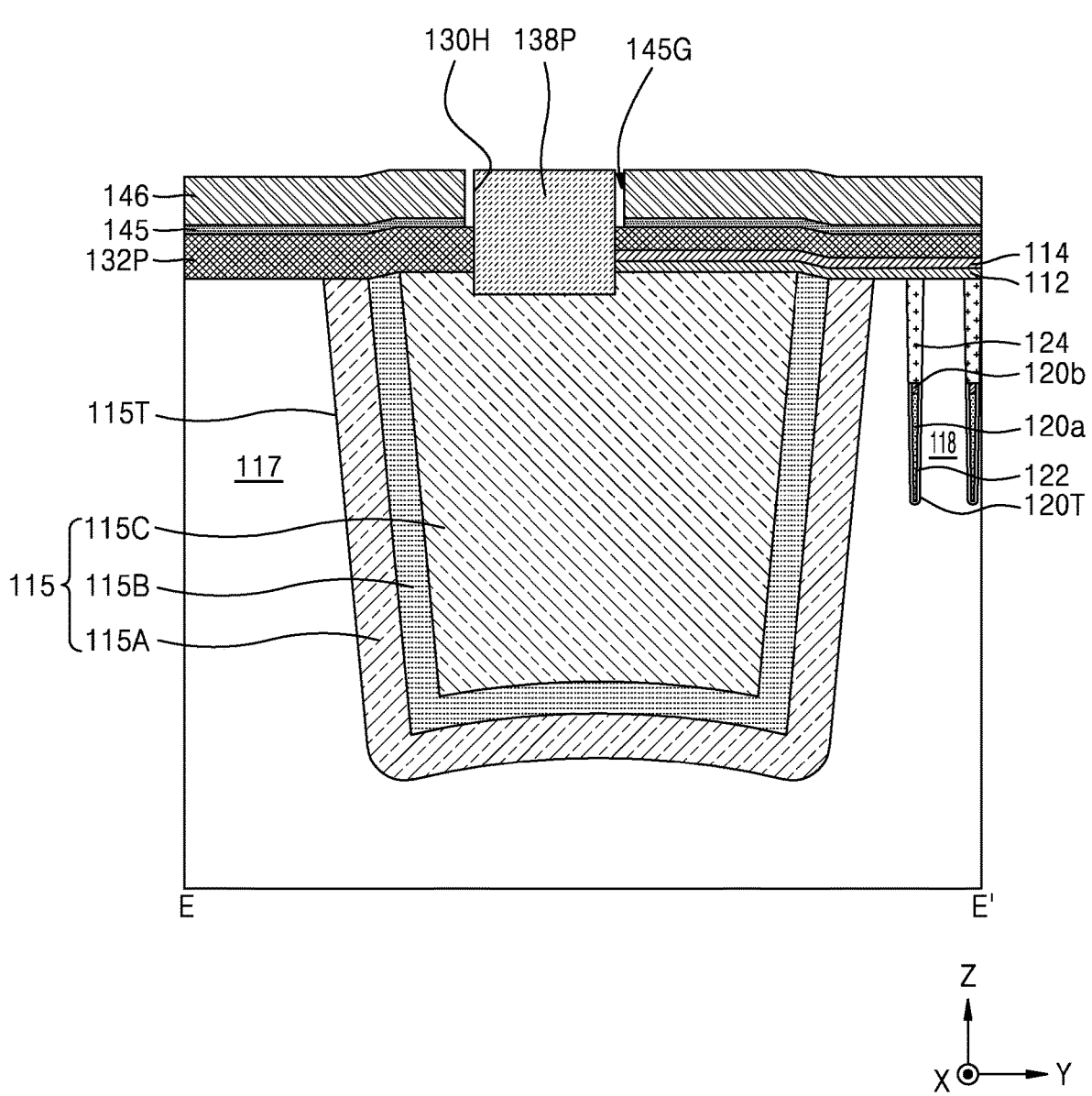
FIGS. 22 and 23 are cross-sectional views illustrating a method of manufacturing a semiconductor memory device, according to an embodiment.
Figure 23:
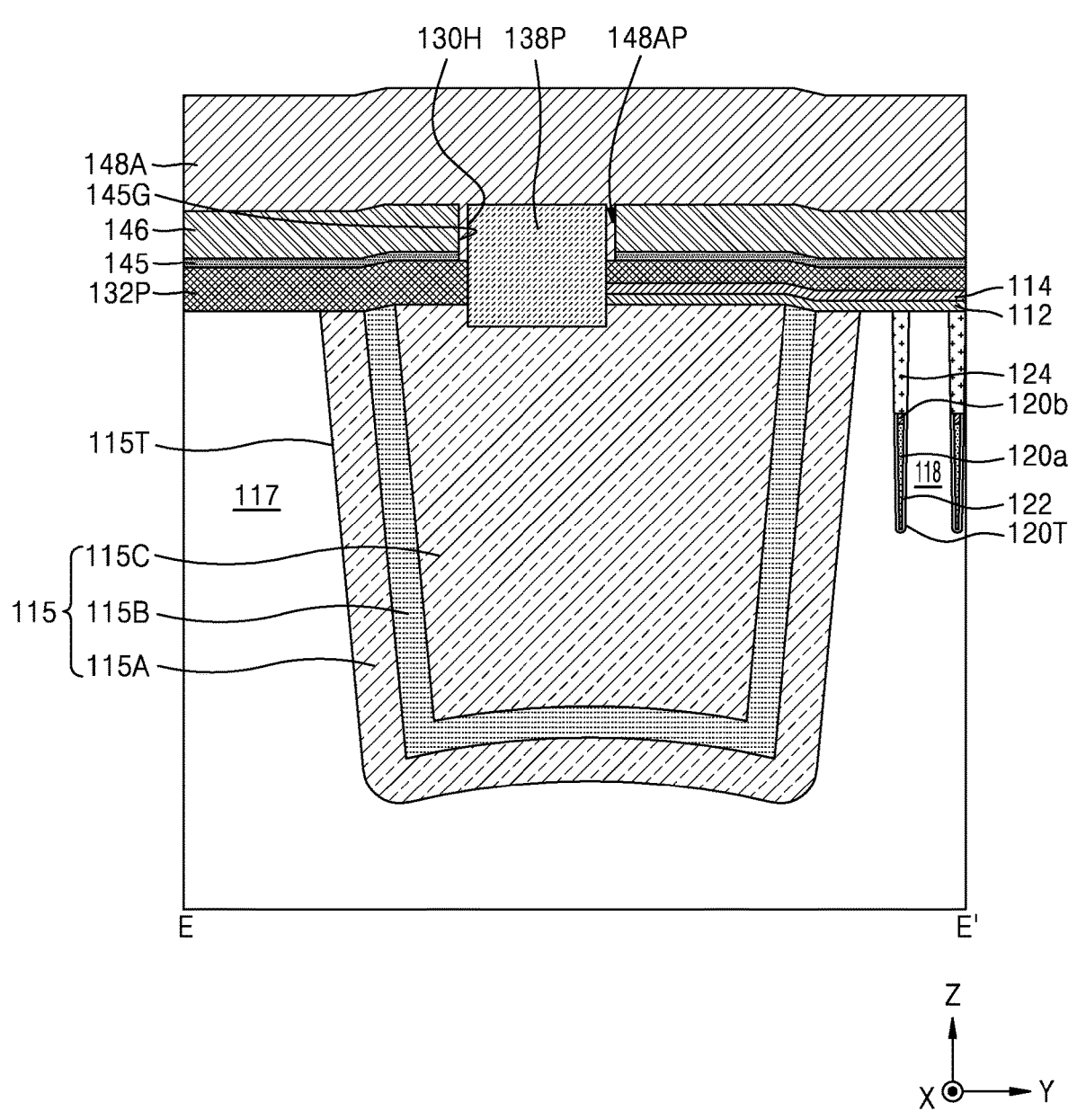
Figure 24:
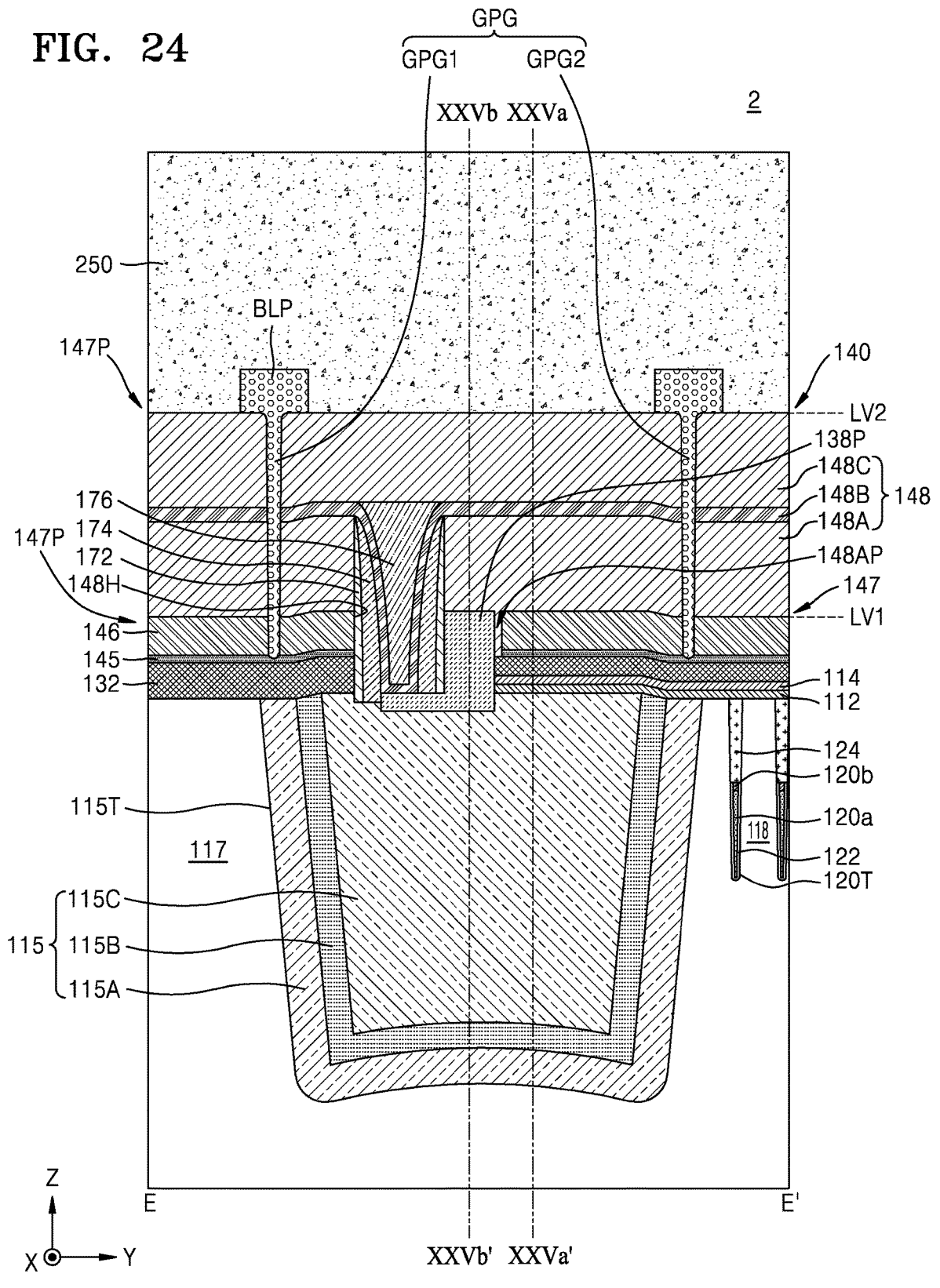
FIGS. 24, 25A, and 25B are cross-sectional views illustrating a semiconductor memory device according to an embodiment.
Figure 25A:
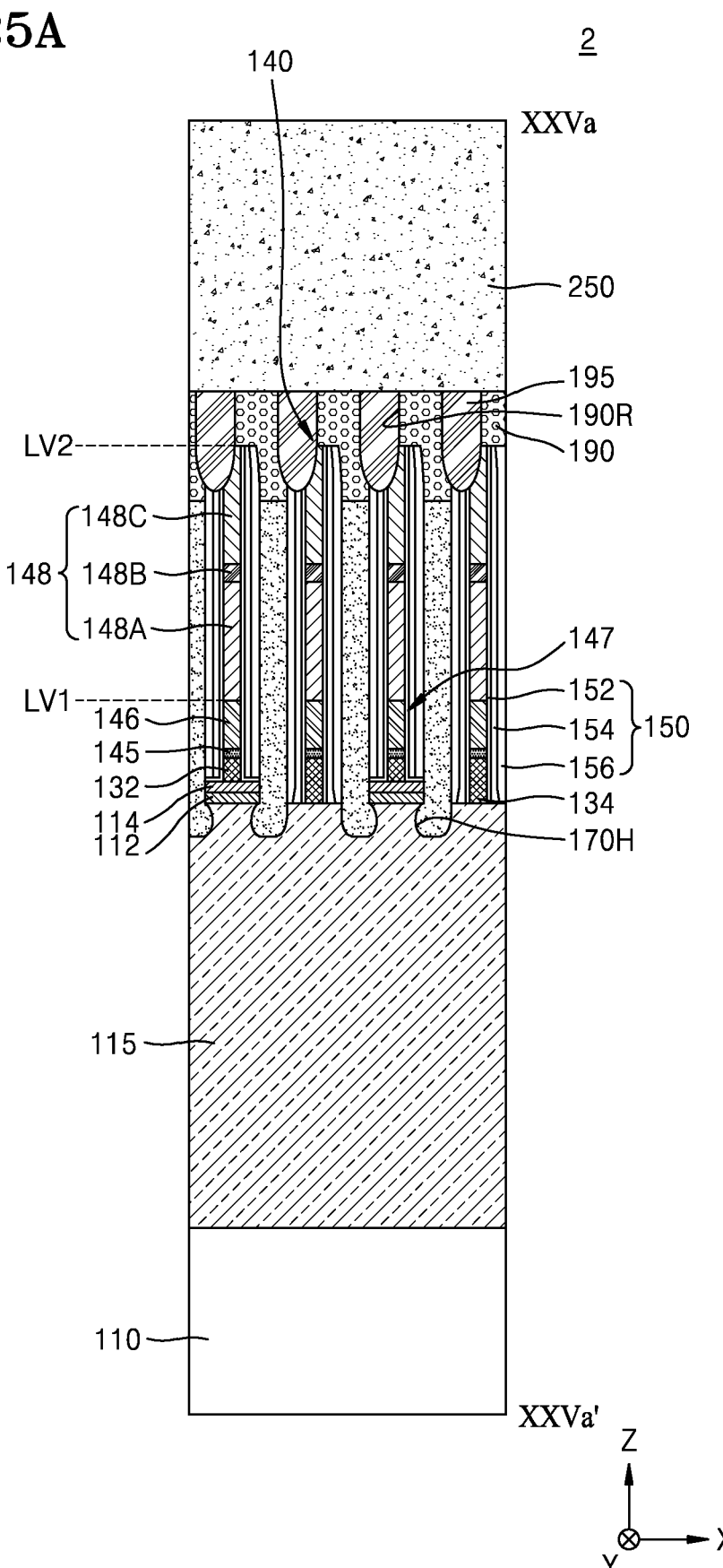
Figure 25B:
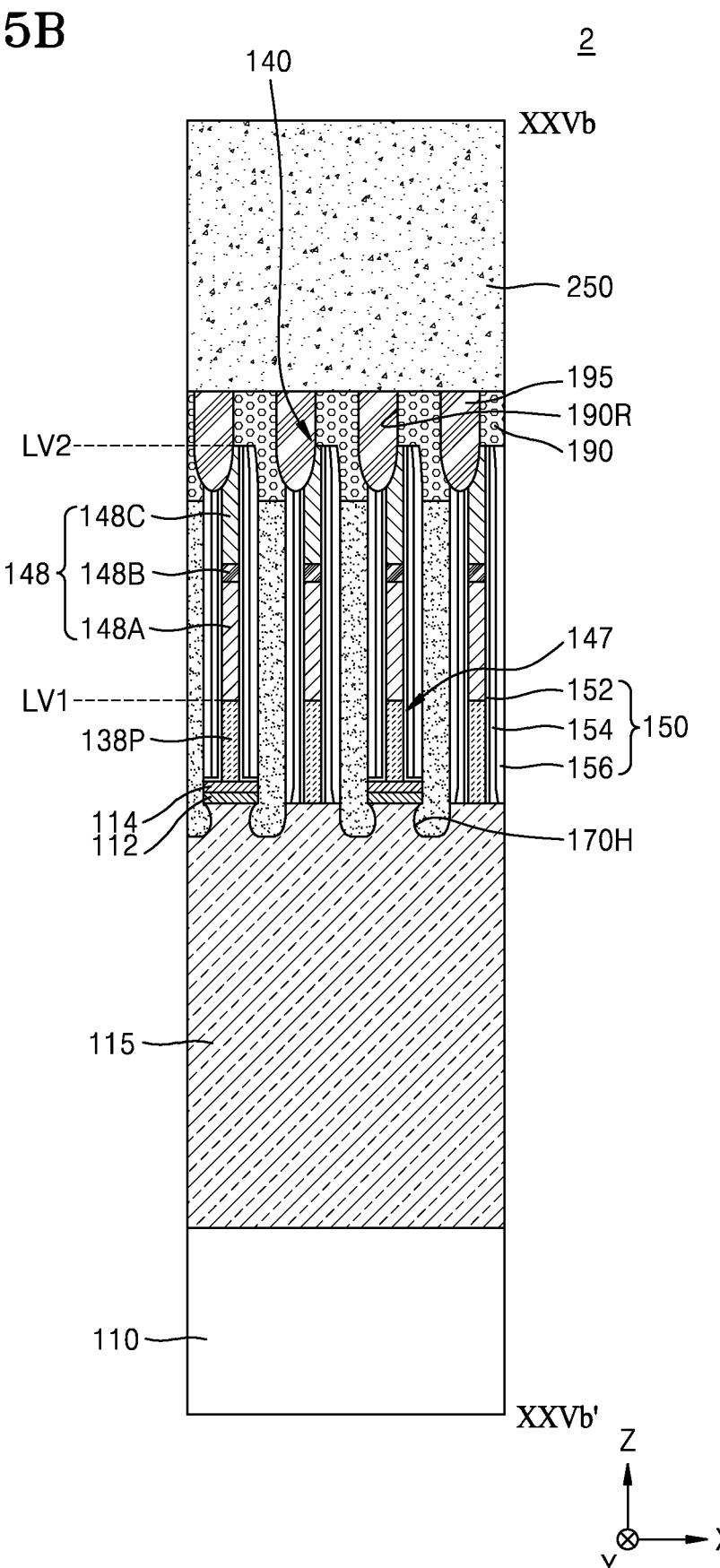

FIGS. 22 and 23 are cross-sectional views illustrating a method of manufacturing a semiconductor memory device, according to an embodiment, and FIGS. 24, 25A, and 25B are cross-sectional views illustrating a semiconductor memory device according to an embodiment. Specifically, FIGS. 22, 23, and 24 are cross-sectional views taken along the line E-E' of FIG. 1, FIG. 25A is a cross-sectional view taken along the line XXVa-XXVa' of FIG. 24, and FIG. 25B is a cross-sectional view taken along the line XXVb-XXVb' of FIG. 24.

Referring to FIG. 22, in the result of FIG. 13, a part of the first metallic conductive layer 145 between the second metallic conductive layer 146 and the cover insulating structure 138P is selectively removed to form a removal space 145G and first separation opening 130H. In some embodiments, the conductive semiconductor layer 132P may be exposed through a bottom surface of the removal space 145G and a bottom surface of the first separation opening 130H.

Referring to FIG. 23, the first insulating capping layer 148A covering the cover insulating structure 138P and the second metallic conductive layer 146, and filling the removal space 145G and the first separation opening 130H is formed. A portion of the first insulating capping layer 148A filling the removal space 145G may be referred to as a filling capping layer 148AP.

The filling capping layer 148AP may cover a side surface of the cover insulating structure 138P. The first metallic conductive layer 145 and the second metallic conductive layer 146 may be spaced apart from the cover insulating structure 138P with the filling capping layer 148AP therebetween. The filling capping layer 148AP may cover a side surface of the first metallic conductive layer 145 and a side surface of the second metallic conductive layer 146 facing a side surface of the cover insulating structure 138P.

Referring to FIGS. 24, 25A, and 25B, in the result of FIG. 23, a semiconductor memory device 2 may be formed by performing a subsequent process with reference to FIGS. 14 to 21B.

In the semiconductor memory device 1 illustrated in FIGS. 20A to 21B, the second metallic conductive layer 146 and the cover insulating structure 138P are spaced apart from each other with the first metallic conductive layer 145 therebetween. Because the semiconductor memory device 2 is substantially the same as the first semiconductor memory device 1 excluding that the second metallic conductive layer 146 and the cover insulating structure 138P are spaced apart from each other with the filling capping layer 148AP as a part of the first insulating capping layer 148A therebetween, description previously given with reference to FIGS. 20A to 21B will not be given.

The semiconductor memory device 2 may include the bit line structure 140 including the first insulating capping layer 148A in the form of a line, a part of the second insulating capping layer 148B and a part of the third insulating capping layer 148C on the first insulating capping layer 148A, the bit line 147 under the first insulating capping layer 148A, and the cover insulating structure 138P. The bit line 147 may have a stacked structure including the first metallic conductive layer 145 and the second metallic conductive layer 146. The bit line 147 may be spaced apart from the cover insulating structure 138P. A part of the first insulating capping layer 148A, that is, the filling capping layer 148AP may be between the bit line 147 and the cover insulating structure 138P. The first metallic conductive layer 145 may be spaced apart from the cover insulating structure 138P and the second metallic conductive layer 146 may be spaced apart from the cover insulating structure 138P with the filling capping layer 148AP therebetween.

Figure 29:
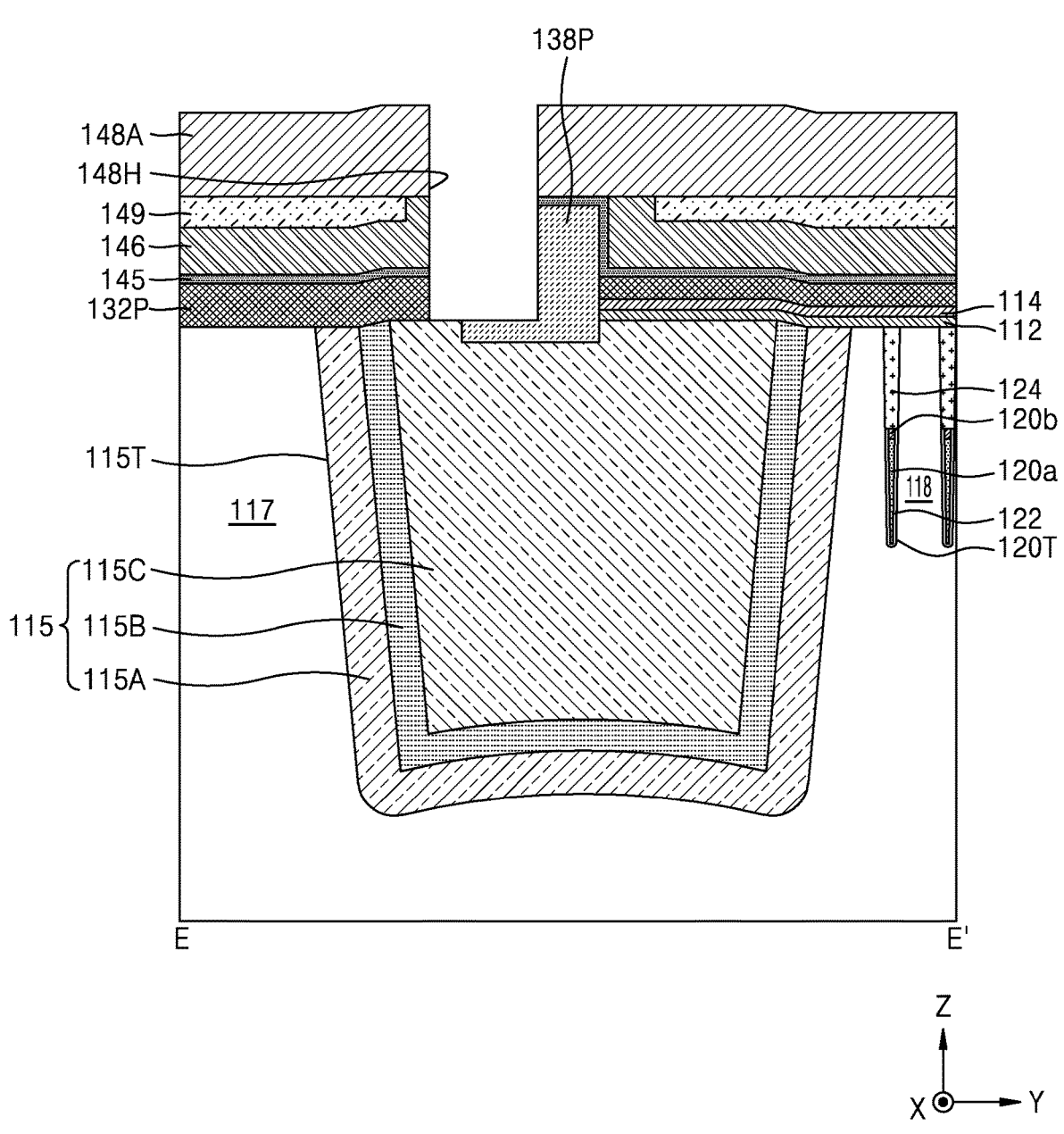
Figure 30:
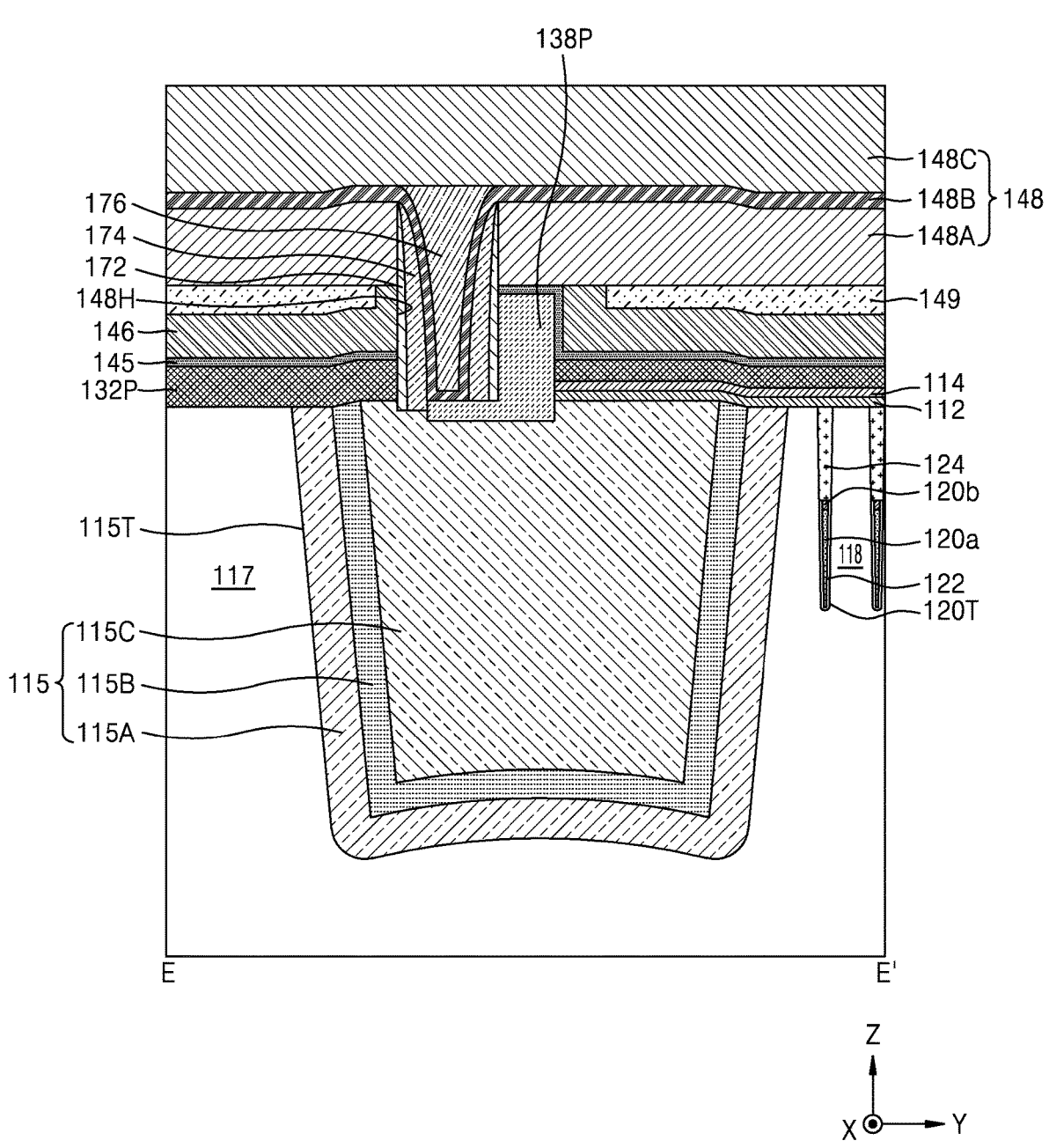
Figure 31A:
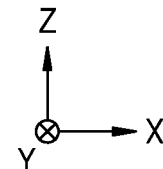
Figure 31B:
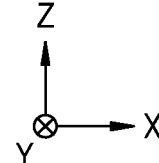
Figure 31C:
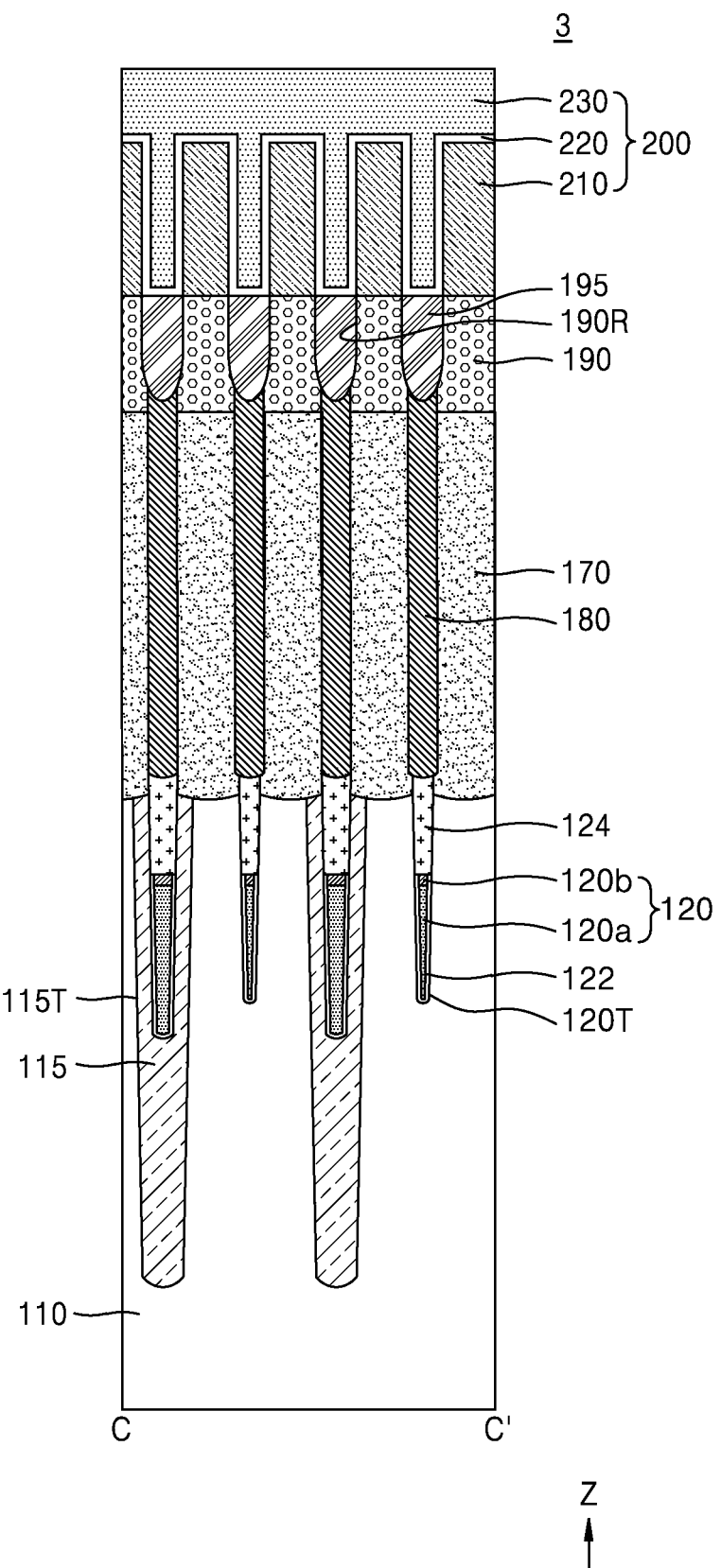
Figure 31D:
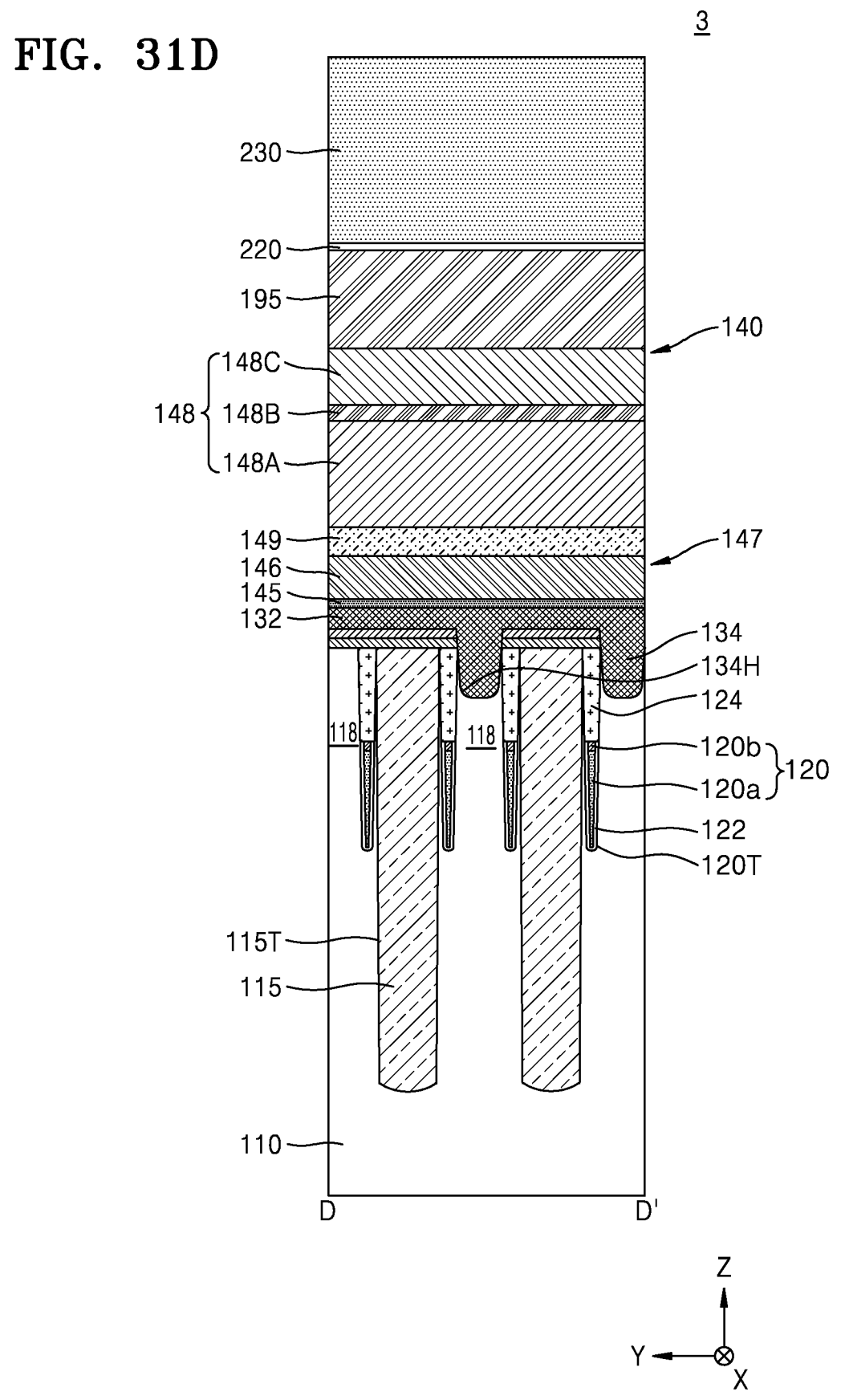
Figure 31E:
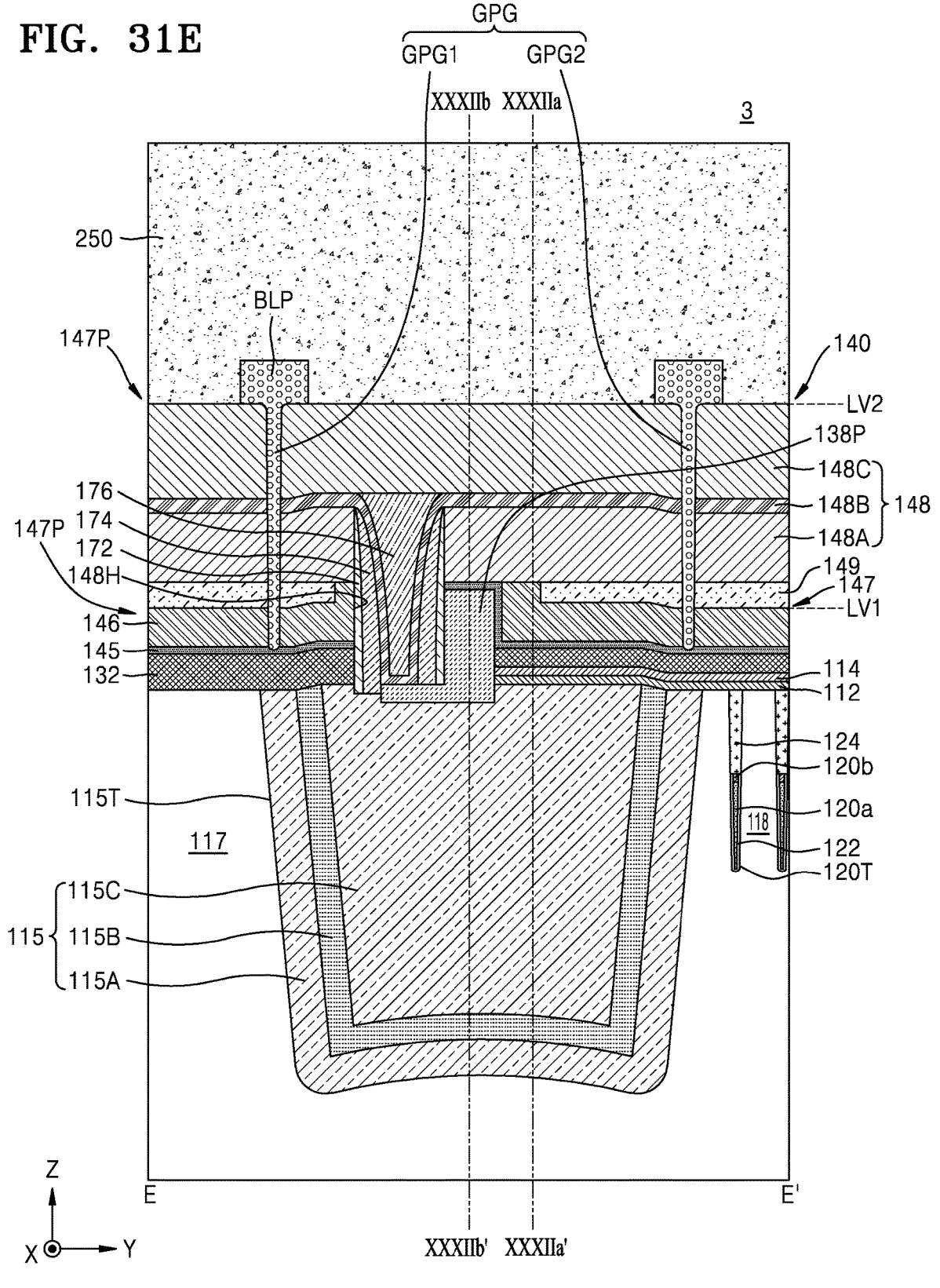
Figure 32A:
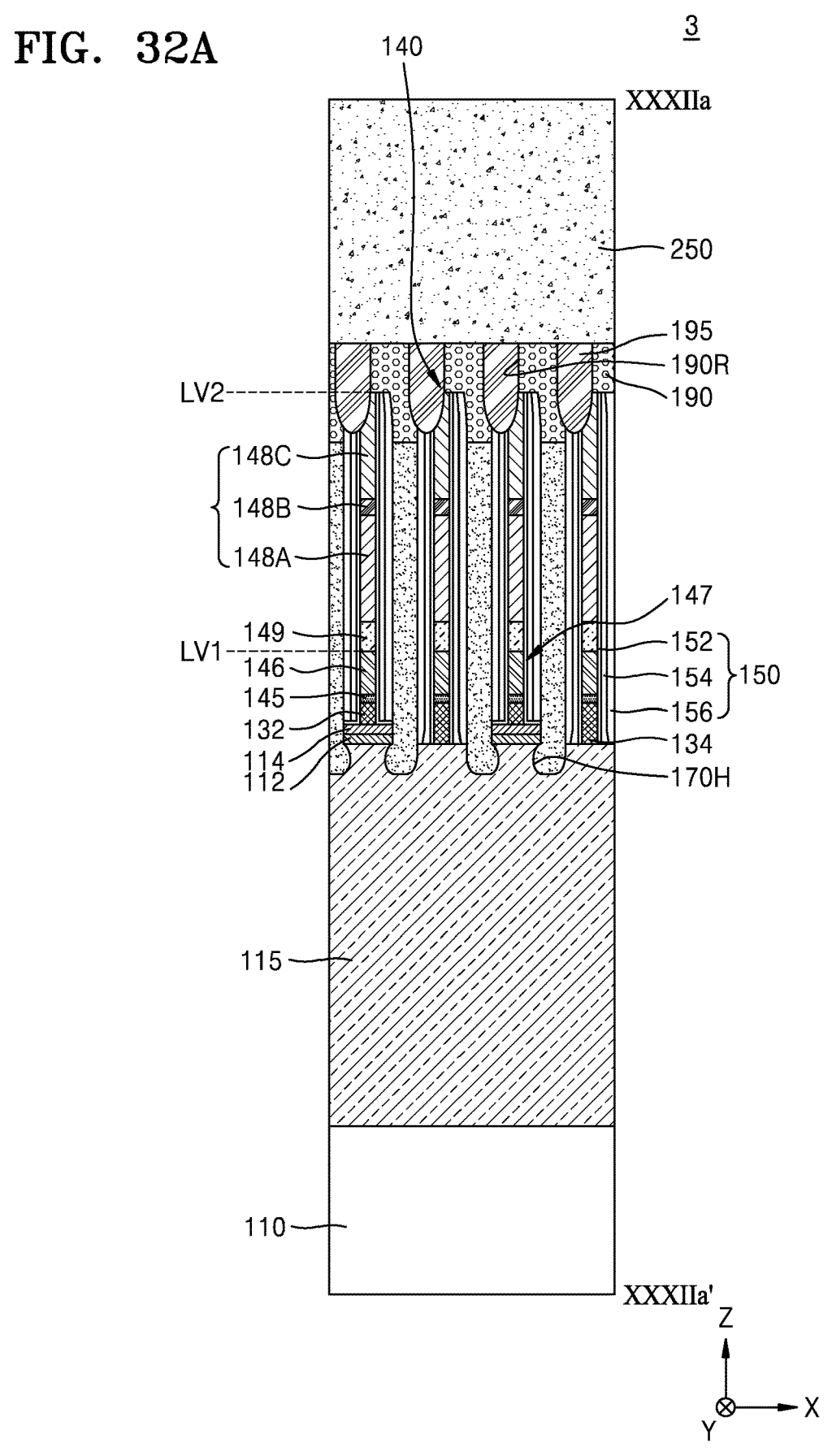
Figure 32B:
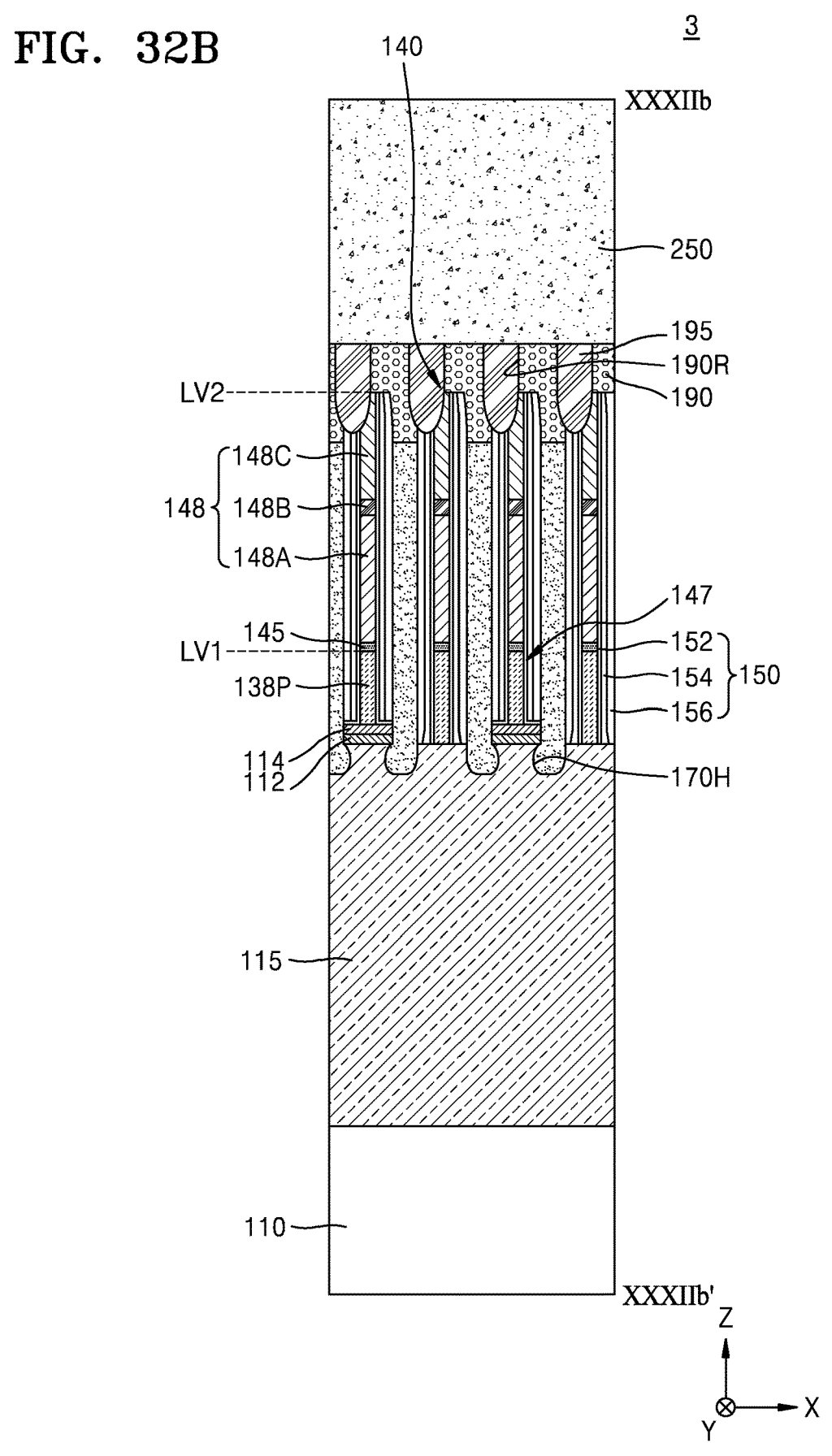

FIGS. 26 to 30 are cross-sectional views illustrating a method of manufacturing a semiconductor memory device, according to an embodiment, and FIGS. 31A to 31E, 32A, and 32B are cross-sectional views illustrating a semiconductor memory device according to an embodiment. Specifically, FIG. 31A is a cross-sectional view taken along the line A-A' of FIG. 1, FIG. 31B is a cross-sectional view taken along the line B-B' of FIG. 1, FIG. 31C is a cross-sectional view taken along the line C-C' of FIG. 1, FIG. 31D is a cross-sectional view taken along the line D-D' of FIG. 1, FIGS. 26 to 30 and 31E are cross-sectional views taken along the line E-E' of FIG. 1, FIG. 32A is a cross-sectional view taken along the line XXXIa-XXXIa' of FIG. 31E, and FIG. 32B is a cross-sectional view taken along the line XXXIB-XXXIB' of FIG. 31E.

Figure 26:
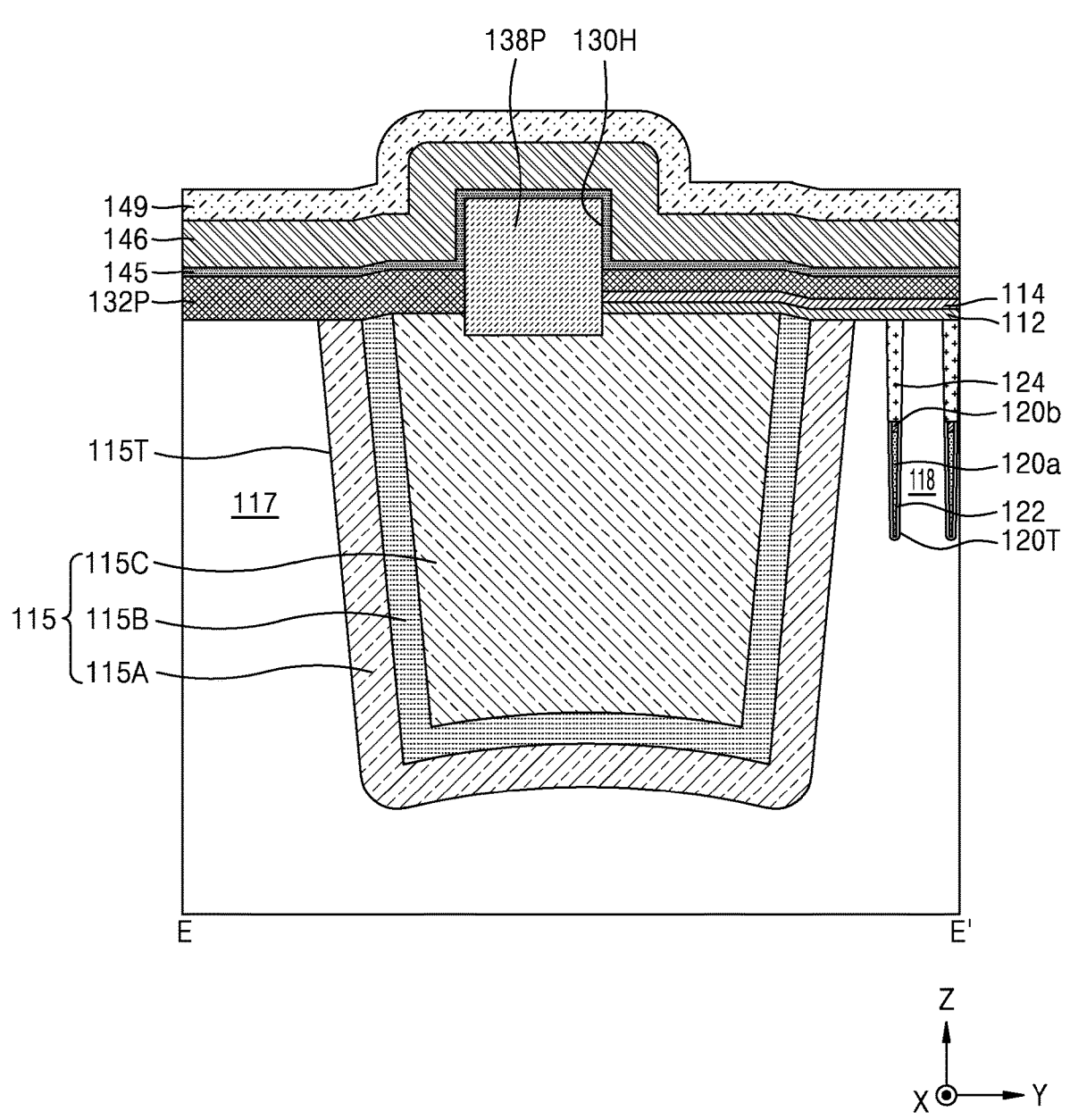
FIGS. 26 to 30 are cross-sectional views illustrating a method of manufacturing a semiconductor memory device, according to an embodiment.

Referring to FIG. 26, a base capping layer 149 is formed on the second metallic conductive layer 146 illustrated in FIG. 12. For example, the base capping layer 149 may include nitride.

Figure 27:
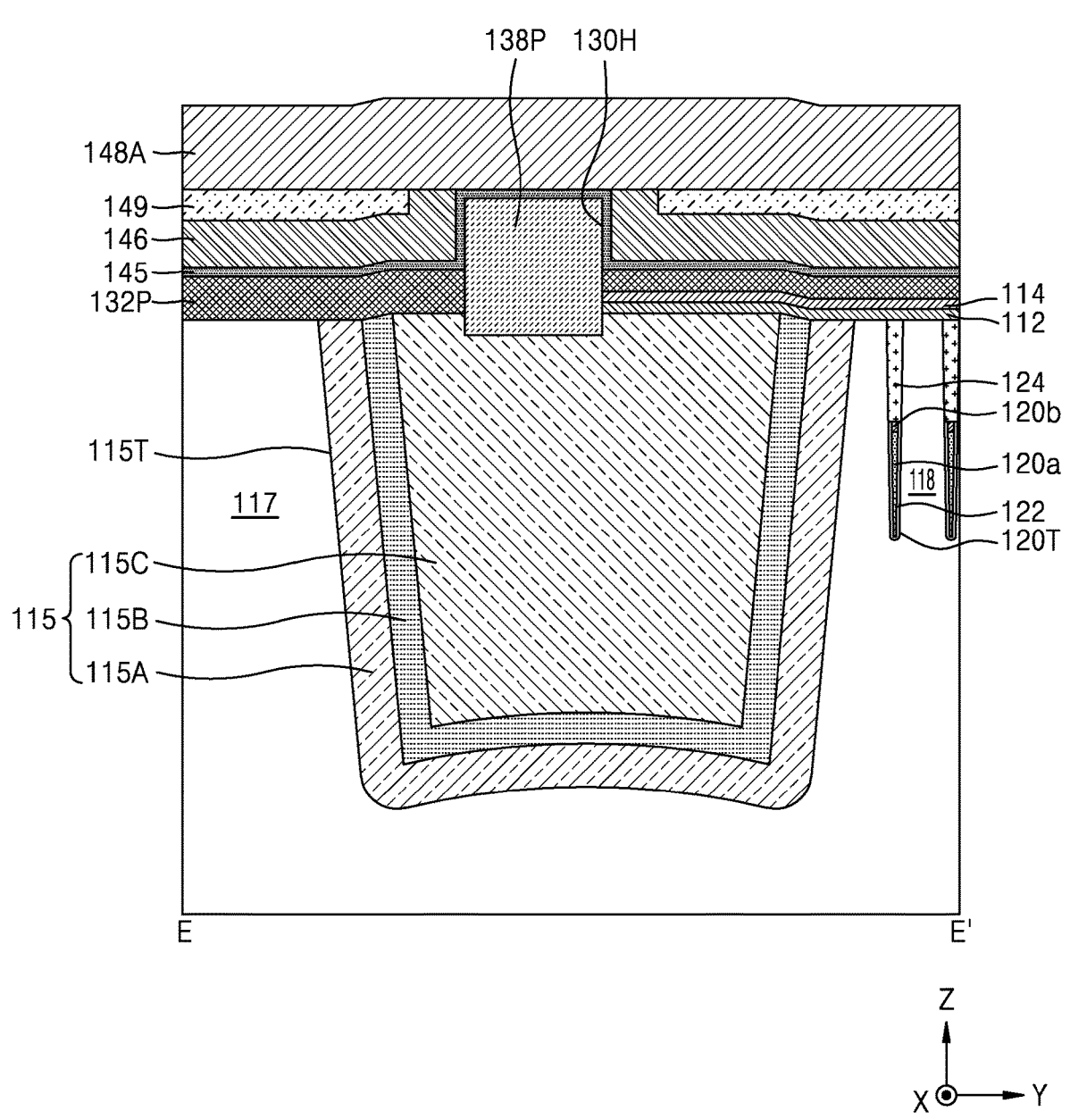

Referring to FIGS. 26 and 27, a part of the base capping layer 149 and a part of the second metallic conductive layer 146 are removed so that the first metallic conductive layer 145 is exposed. For example, a part of the base capping layer 149 and a part of the second metallic conductive layer 146 may be removed by performing a CMP process or an etch-back process.

The uppermost end of the first metallic conductive layer 145, the uppermost end of the second metallic conductive layer 146, and a top surface of the base capping layer 149 may be at the same level.

Then, the first insulating capping layer 148A covering the first metallic conductive layer 145, the second metallic conductive layer 146, and the base capping layer 149 is formed. In some embodiments, the first insulating capping layer 148A may include the same material as the base capping layer 149. For example, the first insulating capping layer 148A may include nitride.

Figure 28:
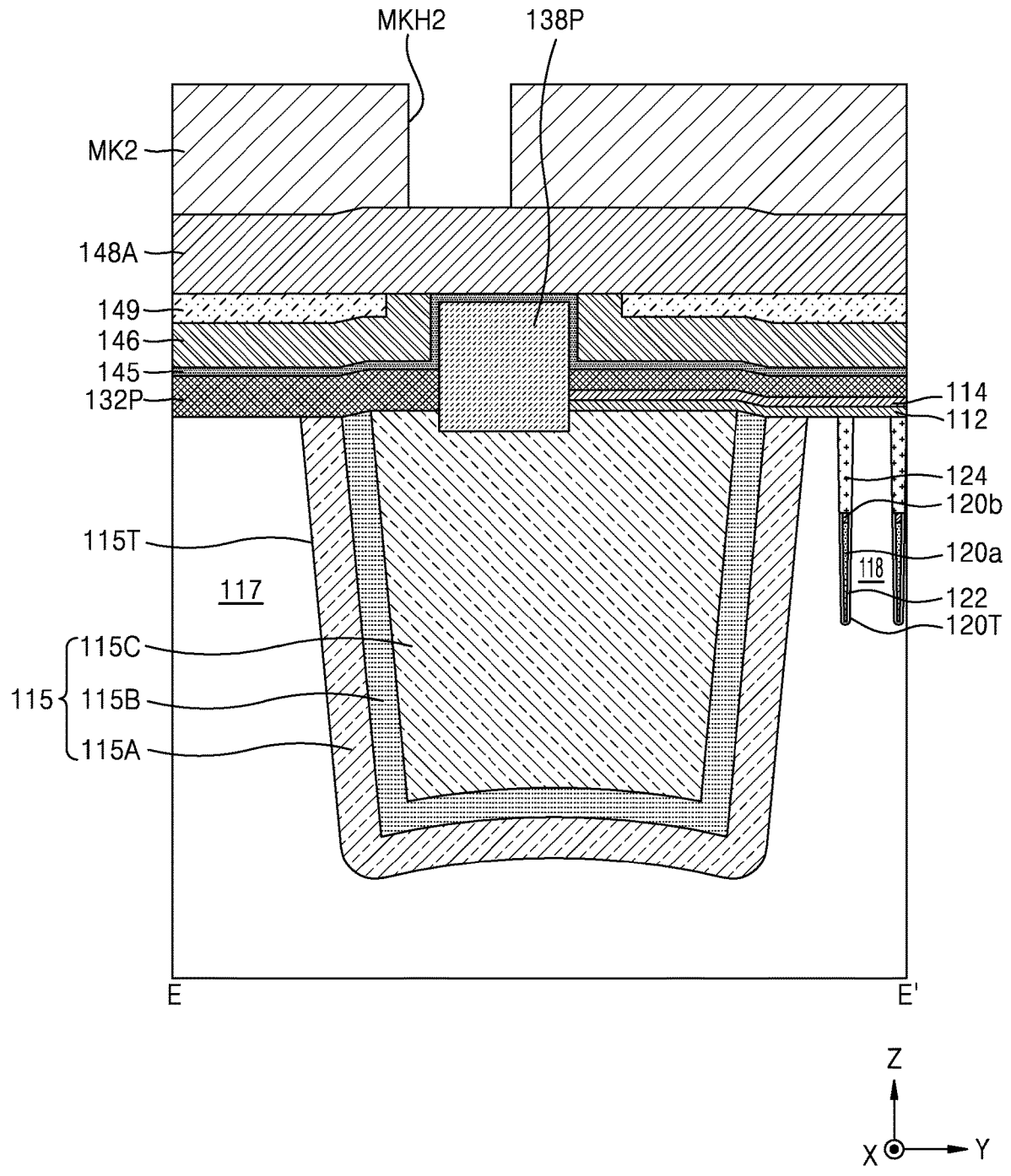

Referring to FIG. 28, a second mask pattern MK2 having a second mask opening MKH2 is formed on the first insulating capping layer 148A.

Referring to FIGS. 28 and 29, parts of the first insulating capping layer 148A, the base capping layer 149, the second metallic conductive layer 146, the first metallic conductive layer 145, the cover insulating structure 138P, and the conductive semiconductor layer 132P are removed by using the second mask pattern MK2 as an etching mask to form the second separation opening 148H through a bottom surface of which a part of the logic device isolation layer 115 and a part of the cover insulating structure 138P are exposed. After the second separation opening 148H is formed, the second mask pattern MK2 may be removed.

Referring to FIG. 30, after a first end spacer 172 and a second end spacer 174 are formed to sequentially cover side surfaces of the second separation opening 148H, a second insulating capping layer 148B is formed to cover the first insulating capping layer 148A and the second end spacer 174. Then, a logic filling layer 176 filling the second separation opening 148H is formed on the second insulating capping layer 148B. A third insulating capping layer 148C may be formed on the logic filling layer 176 and the second insulating capping layer 148B.

Referring to FIGS. 31A to 32B, in the result of FIG. 30, a semiconductor memory device 3 may be formed by performing a subsequent process with reference to FIGS. 18A to 21B.

In the semiconductor memory device 1 illustrated in FIGS. 20A to 21B, the first metallic conductive layer 145 covers only a part of a side surface of the cover insulating structure 138P. Because the semiconductor memory device 2 is substantially the same as the first semiconductor memory device 1 excluding that the first metallic conductive layer 145 covers a part of a side surface of the cover insulating structure 138P and a top surface of the cover insulating structure 138P, description previously given with reference to FIGS. 20A to 21B will not be given.

The first metallic conductive layer 145 may extend from between the cover insulating structure 138P and the second metallic conductive layer 146 to between the first insulating capping layer 148A and the cover insulating structure 138P. In some embodiments, the first metallic conductive layer 145 may cover the entire top surface of the cover insulating structure 138P. The base capping layer 149 may be between the second metallic conductive layer 146 and the first insulating capping layer 148A.

The uppermost end of the first metallic conductive layer 145 and the uppermost end of the second metallic conductive layer 146 may be at the same level. The uppermost end of the cover insulating structure 138P may be at a level lower than the upper most end of the first metallic conductive layer 145 and the uppermost end of the second metallic conductive layer 146.

Because the first insulating capping layer 148A includes the same material as the base capping layer 149, the base capping layer 149 and the first insulating capping layer 148A included in the semiconductor memory devices 3 illustrated in FIGS. 31A to 32B may perform substantially the same function as the first insulating capping layer 148A included in the semiconductor memory devices 1 illustrated in FIGS. 20A to 21B. That is, a lower part of the first insulating capping layer 148A included in the semiconductor memory device 1 illustrated in FIGS. 20A to 21B may correspond to the base capping layer 149 included in the semiconductor memory device 3 illustrated in FIGS. 31A to 32B and the remaining upper part of the first insulating capping layer 148A included in the semiconductor memory device 1 illustrated in FIGS. 20A to 21B may correspond to the first insulating capping layer 148A included in the semiconductor memory device 3 illustrated in FIGS. 31A to 32B.

Referring to FIGS. 31A, 31B, 32A, and 32B, under the plurality of first insulating capping layers 148A in the form of lines extending in the second horizontal direction (the Y direction), a plurality of stacked structures of the plurality of conductive semiconductor patterns 132, the first metallic conductive layer 145, and the second metallic conductive layer 146 and the base capping layer 149 may be interposed on the plurality of active regions 118 and the device isolation layer 116, and on the logic device isolation layer 115 spaced apart from ends of the plurality of first insulating capping layers 148A, and the plurality of cover insulating structures 138P and the first metallic conductive layer 145 may be interposed on the logic device isolation layer 115 adjacent to ends of the plurality of first insulating capping layers 148A.

While aspects of embodiments have been particularly shown and described, it will be understood that various changes in form and details may be made therein without departing from the spirit and scope of the following claims.

What is claimed is:

1. A semiconductor memory device comprising:
a substrate comprising a plurality of active regions in a memory cell region and at least one logic active region in a peripheral circuit region;
a word line extending in a first horizontal direction on the plurality of active regions;
a bit line structure extending in a second horizontal direction orthogonal to the first horizontal direction, on the plurality of active regions, and comprising a bit line, a cover insulating structure on a side surface of an end of the bit line, and an insulating capping structure on the bit line and the cover insulating structure; and
a gate line on the at least one logic active region,
wherein an uppermost end of the cover insulating structure and an uppermost end of the bit line are coplanar.

2. The semiconductor memory device of claim 1, wherein the bit line has a stacked structure comprising a first metallic conductive layer and a second metallic conductive layer, and
wherein the second metallic conductive layer is spaced apart from the cover insulating structure.

3. The semiconductor memory device of claim 2, wherein the first metallic conductive layer extends between the substrate and the second metallic conductive layer, and between the second metallic conductive layer and the cover insulating structure.

4. The semiconductor memory device of claim 2, wherein the first metallic conductive layer covers a top surface of the cover insulating structure.

5. The semiconductor memory device of claim 2, wherein the gate line has a stacked structure comprising a third metallic conductive layer and a fourth metallic conductive layer, and
wherein the insulating capping structure extends between the fourth metallic conductive layer and the cover insulating structure.

6. The semiconductor memory device of claim 2, further comprising:
a device isolation layer defining the plurality of active regions; and
a logic device isolation layer defining the at least one logic active region,
wherein the bit line structure extends along the plurality of active regions and the device isolation layer onto the logic device isolation layer.

7. The semiconductor memory device of claim 6, wherein the cover insulating structure is on the device isolation layer, and
wherein a bottom surface of the cover insulating structure is between a bottom surface of the substrate and an uppermost end of the logic device isolation layer.

8. The semiconductor memory device of claim 2, wherein the uppermost end of the cover insulating structure and an uppermost end of the second metallic conductive layer are at a common level.

9. The semiconductor memory device of claim 2, wherein an uppermost end of the first metallic conductive layer and an uppermost end of the second metallic conductive layer are at a common level.

10. The semiconductor memory device of claim 1, wherein the cover insulating structure and a part of the insulating capping structure comprise a common material.

11. A semiconductor memory device comprising:

a substrate comprising a plurality of active regions in a memory cell region and at least one logic active region in a peripheral circuit region;

a word line extending in a first horizontal direction on the plurality of active regions;

a bit line structure extending in a second horizontal direction orthogonal to the first horizontal direction, on the plurality of active regions, and comprising a bit line having a stacked structure comprising a first metallic conductive layer and a second metallic conductive layer, a cover insulating structure on a side surface of an end of the bit line and spaced apart from the second metallic conductive layer, and an insulating capping structure on the bit line and the cover insulating structure; and a gate line on the at least one logic active region, wherein the first metallic conductive layer extends between the substrate and the second metallic conductive layer, and between the second metallic conductive layer and the cover insulating structure.

12. The semiconductor memory device of claim 11, wherein the first metallic conductive layer extends along a bottom surface of the second metallic conductive layer between the substrate and the second metallic conductive layer, and between the second metallic conductive layer and the cover insulating structure.

13. The semiconductor memory device of claim 11, wherein the first metallic conductive layer extends from between the second metallic conductive layer and the cover insulating structure to a top surface of the cover insulating structure.

14. The semiconductor memory device of claim 11, wherein the insulating capping structure extends between the second metallic conductive layer and the cover insulating structure.

15. The semiconductor memory device of claim 11, wherein an end of the first metallic conductive layer protrudes toward the cover insulating structure from a side surface of an end of the second metallic conductive layer.

16. The semiconductor memory device of claim 11, wherein the first metallic conductive layer and the cover insulating structure are spaced apart from each other, and wherein a side surface of an end part of the first metallic conductive layer and a side surface of an end part of the second metallic conductive layer are aligned with each other in a vertical direction.

17. The semiconductor memory device of claim 11, further comprising an end spacer on a side surface of an end of the bit line structure, wherein the insulating capping structure has a stacked structure comprising a first insulating capping layer on the bit line, a second insulating capping layer on the first insulating capping layer and the end spacer, and a third insulating capping layer on the second insulating capping layer.

18. A semiconductor memory device comprising:

a substrate;

a device isolation layer defining a plurality of active regions on a memory cell region of the substrate;

a logic device isolation layer defining at least one logic active region on a peripheral circuit region of the substrate;

a plurality of word lines in a plurality of word line trenches extending parallel to one another in a first horizontal direction across the plurality of active regions, each of the plurality of word lines having a stacked structure comprising a lower word line layer and an upper word line layer;

a plurality of buried insulating layers in the plurality of word line trenches on the plurality of word lines;

a plurality of bit line structures on the plurality of active regions, extending parallel to one another in a second horizontal direction orthogonal to the first horizontal direction, each of the plurality of bit line structures comprising a bit line having a stacked structure comprising a first bit line conductive layer and a second bit line conductive layer, a cover insulating structure on a side surface of an end of the bit line and spaced apart from the second bit line conductive layer with the first bit line conductive layer therebetween, and an insulating capping structure on the bit line and the cover insulating structure and having a stacked structure comprising a first insulating capping layer, a second insulating capping layer, and a third insulating capping layer;

a gate line on the at least one logic active region and comprising a stacked structure comprising a first gate line conductive layer and a second gate line conductive layer, the first gate line conductive layer and the first bit line conductive layer comprising a first common material, and the second bit line conductive layer and the second gate line conductive layer comprising a second common material;

a plurality of buried contacts in spaces among the plurality of bit line structures and connected to the plurality of active regions;

a plurality of landing pads in the spaces among the plurality of bit line structures and extending onto the plurality of bit line structures; and a plurality of capacitor structures comprising a plurality of lower electrodes in contact with the plurality of landing pads, an upper electrode, and a capacitor dielectric layer between the plurality of lower electrodes and the upper electrode, wherein the first bit line conductive layer extends between the substrate and the second bit line conductive layer, and between the second bit line conductive layer and the cover insulating structure.

19. The semiconductor memory device of claim 18, wherein an uppermost end of the cover insulating structure, an uppermost end of the first bit line conductive layer, and an uppermost end of the second bit line conductive layer are at a common level, and wherein the cover insulating structure has a bottom surface at a level lower than the uppermost end of the logic device isolation layer on the device isolation layer.

20. The semiconductor memory device of claim 18, wherein each of the first insulating capping layer and the cover insulating structure comprises nitride.

* * * * *